(12) United States Patent
Umezaki

(10) Patent No.: US 10,071,904 B2
(45) Date of Patent: Sep. 11, 2018

(54) SEMICONDUCTOR DEVICE, DISPLAY MODULE, AND ELECTRONIC DEVICE

(71) Applicant: SEMICONDUCTOR ENERGY LABORATORY CO., LTD., Atsugi-shi, Kanagawa-ken (JP)

(72) Inventor: Atsushi Umezaki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 64 days.

(21) Appl. No.: 14/859,681

(22) Filed: Sep. 21, 2015

(65) Prior Publication Data

US 2016/0090291 A1    Mar. 31, 2016

(30) Foreign Application Priority Data

Sep. 25, 2014    (JP) ................. 2014-194575

(51) Int. Cl.
*B81B 7/00* (2006.01)
*B81B 3/00* (2006.01)
(Continued)

(52) U.S. Cl.
CPC .......... *B81B 3/0083* (2013.01); *B81B 7/008* (2013.01); *G09G 3/3466* (2013.01);
(Continued)

(58) Field of Classification Search
CPC ... H01L 27/1214; B81B 3/0083; B81B 7/008; G09G 3/3688; G09G 3/3648;
(Continued)

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Coates.D et al., "Optical Studies of the Amorphous Liquid-Cholesteric Liquid Crystal Transition:the "Blue Phase"", Physics Letters, Sep. 10, 1973, vol. 45A, No. 2, pp. 115-116.

(Continued)

*Primary Examiner* — Daniel Luke
*Assistant Examiner* — Khatib Rahman
(74) *Attorney, Agent, or Firm* — Nixon Peabody LLP; Jeffrey L. Costellia

(57) ABSTRACT

An object is to continuously apply voltage to a MEMS device using first to fifth or sixth transistors. One of a source and a drain of the first transistor is electrically connected to one of a source and a drain of the second transistor. One of a source and a drain of the third transistor is electrically connected to one of a source and a drain of the fourth transistor. A gate of the first transistor is electrically connected to one of a source and a drain of the fifth transistor. A gate of the second transistor is electrically connected to the one of the source and the drain of the third transistor. A gate of the fourth transistor is electrically connected to the gate of the first transistor. The MEMS device is electrically connected to the one of the source and the drain of the first transistor.

20 Claims, 33 Drawing Sheets

(51) Int. Cl.
*G09G 3/34* (2006.01)
*H03K 19/003* (2006.01)
*H03K 19/00* (2006.01)
*H03K 19/0185* (2006.01)
*H01L 27/12* (2006.01)

(52) U.S. Cl.
CPC . *G09G 2300/08* (2013.01); *G09G 2310/0262* (2013.01); *H01L 27/1225* (2013.01); *H03K 19/0013* (2013.01); *H03K 19/00315* (2013.01); *H03K 19/00384* (2013.01); *H03K 19/018521* (2013.01)

(58) Field of Classification Search
CPC ............. G09G 5/006; G09G 2310/027; H03K 19/00315; H03K 19/018521; H03K 19/0013; H03K 19/00384; H03K 19/018585
USPC ............................................. 345/204; 326/83
See application file for complete search history.

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,730,186 | B2 | 5/2014 | Tamura et al. |
| 8,766,608 | B2 * | 7/2014 | Yamazaki ........... H01L 27/1225 257/72 |
| 8,891,051 | B2 | 11/2014 | Yamazaki et al. |
| 8,902,205 | B2 | 12/2014 | Miyazawa et al. |
| 8,975,695 | B2 | 3/2015 | Yamazaki |
| 8,994,704 | B2 | 3/2015 | Miyazawa et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0220117 | A1 * | 9/2010 | Kimura ................ G09G 3/3233 345/690 |
| 2012/0306562 | A1 | 12/2012 | Miyamoto et al. |
| 2014/0043223 | A1 * | 2/2014 | English ................ G09G 3/3433 345/156 |
| 2014/0085017 | A1 * | 3/2014 | Tsinker .................... H03B 5/30 331/135 |
| 2014/0145625 | A1 * | 5/2014 | Yamazaki ............. G09G 3/3677 315/172 |
| 2014/0231770 | A1 * | 8/2014 | Inoue .................. H01L 51/0085 257/40 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |

(56) References Cited

FOREIGN PATENT DOCUMENTS

| | | |
|---|---|---|
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-239046 | 12/2012 |
| JP | 2014-142405 | 8/2014 |
| JP | 2014-522509 | 9/2014 |
| JP | 2014-523659 | 9/2014 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "SPINEL, YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 As a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZNO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 4, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium DIgest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—GA—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic NANO-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

(56) References Cited

OTHER PUBLICATIONS

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide inGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", JPN. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density funcational study", Phys. Rev. B (Physical Review B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—0 TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.
Fortunato.E et al., "Wide-Bandgap High-Mobility ZNO Thin-Film Transistors Produced at Room Temperature", Appl. Phys. Lett. (Applied Physics Letters) , Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

\* cited by examiner

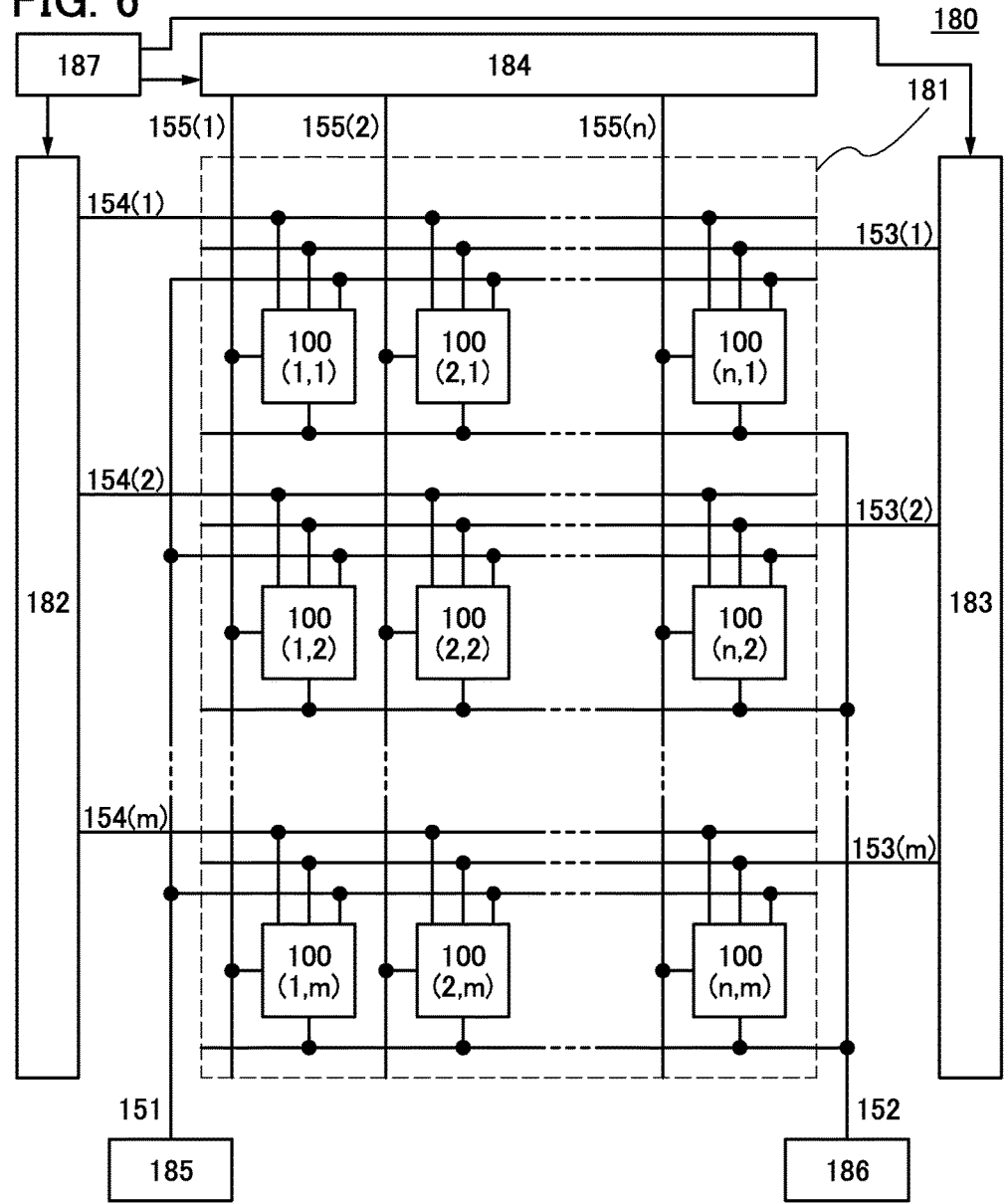

SEMICONDUCTOR DEVICE, DISPLAY MODULE, AND ELECTRONIC DEVICE

BACKGROUND OF THE INVENTION

1. Field of the Invention

One embodiment of the present invention relates to a semiconductor device, a display module, and an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Another embodiment of the present invention relates to a semiconductor device, a display device, a lighting device, a power storage device, a memory device, or a driving method or manufacturing method thereof.

2. Description of the Related Art

Display devices including display elements using microelectromechanical systems (MEMS) have been developed. Patent Documents 1 to 4 each disclose a pixel circuit including a display element using MEMS.

REFERENCE

Patent Document 1: Japanese Published Patent Application No. 2012-239046

Patent Document 2: Japanese Published Patent Application No. 2014-142405

Patent Document 3: Japanese Translation of PCT International Application No. 2014-522509

Patent Document 4: Japanese Translation of PCT International Application No. 2014-523659

SUMMARY OF THE INVENTION

Patent Documents 1 to 3 have a problem in that it is difficult to continuously supply voltage to the display element using the MEMS. Patent Document 4 has a problem of requiring a CMOS circuit.

An object of one embodiment of the present invention is to provide a pixel, a semiconductor device, or a display device having a novel structure. An object of one embodiment of the present invention is to continuously apply voltage to a display element or to provide a structure for achieving it. An object of one embodiment of the present invention is to precisely control the gray level of a display element or to provide a structure for achieving it. An object of one embodiment of the present invention is to prevent current from being generated all the time or to provide a structure for achieving it. An object of one embodiment of the present invention is to reduce power consumption or to provide a structure for achieving it. An object of one embodiment of the present invention is to use only transistors of the same polarity or to provide a structure for achieving it. An object of one embodiment of the present invention is to reduce the number of fabrication steps or to provide a structure for achieving it. An object of one embodiment of the present invention is to shorten the time during which a shoot-through current occurs or to provide a structure for achieving it. An object of one embodiment of the present invention is to reduce a shoot-through current or to provide a structure for achieving it. An object of one embodiment of the present invention is to reduce the layout area or to provide a structure for achieving it.

One embodiment of the present invention does not necessarily achieve all the objects listed above and only needs to achieve at least one of the objects. The description of the above objects does not preclude the existence of other objects. Other objects are apparent from and can be derived from the description of the specification, the drawings, the claims, and the like.

One embodiment of the present invention is a semiconductor device including first to sixth transistors and a MEMS device. One of a source and a drain of the first transistor is electrically connected to one of a source and a drain of the second transistor. One of a source and a drain of the third transistor is electrically connected to one of a source and a drain of the fourth transistor. One of a source and a drain of the fifth transistor is electrically connected to one of a source and a drain of the sixth transistor. A gate of the first transistor is electrically connected to the one of the source and the drain of the fifth transistor. A gate of the second transistor is electrically connected to the one of the source and the drain of the third transistor. A gate of the fourth transistor is electrically connected to the gate of the first transistor. The MEMS device is electrically connected to the one of the source and the drain of the first transistor.

One embodiment of the present invention is a semiconductor device including first to fifth transistors and a MEMS device. One of a source and a drain of the first transistor is electrically connected to one of a source and a drain of the second transistor. One of a source and a drain of the third transistor is electrically connected to one of a source and a drain of the fourth transistor. A gate of the first transistor is electrically connected to one of a source and a drain of the fifth transistor. A gate of the second transistor is electrically connected to the one of the source and the drain of the third transistor. A gate of the fourth transistor is electrically connected to the gate of the first transistor. The MEMS device is electrically connected to the one of the source and the drain of the first transistor.

In any of the above embodiments of the present invention, each of the first to sixth transistors may include a channel formation region in an oxide semiconductor layer.

In any of the above embodiments of the present invention, the W/L ratio of the first transistor is higher than that of the second transistor.

In any of the above embodiments of the present invention, the W/L ratio of the fourth transistor is higher than that of the third transistor.

One embodiment of the present invention is a semiconductor device including first and second transistors, first to fourth switches, and a MEMS device. One of a source and a drain of the first transistor is electrically connected to one of a source and a drain of the second transistor. A first terminal of the first switch is electrically connected to a first terminal of the second switch. A first terminal of the third switch is electrically connected to a first terminal of the fourth switch. A gate of the first transistor is electrically connected to the first terminal of the third switch. A gate of the second transistor is electrically connected to the first terminal of the first switch. The MEMS device is electrically connected to the one of the source and the drain of the first transistor.

One embodiment of the present invention is a semiconductor device including first and second transistors, first to third switches, and a MEMS device. One of a source and a drain of the first transistor is electrically connected to one of a source and a drain of the second transistor. A first terminal of the first switch is electrically connected to a first terminal of the second switch. A gate of the first transistor is electrically connected to a first terminal of the third switch. A gate of the second transistor is electrically connected to the first terminal of the first switch. The MEMS device is electrically connected to the one of the source and the drain of the first transistor.

One embodiment of the present invention is a semiconductor device including first to fourth transistors and a MEMS device. The MEMS device includes a first component, a second component, and a third component. The second component has a region placed between the first component and the third component. One of a source and a drain of the first transistor is electrically connected to one of a source and a drain of the second transistor. One of a source and a drain of the third transistor is electrically connected to one of a source and a drain of the fourth transistor. The other of the source and the drain of the first transistor is electrically connected to the other of the source and the drain of the third transistor. The other of the source and the drain of the second transistor is electrically connected to the other of the source and the drain of the fourth transistor. A gate of the first transistor is electrically connected to a gate of the fourth transistor. A gate of the second transistor is electrically connected to a gate of the third transistor. The first component is electrically connected to the one of the source and the drain of the first transistor. The third component is electrically connected to the one of the source and the drain of the third transistor.

One embodiment of the present invention is a display device including a first transistor, a second transistor having a source and a drain one of which is electrically connected to one of a source and a drain of the first transistor, a MEMS device electrically connected to the one of the source and the drain of the first transistor, a first means to supply a first potential to a gate of the first transistor (a third transistor or a first circuit having a function of supplying the first potential to the gate of the first transistor), a second means to supply a second potential to a gate of the second transistor (a fourth transistor or a second circuit having a function of supplying the second potential to the gate of the second transistor), and a third means to supply an image signal to the gate of the first transistor (a fifth transistor or a third circuit having a function of supplying the image signal to the gate of the first transistor).

One embodiment of the present invention can provide a pixel, a semiconductor device, or a display device having a novel structure. One embodiment of the present invention can continuously apply voltage to a display element or provide a structure for achieving it. One embodiment of the present invention can precisely control the gray level of a display element or provide a structure for achieving it. One embodiment of the present invention can prevent current from being generated all the time or provide a structure for achieving it. One embodiment of the present invention can reduce power consumption or provide a structure for achieving it. One embodiment of the present invention can use only transistors of the same polarity or provide a structure for achieving it. One embodiment of the present invention can reduce the number of fabrication steps or provide a structure for achieving it. One embodiment of the present invention can shorten the time during which a shoot-through current occurs or provide a structure for achieving it. One embodiment of the present invention can reduce a shoot-through current or provide a structure for achieving it. One embodiment of the present invention can reduce the layout area or provide a structure for achieving it.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

In the accompanying drawings:
FIG. 6 illustrates an example of a display device.

DETAILED DESCRIPTION OF THE INVENTION

Figure 1:
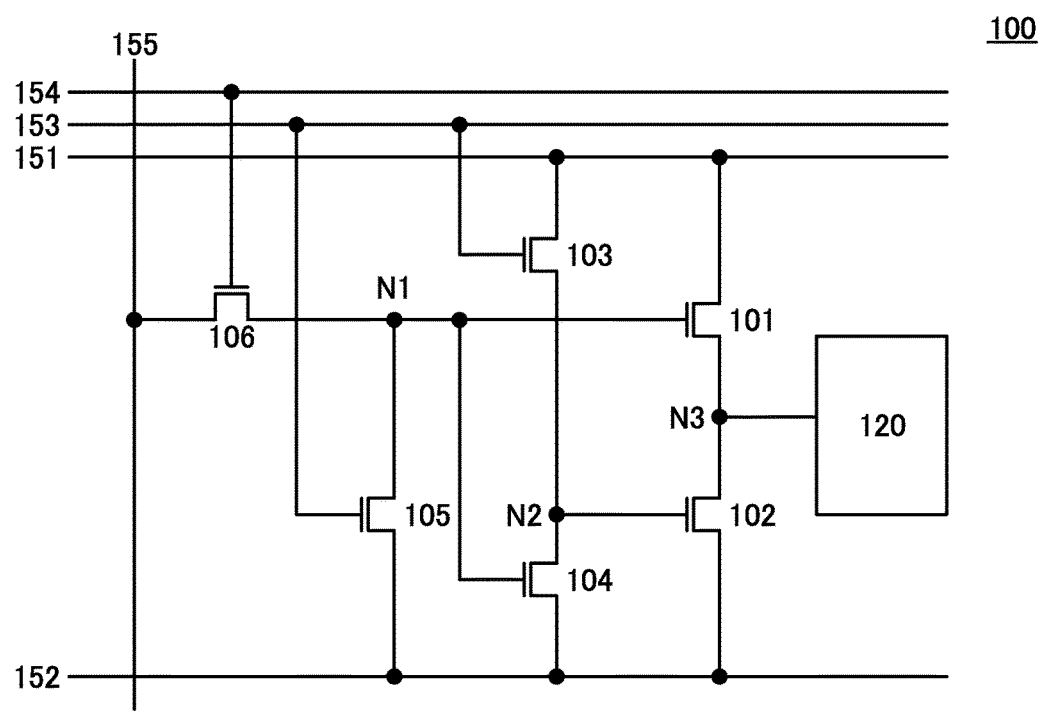
FIG. 1 illustrates an example of a pixel.

Embodiments of the present invention will be described below in detail with reference to the accompanying drawings. Note that the present invention is not limited to the following description and it is easily understood by those skilled in the art that the mode and details can be variously changed without departing from the scope and spirit of the present invention. Therefore, the present invention should not be interpreted as being limited to the description of the embodiments below.

One embodiment of the present invention includes, in its category, devices such as an imaging device, a radio frequency (RF) tag, a display device, and an integrated circuit. A display device includes, in its category, a display device including an integrated circuit, such as a liquid crystal display device, a light-emitting device in which a light-emitting element typified by an organic light-emitting element is provided in each pixel, electronic paper, a digital micromirror device (DMD), a plasma display panel (PDP), and a field emission display (FED).

In describing structures of the present invention with reference to the drawings, the same reference numerals are sometimes used in common for the same portions in different drawings.

In this specification and the like, part of a diagram or text described in one embodiment can be taken out to constitute one embodiment of the invention. Thus, in the case where a diagram or text related to a certain portion is described, the context taken out from part of the diagram or the text is also disclosed as one embodiment of the invention, and one embodiment of the invention can be constituted. The embodiment of the invention is clear. Therefore, for example, in a diagram or text in which one or more active elements (e.g., transistors), wirings, passive elements (e.g., capacitors), conductive layers, insulating layers, semiconductor layers, components, devices, operating methods, manufacturing methods, and the like are described, part of the diagram or the text is taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). For another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

In the case where at least one specific example is described in a diagram or text in one embodiment in this specification and the like, it will be readily appreciated by those skilled in the art that a broader concept of the specific example can be derived. Therefore, in the case where at least one specific example is described in the diagram or the text in one embodiment, a broader concept of the specific example is disclosed as one embodiment of the invention, and one embodiment of the invention can be constituted. The embodiment of the invention is clear.

In this specification and the like, a content described in at least a diagram (or part of the diagram) is disclosed as one embodiment of the invention, and one embodiment of the invention can be constituted. Therefore, when a certain content is described in a diagram, the content is disclosed as one embodiment of the invention even when the content is not described with text, and one embodiment of the invention can be constituted. In a similar manner, part of a diagram, which is taken out from the diagram, is disclosed as one embodiment of the invention, and one embodiment of the invention can be constituted. The embodiment of the invention is clear.

In addition, contents that are not specified in any text or drawing in the specification can be excluded from one embodiment of the invention. Alternatively, when the range of a value that is defined by the maximum and minimum values is described, the range is appropriately narrowed or part of the range is removed, whereby one embodiment of the invention excluding part of the range can be constructed. In this manner, it can be specified that a conventional technology is excluded from the technical scope of one embodiment of the present invention, for example.

In this specification and the like, it might be possible for those skilled in the art to constitute one embodiment of the invention even when portions to which all the terminals of an active element (e.g., a transistor), a passive element (e.g., a capacitor), or the like are connected are not specified. In other words, one embodiment of the invention can be clear even when connection portions are not specified. Furthermore, in the case where a connection portion is disclosed in this specification and the like, it can be determined in some cases that one embodiment of the invention in which a connection portion is not specified is disclosed in this specification and the like. In particular, in the case where the number of portions to which the terminal is connected is more than one, it is not necessary to specify the portions to which the terminal is connected. Therefore, it might be possible to constitute one embodiment of the invention by specifying only portions to which some of terminals of an active element (e.g., a transistor), a passive element (e.g., a capacitor), or the like are connected.

In this specification and the like, it might be possible for those skilled in the art to specify the invention when at least the connection portion of a circuit is specified. It might be possible for those skilled in the art to specify the invention when at least a function of a circuit is specified. In other words, when a function of a circuit is specified, one embodiment of the invention can be clear. Furthermore, it can sometimes be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Moreover, when a function of a circuit is specified, the circuit is disclosed as one embodiment of the invention even when a connection portion is not specified, and one embodiment of the invention can be constituted.

In this specification and the like, when it is explicitly described that X and Y are connected, the case where X and Y are electrically connected, the case where X and Y are functionally connected, and the case where X and Y are directly connected are included therein. Accordingly, without limitation to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, that is, the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and a control circuit) can be connected between X and Y. Note that for example, when a signal output from X is transmitted to Y, it can be said that X and Y are functionally connected even if another circuit is provided between X and Y. Note that the case where X and Y are functionally connected includes the case where X and Y are directly connected and the case where X and Y are electrically connected.

Note that in this specification and the like, the explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path," and "a source (or a first terminal or the like) of a transistor is electrically connected to X through Z1 at least with a first connection path, the first connection path does not include a second connection path, the second connection path includes a connection path through the transistor, a drain (or a second terminal or the like) of the transistor is electrically connected to Y through Z2 at least with a third connection path, and the third connection path does not include the second connection path." Still another example of the expression is "a source (or a first terminal or the like) of a transistor is electrically connected to X through Z1 on at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 on at least a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Embodiment 1

In this embodiment, a pixel of one embodiment of the present invention and a display device of one embodiment of the present invention will be described.

FIG. 1 is a circuit diagram illustrating an example of a pixel 100 in one embodiment of the present invention. The pixel 100 illustrated in FIG. 1 includes transistors 101 to 106 and a display element 120. A first terminal and a second terminal of the transistor 101 are connected to a wiring 151 and the display element 120, respectively. A first terminal and a second terminal of the transistor 102 are connected to a wiring 152 and the display element 120, respectively. A first terminal, a second terminal, and a gate of the transistor 103 are connected to the wiring 151, a gate of the transistor 102, and a wiring 153, respectively. A first terminal, a second terminal, and a gate of the transistor 104 are connected to the wiring 152, the gate of the transistor 102, and a gate of the transistor 101, respectively. A first terminal, a second terminal, and a gate of the transistor 105 are connected to the wiring 152, the gate of the transistor 101, and the wiring 153, respectively. A first terminal, a second terminal, and a gate of the transistor 106 are connected to a wiring 155, the gate of the transistor 101, and a wiring 154, respectively.

The transistors 101 to 106 preferably have the same polarity. The transistors 101 to 106 are n-channel transistors in FIG. 1; however, they may be p-channel transistors.

A node N1 corresponds to a portion where the gate of the transistor 101, the gate of the transistor 104, the second terminal of the transistor 105, and the second terminal of the transistor 106 are connected. A node N2 corresponds to a portion where the gate of the transistor 102, the second terminal of the transistor 103, and the second terminal of the transistor 104 are connected. A node N3 corresponds to a portion where the second terminal of the transistor 101, the second terminal of the transistor 102, and the display element 120 are connected.

As the display element 120, a MEMS device can be used. Examples of MEMS devices include a display element using MEMS, a digital micromirror device (DMD), a digital micro shutter (DMS), an interferometric modulator display (IMOD) element, a MEMS shutter display element, and an optical-interference-type MEMS display element. Note that the present invention is not limited to this. For example, in this specification and the like, a display element, a display device including a display element, a light-emitting element, and a light-emitting device including a light-emitting element can employ a variety of modes or can include a variety of elements. The display element, the display device, the light-emitting element, or the light-emitting device may include display media whose contrast, luminance, reflectivity, transmittance, or the like is changed by electrical or magnetic effect, for example, an electroluminescent (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using MEMS, a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, and a projection liquid crystal display). Examples of display devices including electronic ink, electronic liquid powder (registered trademark), or electrophoretic elements include electronic paper. In a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as SRAM can be provided under the reflective electrodes, leading to lower power consumption. Note that in the case of using an LED, graphene or graphite may be provided under an electrode or a nitride semiconductor of the LED. Graphene or graphite may be a multilayer film in which a plurality of layers are stacked. When graphene or graphite is provided in this manner, a nitride semiconductor, for example, an n-type GaN semiconductor layer including crystals can be easily formed thereover. Furthermore, a p-type GaN semiconductor layer including crystals or the like can be provided thereover, and thus the LED can be formed. Note that an AN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

Figure 2A:
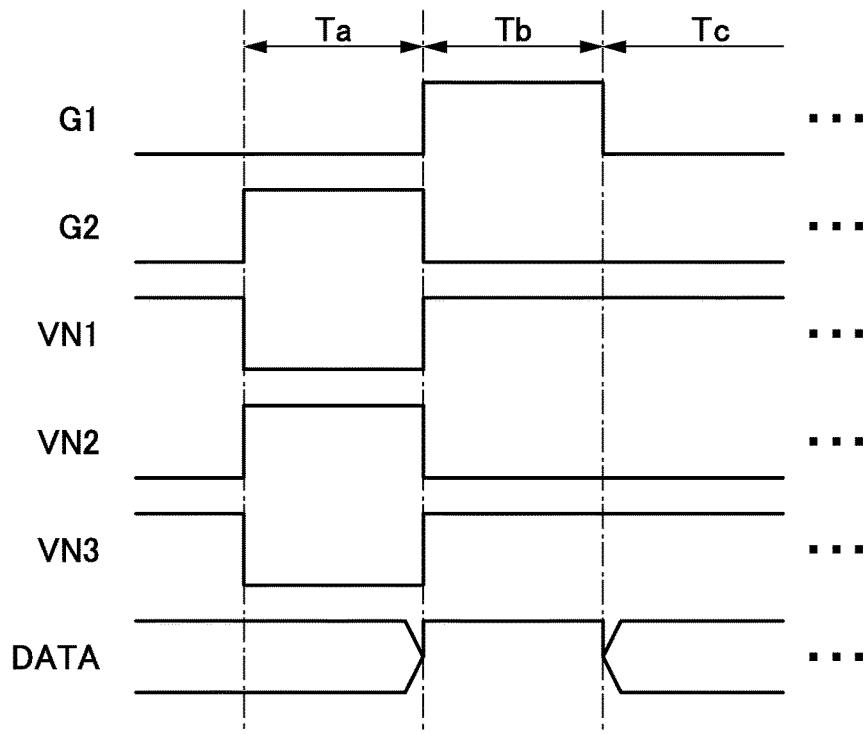
FIGS. 2A and 2B are diagrams each illustrating an example of a pixel.
Figure 2B:
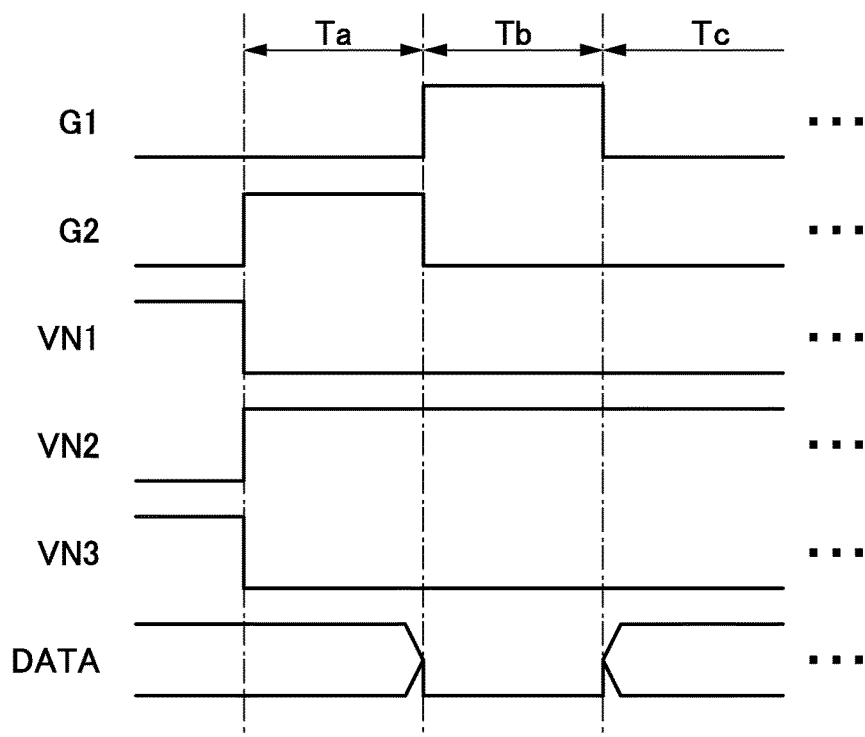
Figure 3A:
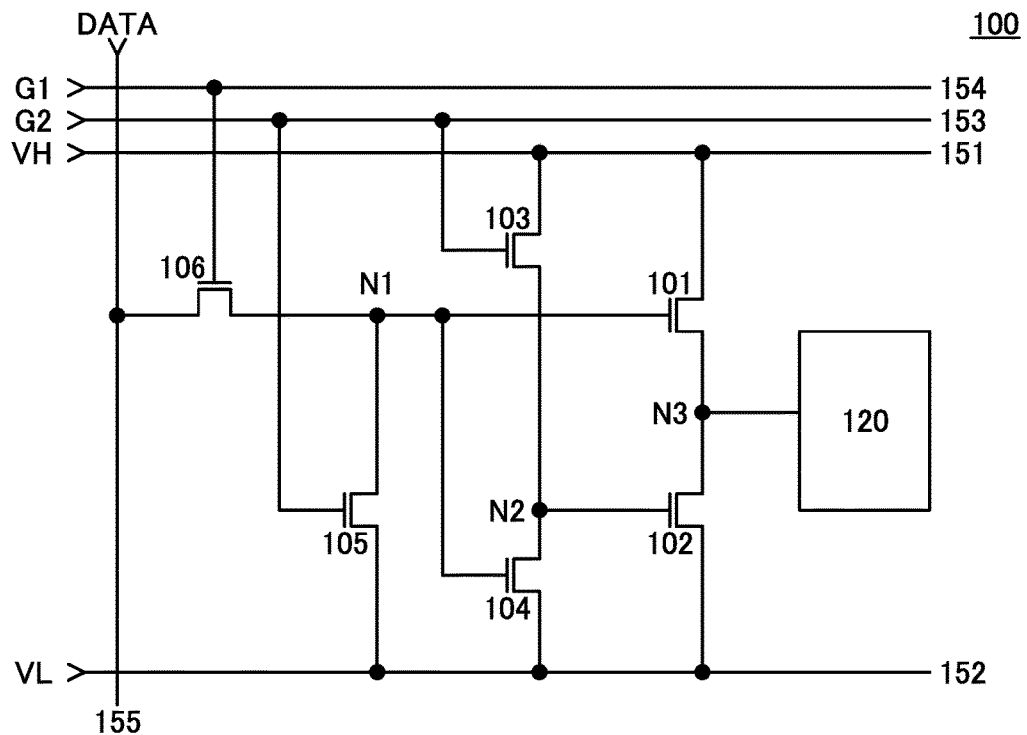
FIGS. 3A and 3B illustrate an example of a pixel.

FIGS. 2A and 2B show examples of timing charts applicable to the pixel 100 in FIG. 1. The timing charts in FIGS. 2A and 2B show a signal G1, a signal G2, a potential VN1, a potential VN2, a potential VN3, and a signal DATA. As illustrated in FIG. 3A, the signal G1 is a signal input to the wiring 154, the signal G2 is a signal input to the wiring 153, and the signal DATA is a signal input to the wiring 155. The potential VN1 is the potential of the node N1, the potential VN2 is the potential of the node N2, and the potential VN3 is the potential of the node N3. A voltage VH is input to the wiring 151, and a voltage VL (VL<VH) is input to the wiring 152. The period in the timing charts in FIGS. 2A and 2B is divided into a period Ta, a period Tb, and a period Tc. For example, one frame period has the period Ta, the period Tb, and the period Tc. Alternatively, one frame period has a plurality of sub-frame periods and at least one sub-frame period has the period Ta, the period Tb, and the period Tc. The timing charts in FIGS. 2A and 2B are different in that in the period Tb, the signal DATA is high in FIG. 2A and is low in FIG. 2B.

Note that the signals and voltages input to the wirings 151 to 155 are not limited to the above. A variety of signals and voltages can be input to the wirings 151 to 155 as appropriate.

An example of the operation of the pixel 100 in FIG. 1 will be described with reference to the timing charts of FIGS. 2A and 2B.

Figure 3B:
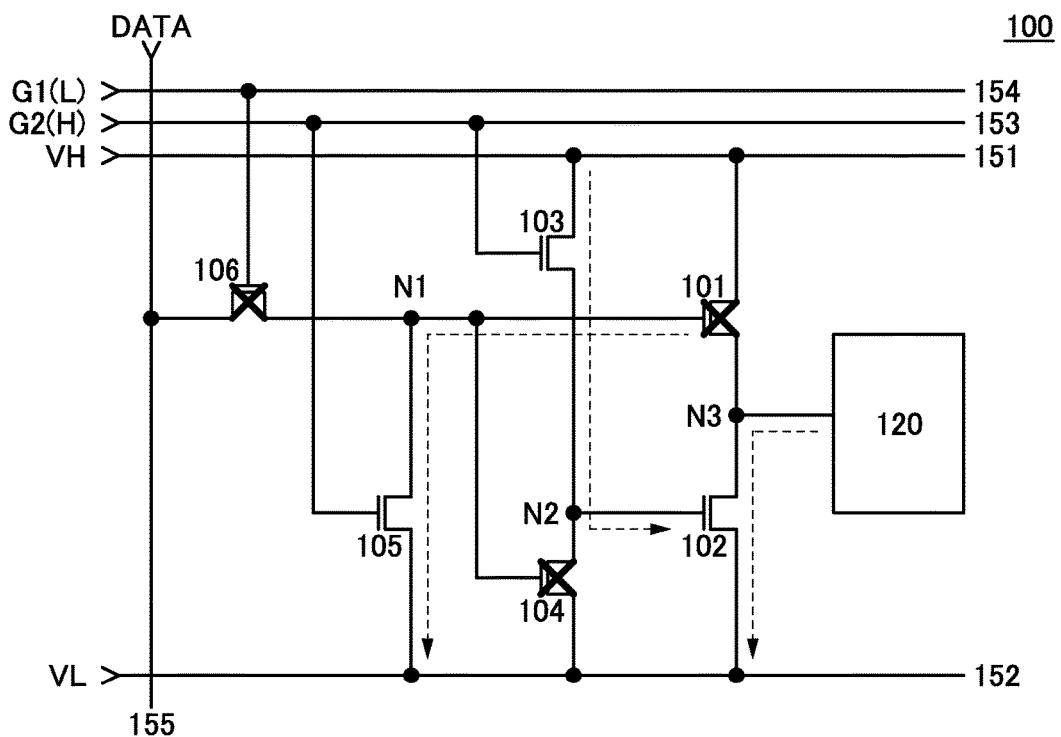

In the period Ta, the signal G1 is low; thus, the transistor 106 is off. The signal G2 becomes high, so that the transistors 103 and 105 are turned on. The potential VN1 becomes low because the voltage VL is supplied to the node N1 from the wiring 152 through the transistor 105; accordingly, the transistors 101 and 104 are turned off. The potential VN2 becomes high because the voltage VH is supplied to the node N2 from the wiring 151 through the transistor 103, and the transistor 102 is turned on as a result. The potential VN3 becomes low because the voltage VL is supplied to the node N3 from the wiring 152 through the transistor 102. Thus, the display element 120 is controlled based on the low level of the potential VN3 (see FIG. 3B).

Figure 4A:
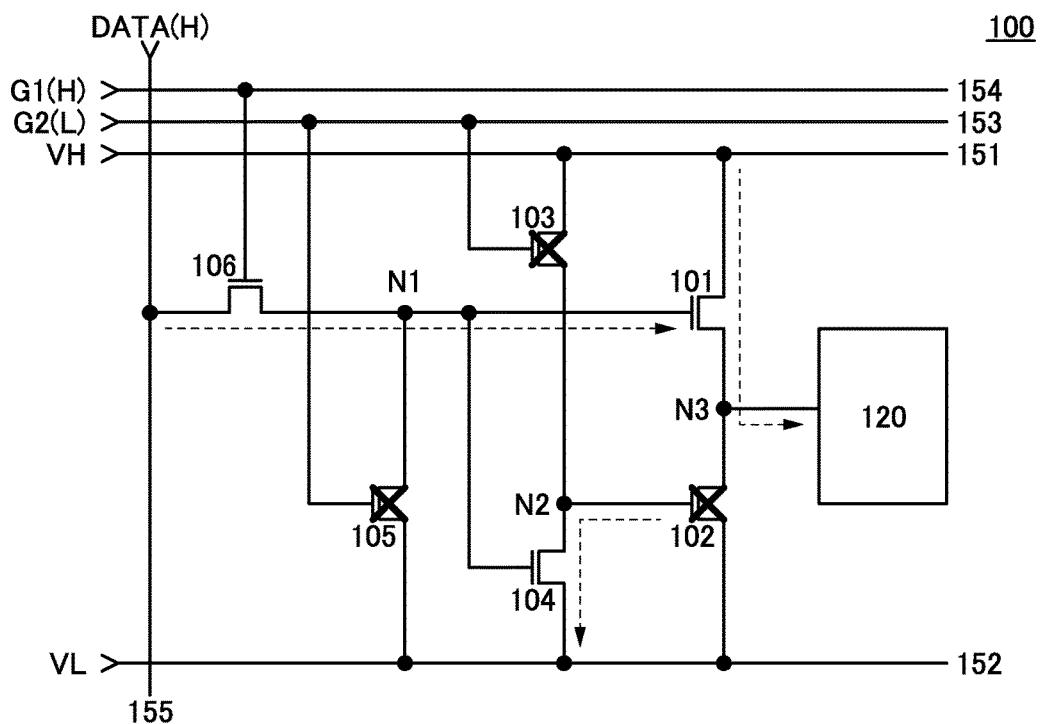
FIGS. 4A and 4B each illustrate an example of a pixel.
Figure 4B:
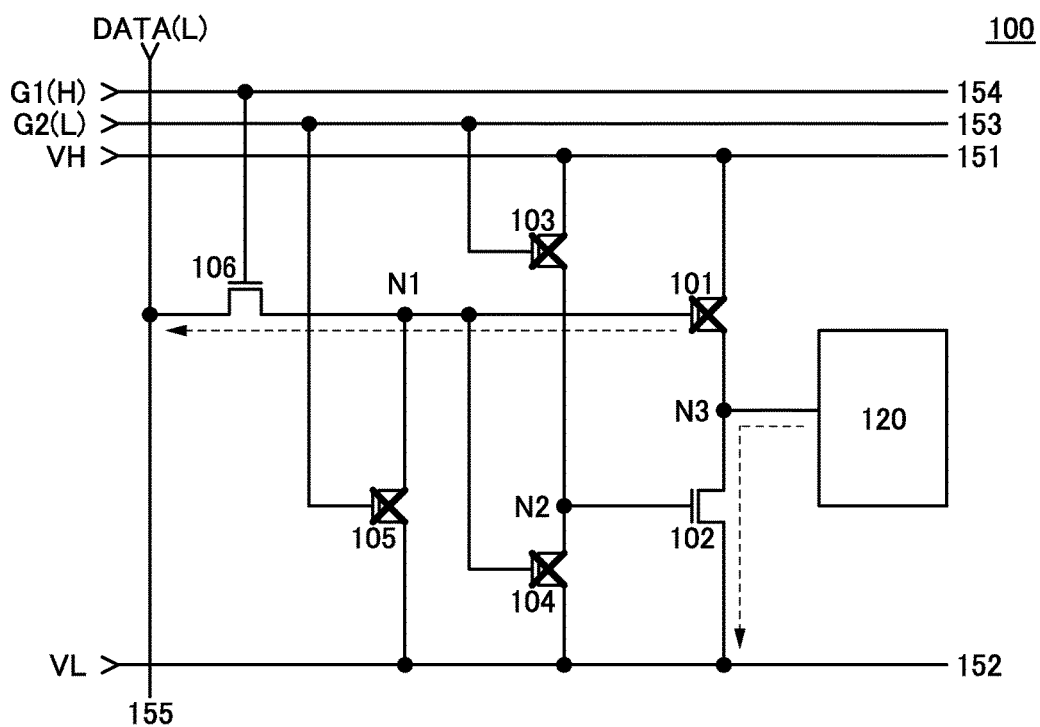

In the period Tb, the signal G1 becomes high, so that the transistor 106 is turned on. The signal G2 becomes low, and the transistors 103 and 105 are turned off. The signal DATA is supplied to the node N1 from the wiring 155 through the transistor 106; thus, the potential VN1 is controlled based on the signal DATA. Specifically, the potential VN1 becomes high when the signal DATA is high; accordingly, the transistors 101 and 104 are turned on. The potential VN2 becomes low because the voltage VL is supplied to the node N2 from the wiring 152 through the transistor 104. Thus, the transistor 102 is turned off. The potential VN3 becomes high because the voltage VH is supplied to the node N3 from the wiring 151 through the transistor 101. Thus, the display element 120 is controlled based on the high level of the potential VN3 (see FIG. 4A). On the other hand, when the signal DATA is low, the potential VN1 remains low and the transistors 101 and 104 remain off. The potential VN2 is kept high because the node N2 becomes floating; thus, the transistor 102 remains on. The potential VN3 remains low because the voltage VL continues to be supplied to the node N3 from the wiring 152 through the transistor 102. Accordingly, the display element 120 continues to be controlled based on the low level of the potential VN3 (see FIG. 4B).

Figure 5A:
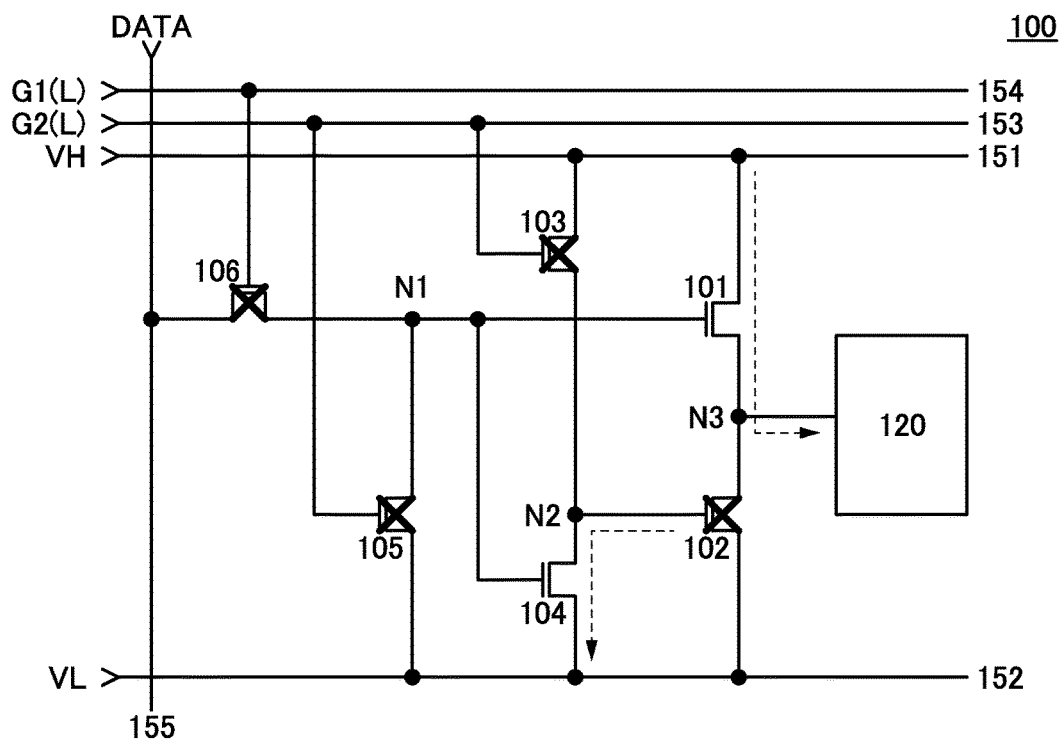
FIGS. 5A and 5B each illustrate an example of a pixel.
Figure 5B:
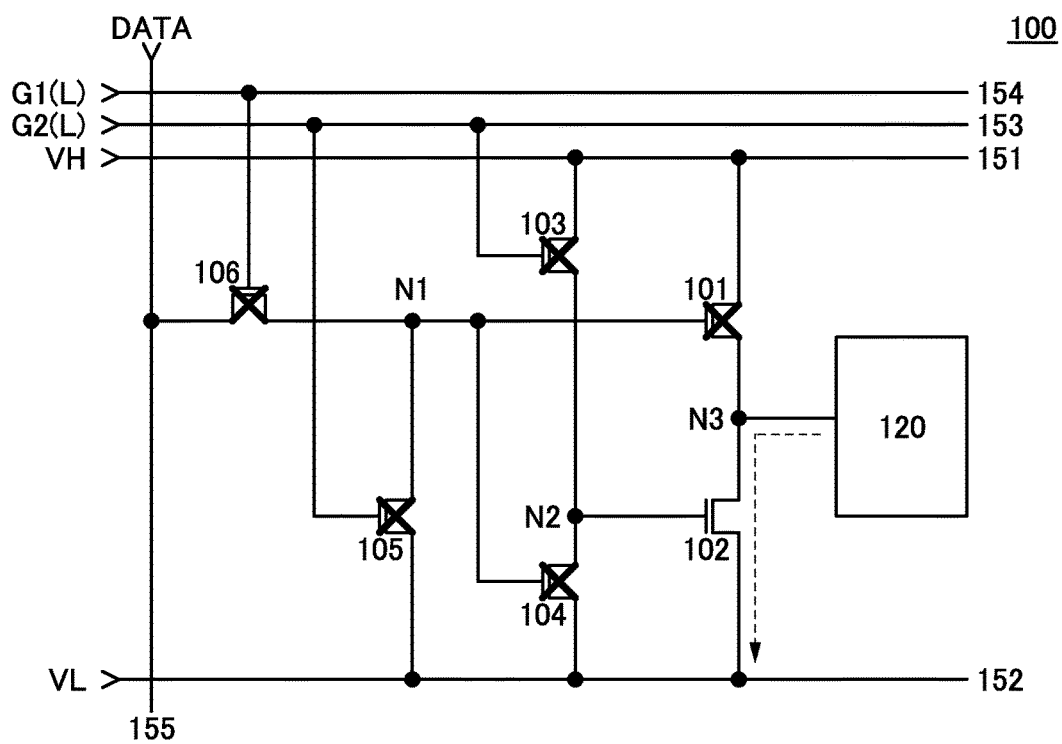

In the period Tc, the signal G1 becomes low, and the transistor 106 is turned off. The signal G2 remains low, so that the transistors 103 and 105 remain off. The node N1 becomes floating; thus, the potential VN1 is maintained at the level in the period Tb. Specifically, when the signal DATA in the period Tb is high, the potential VN1 is kept high, and the transistors 101 and 104 remain on. The potential VN2 remains low because the voltage VL continues to be supplied to the node N2 from the wiring 152 through the transistor 104. Thus, the transistor 102 remains on. The potential VN3 remains high because the voltage VH continues to be supplied to the node N3 from the wiring 151 through the transistor 101. Accordingly, the display element 120 continues to be controlled based on the high level of the potential VN3 (see FIG. 5A). On the other hand, when the signal DATA in the period Tb is low, the potential VN1 is kept low, so that the transistors 101 and 104 remain off. Since the node N2 remains floating, the potential VN2 is kept high, and the transistor 102 remains on. The potential VN3 remains low because the voltage VL continues to be supplied to the node N3 from the wiring 152 through the transistor 102. Consequently, the display element 120 continues to be controlled based on the low level of the potential VN3 (see FIG. 5B).

In the pixel 100 illustrated in FIG. 1, the voltage VH or the voltage VL can be supplied to the node N3 in the period Tc, whereby the potential VN3 can be kept constant. Accordingly, the voltage applied to the display element 120 can be kept constant even if the state of the display element 120 is changed; thus, the gray level of the display element 120 can be precisely controlled. In addition, the refresh rate can be decreased, leading to lower power consumption.

In the pixel 100 in FIG. 1, a current between the wiring 151 and the wiring 152 is not generated all the time, leading to lower power consumption.

In the pixel 100 in FIG. 1, the signal DATA is not supplied directly to the display element 120; thus, the period Tb can be shortened. Accordingly, the number of pixels can be increased, resulting in higher pixel resolution. Moreover, the size of transistors in a circuit that has a function of outputting the signal DATA to the wiring 155 (e.g., a source driver or a demultiplexer) can be decreased.

The pixel 100 in FIG. 1 can consist of transistors of the same polarity, whereby fabrication costs can be reduced.

Function of the transistors 101 to 106 will be described.

The transistor 106 has a function of controlling electrical continuity between the wiring 155 and the node N1. The transistor 106 has a function of controlling whether to supply the potential of the wiring 155 (the signal DATA) to the node N1.

The transistor 106 has a function of controlling whether to input the signal DATA to the pixel 100. The transistor 106 is controlled based on the potential of the wiring 154 (the signal G1).

The transistor 103 has a function of controlling electrical continuity between the wiring 151 and the node N2. The transistor 103 has a function of controlling whether to supply the potential of the wiring 151 (the voltage VH) to the node N2. The transistor 103 has a function of controlling whether to set the potential VN2 to a value at which the transistor 102 is turned on. The transistor 103 is controlled based on the potential of the wiring 153 (the signal G2).

The transistor 105 has a function of controlling electrical continuity between the wiring 152 and the node N1. The transistor 105 has a function of controlling whether to supply the potential of the wiring 152 (the voltage VL) to the node N1. The transistor 105 has a function of controlling whether to set the potential VN1 to a value at which the transistor 101 is turned off. The transistor 105 is controlled based on the potential of the wiring 153 (the signal G2).

The transistor 104 has a function of controlling electrical continuity between the wiring 152 and the node N2. The transistor 104 has a function of controlling whether to supply the potential of the wiring 152 (the voltage VL) to the node N2. The transistor 104 has a function of controlling whether to set the potential VN2 to a value at which the transistor 102 is turned off. The transistor 104 is controlled based on the potential of the node N1 (the signal DATA input to the pixel 100 or a potential based on the signal DATA).

The transistor 101 has a function of controlling electrical continuity between the wiring 151 and the node N3. The transistor 101 has a function of controlling whether to supply the potential of the wiring 151 (the voltage VH) to the node N3. The transistor 101 is controlled based on the potential VN1 (the signal DATA input to the pixel 100 or a potential based on the signal DATA).

The transistor 102 has a function of controlling electrical continuity between the wiring 152 and the node N3. The transistor 102 has a function of controlling whether to supply the potential of the wiring 152 (the voltage VL) to the node N3. The transistor 102 is controlled based on the potential VN2 (an output signal of a circuit composed of the transistor 103 and the transistor 104).

Functions of the signal DATA, the signal G1, the signal G2, the voltage VH, the voltage VL, and the wirings 151 to 155 will be described.

The signal DATA has a function of controlling a voltage (the potential VN3) to be supplied to the display element 120. That is, the signal DATA has a function of a video signal or an image signal. Although the case where the signal DATA is a digital signal is described here, one embodiment of the present invention is not limited to this and the signal DATA may be an analog signal. When the signal DATA is an analog signal, the potential VN1 is controlled in an analog fashion. For example, when the potential VN1 is less than or equal to the sum of the voltage VL and the threshold voltage of the transistor 101 and is less than or equal to the sum of the voltage VL and the threshold voltage of the transistor 104, the transistor 101 is turned off and the transistor 102 is turned on as in the case of FIG. 2B. Then, the voltage VL is supplied to the node N3 from the wiring 152 through the transistor 102, so that the potential VN3 becomes VL. In contrast, for example, when the potential VN1 is more than the sum of the voltage VL and the threshold voltage of the transistor 101 and is more than the sum of the voltage VL and the threshold voltage of the transistor 104, the transistor 101 is turned on and the transistor 102 is turned off as in the case of FIG. 2A. Then, the voltage VH is supplied to the node N3 from the wiring 151 through the transistor 101. Note that when the potential VN3 increases to a value obtained by subtracting the threshold voltage of the transistor 101 from the potential VN1, the transistor 101 is turned off. Consequently, the potential VN3 becomes higher as the potential VN1 is higher, that is, as the potential of the signal DATA is higher. In the above manner, the potential VN3 can be controlled based on the potential VN1, that is, the signal DATA.

The signal G1 has a function of controlling the on/off state of the transistor 106. The signal G1 has a function of controlling the timing at which the signal DATA is input to the pixel 100. The signal G1 has a function of controlling whether the pixel 100 is selected. The high level of the signal G1 is preferably higher than the maximum value (high level) of the signal DATA, and the low level of the signal G1 is preferably lower than the minimum value (low level) of the signal DATA.

The signal G2 has a function of controlling the on/off state of the transistor 103. The signal G2 has a function of controlling the on/off state of the transistor 105. The signal G2 has a function of controlling the timing of initializing the pixel 100. That is, the signal G2 has a function of controlling the timing at which the potential VN3 is initialized to the low level. Specifically, the signal G2 has a function of controlling the timing of turning on the transistor 103 to set the potential VN2 to a value at which the transistor 102 is turned on and turning on the transistor 105 to set the potential VN1 to a value at which the transistor 101 is turned off.

The voltage VH has a value that allows the potential VN2 to be a value capable of turning on the transistor 102 when the voltage VH is supplied to the node N2 through the transistor 103. The wiring 151 may be supplied with a signal whose value enables the potential VN2 to be a value capable of turning on the transistor 102 when the signal is supplied to the node N2 through the transistor 103.

The voltage VL has a value that allows the potential VN1 to be a value capable of turning off the transistor 101 when the voltage VL is supplied to the node N1 through the transistor 105. The voltage VL has a value that allows the potential VN2 to be a value capable of turning off the transistor 102 when the voltage VL is supplied to the node N2 through the transistor 104. The wiring 152 may be supplied with a signal whose value enables the potential VN1 to be a value capable of turning off the transistor 101 when the signal is supplied to the node N1 through the transistor 105. The wiring 152 may be supplied with a signal whose value enables the potential VN2 to be a value capable of turning off the transistor 102 when the signal is supplied to the node N2 through the transistor 104.

The wiring 155 has a function of transmitting the signal DATA; accordingly, the wiring 155 may be referred to as a signal line such as a source signal line or a video signal line. The wiring 154 has a function of transmitting the signal G1 and may thus be referred to as a signal line such as a gate signal line or a selection line. The wiring 153 has a function of transmitting the signal G2 and may be referred to as a signal line such as a gate signal line or a selection line. The wiring 151 has a function of transmitting the voltage VH and may be referred to as a power supply line. The wiring 152 has a function of transmitting the voltage VL and may be referred to as a power supply line.

A preferred embodiment of the pixel 100 illustrated in FIG. 1 will be described.

The transistors 101 and 102 preferably have high current supply capability to drive the display element 120. In contrast, the current supply capability of the transistors 103 to 106 is not necessarily as high as that of the transistors 101 and 102 because it is acceptable as long as the transistors 103 to 106 can drive the node N1 or the node N2. Thus, the ratio of channel width to channel length (W/L ratio) of the transistor 101 is preferably higher than that of each of the transistors 103 to 106. The W/L ratio of the transistor 102 is preferably higher than that of each of the transistors 103 to 106. In such a case, the display element with heavy load can be driven by the transistors 101 and 102, and the pixel layout area can be decreased.

The transistor 101 preferably has high current supply capability to shorten the time necessary to change the potential VN3 (from low level to high level) in the period Tc. In contrast, the current supply capability of the transistor 102 is not necessarily as high as that of the transistor 101 because it does not contribute to the reduction in time to change the potential VN3 in the period Tc. Therefore, the W/L ratio of the transistor 101 is preferably higher than that of the transistor 102. Furthermore, the transistor 101 preferably has the highest W/L ratio among the transistors included in the pixel 100. In such a case, the time necessary to change the potential VN3 can be shortened, and the pixel layout area can be decreased.

The transistor 105 preferably has high current supply capability to advance the timing at which the transistor 104 is turned off in the period Ta. In contrast, the current supply capability of the transistor 103 is not necessarily as high as that of the transistor 105 and should be high enough to set the potential VN2 to a value capable of turning on the transistor 102 in the period Ta. Therefore, the W/L ratio of the transistor 105 is preferably higher than that of the transistor 103. In this case, the time during which both the transistor 103 and the transistor 104 are on can be shortened; thus, the time during which a shoot-through current occurs in the transistors 103 and 104 can be shortened, and the amount of shoot-through current generated in the transistors 103 and 104 can be reduced. Consequently, power consumption can be reduced.

The transistor 104 preferably has high current supply capability to advance the timing at which the transistor 102 is turned off in the period Tc. Similarly, the transistor 105 preferably has high current supply capability to advance the timing at which the transistor 104 is turned off in the period Ta. Note that the amount of shoot-through current generated in the transistors 101 and 102 is larger than that generated in the transistors 103 and 104. Therefore, the W/L ratio of the transistor 104 is preferably higher than that of the transistor 105. Furthermore, the W/L ratio of the transistor 104 is preferably higher than that of the transistor 103. Accordingly, the amount of shoot-through current generated in the transistors 101 and 102 can be decreased preferentially relative to that generated in the transistors 103 and 104; thus, the amount of power consumption reduction can be increased.

Figure 7:
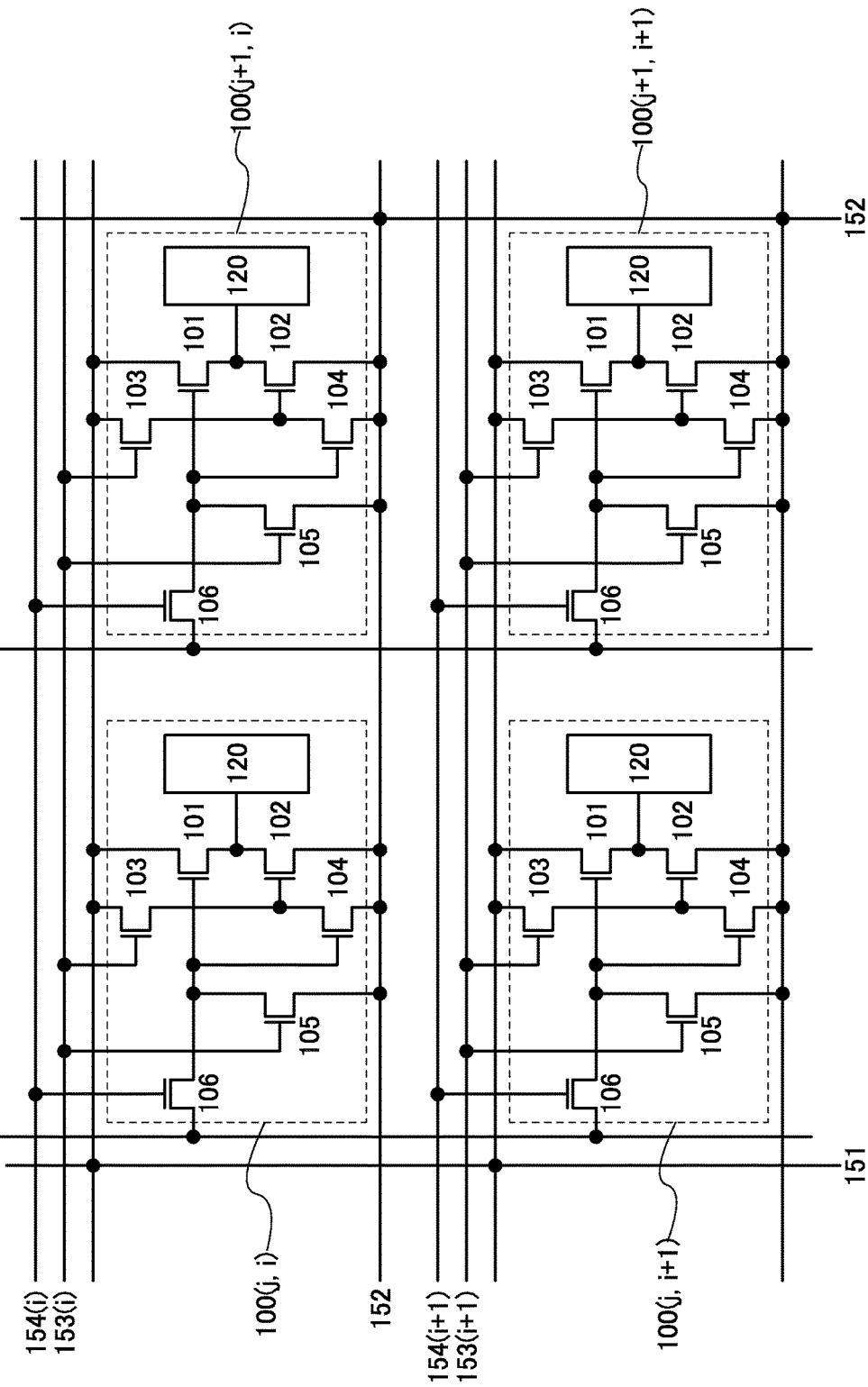
FIG. 7 illustrates an example of a display device.

FIG. 6 is a block diagram illustrating a display device 180 of one embodiment of the present invention. The display device 180 illustrated in FIG. 6 includes a pixel portion 181 and circuits 182 to 187. The pixel portion 181 is provided with the wiring 151, the wiring 152, wirings 153(1) to 153($m$) ($m$ is a natural number), wirings 154(1) to 154($m$), and wirings 155(1) to 155($n$) ($n$ is a natural number). The wirings 153(1) to 153($m$) correspond to the wiring 153. The wirings 154(1) to 154(m) correspond to the wiring 154. The wirings 155(1) to 155(n) correspond to the wiring 155. The pixel portion 181 includes pixels 100(1, 1) to 100(n, m). The pixels 100(1, 1) to 100(n, m) are arranged in a matrix to correspond to the wirings 153(1) to 153(m), the wirings 154(1) to 154(m), and the wirings 155(1) to 155(n). FIG. 7 illustrates a specific example of the pixel 100(j, i) (j is one of 1 to n, and i is one of 1 to m), the pixel 100(j+1, i), the pixel 100(j, i+1), and the pixel 100(j+1, i+1).

The circuit 182 is connected to the wirings 154(1) to 154(m). The circuit 182 has a function of controlling the potentials of the wirings 154(1) to 154(m). Specifically, the circuit 182 has a function of outputting signals G1(1) to G1(m) to the respective wirings 154(1) to 154(m). The signals G1(1) to G1(m) correspond to the signal G1. That is, the circuit 182 has a function of a driver circuit such as a scan line driver circuit or a gate driver. The wirings 154(1) to 154(m) have a function of a signal line such as a scan line or a gate signal line.

The circuit 183 is connected to the wirings 153(1) to 153(m). The circuit 183 has a function of controlling the potentials of the wirings 153(1) to 153(m). Specifically, the circuit 183 has a function of outputting signals G2(1) to G2(m) to the respective wirings 153(1) to 153(m). The signals G2(1) to G2(m) correspond to the signal G2. That is, the circuit 183 has a function of a driver circuit such as a scan line driver circuit or a gate driver. The wirings 153(1) to 153(m) have a function of a signal line such as a scan line or a gate signal line.

The circuit 184 is connected to the wirings 155(1) to 155(n). The circuit 184 has a function of controlling the potentials of the wirings 155(1) to 155(n). Specifically, the circuit 184 has a function of outputting a signal corresponding to the signal DATA to the wirings 155(1) to 155(n). That is, the circuit 184 has a function of a driver circuit such as a signal line driver circuit or a source driver. The wirings 155(1) to 155(n) have a function of a signal line such as a video signal line or a source signal line.

The circuit 185 is connected to the wiring 151. The circuit 185 has a function of controlling the potential of the wiring 151. Specifically, the circuit 185 has a function of outputting a voltage corresponding to the voltage VH to the wiring 151. That is, the circuit 185 has a function of a power supply circuit.

The circuit 186 is connected to the wiring 152. The circuit 186 has a function of controlling the potential of the wiring 152. Specifically, the circuit 186 has a function of outputting a voltage corresponding to the voltage VL to the wiring 152. That is, the circuit 186 has a function of a power supply circuit.

The circuit 187 has a function of controlling the circuit 182, the circuit 183, and the circuit 184. The circuit 187 has a function of outputting signals for controlling the circuit 182 (e.g., a clock signal and a start pulse) to the circuit 182. The circuit 187 has a function of outputting signals for controlling the circuit 183 (e.g., a clock signal and a start pulse) to the circuit 183. The circuit 187 has a function of outputting signals for controlling the circuit 184 (e.g., a video signal, a clock signal, and a start pulse) to the circuit 184. That is, the circuit 187 has a function of a timing controller.

Figure 8:
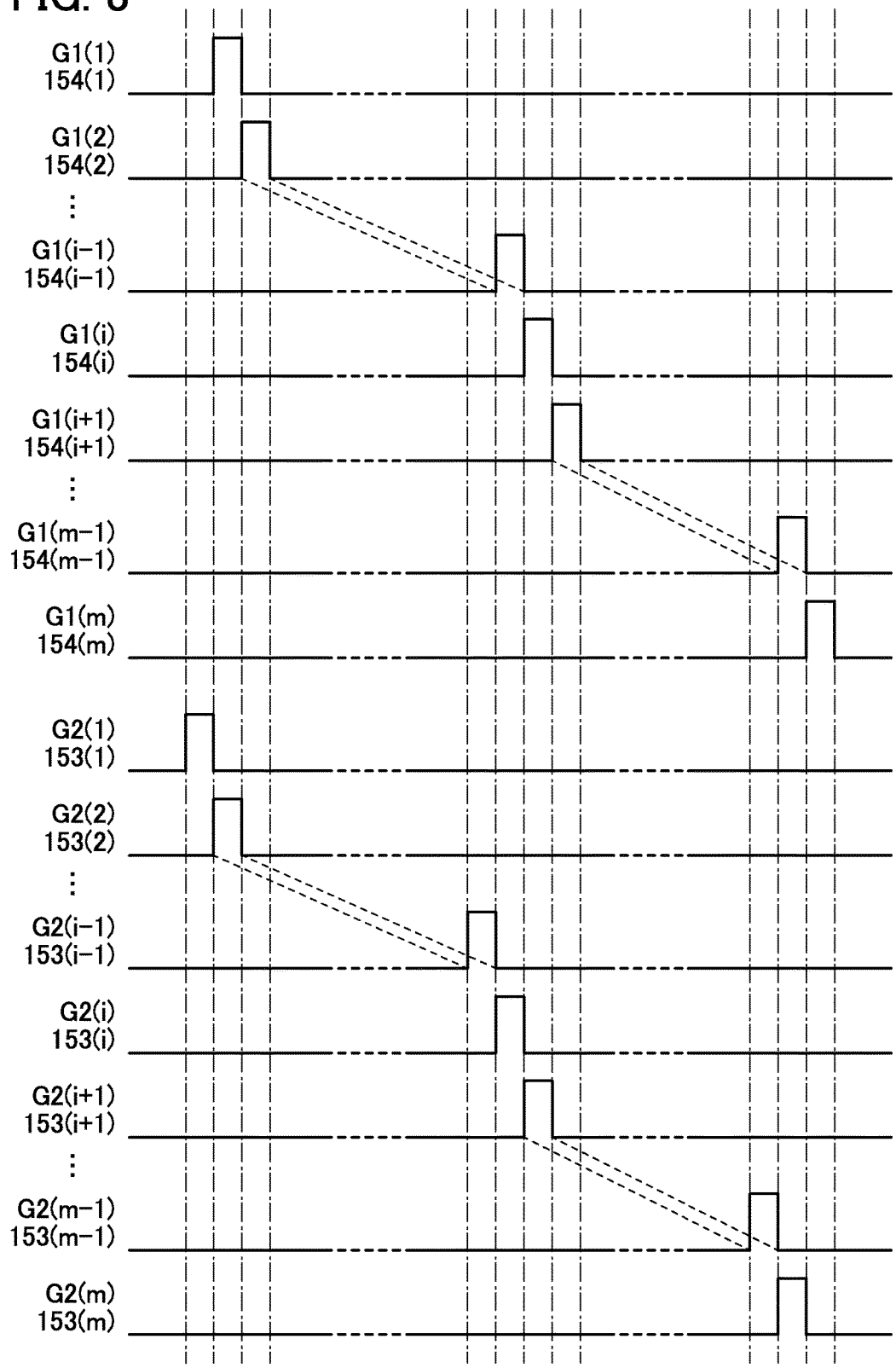
FIG. 8 is a diagram illustrating an example of a display device.

FIG. 8 shows an example of a timing chart applicable to the display device 180 in FIG. 6. The timing chart in FIG. 8 shows an example of the signals G1(1) to G1(m) and the signals G2(1) to G2(m). The wirings 153(1) to 153(m) are sequentially selected as the signals G2(1) to G2(m) sequentially become high. The wirings 154(1) to 154(m) are sequentially selected as the signals G1(1) to G1(m) sequentially become high. Although not shown, the circuit 184 outputs the signal DATA to the wirings 155(1) to 155(n) every time the signals G1(1) to G1(m) sequentially become high. For example, when the signal G2(i) (i is one of 1 to m) becomes high and the wiring 153(i) is selected, the pixels 100(i, 1) to 100(i, n) perform the operation in the period Ta shown in FIG. 2A or FIG. 2B. Then, when the signal G1(i) becomes high, the wiring 154(i) is selected, and the circuit 184 outputs the signals DATA for the pixels 100(i, 1) to 100(i, n) to the wirings 155(1) to 155(n), the pixels 100(i, 1) to 100(i, n) perform the operation in the period Tb shown in FIG. 2A or FIG. 2B. Subsequently, when the signal G1(i) becomes low and the wiring 154(i) is deselected, the pixels 100(i, 1) to 100(i, n) perform the operation in the period Tc shown in FIG. 2A or FIG. 2B.

Figure 9:
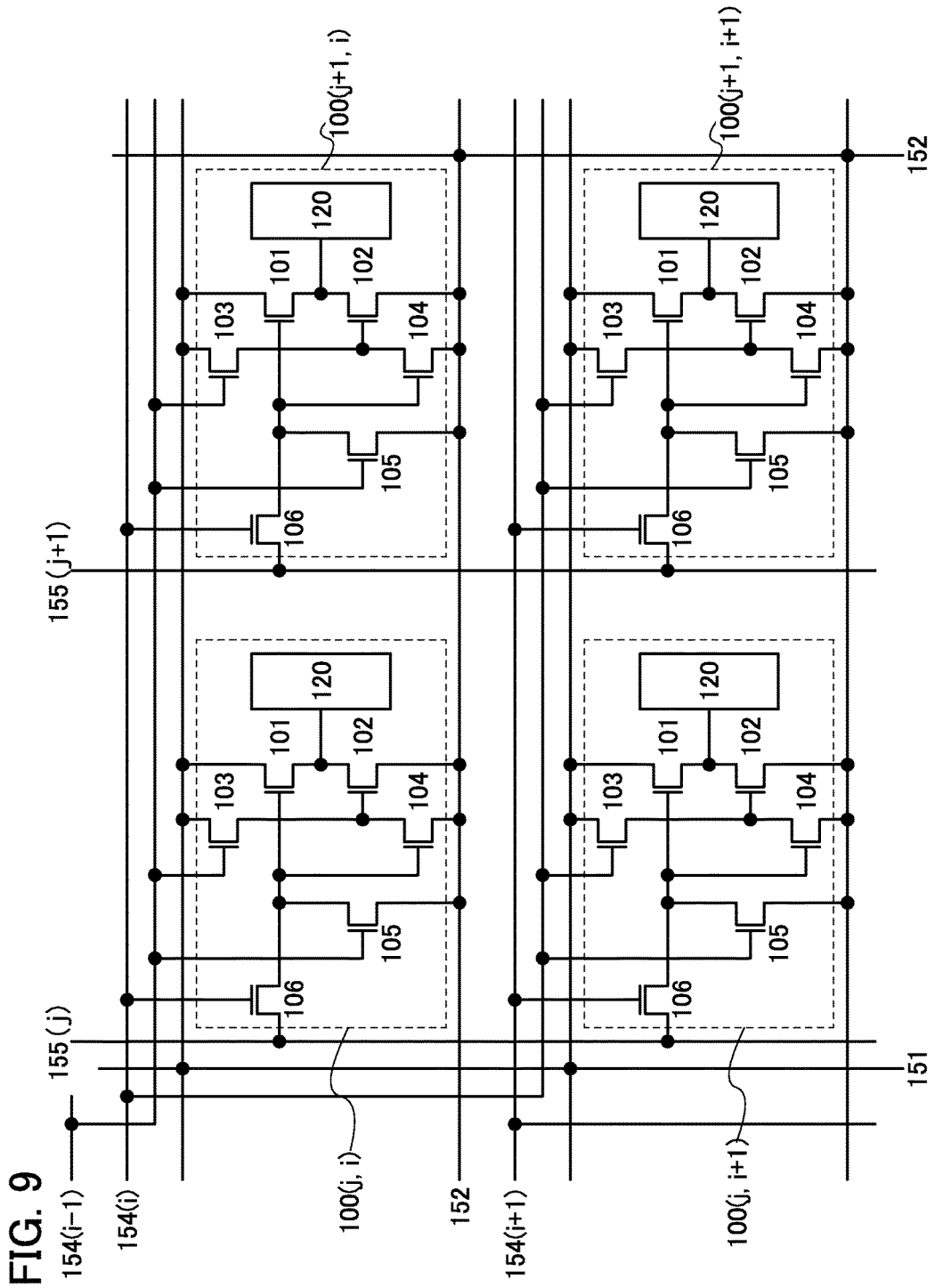
FIG. 9 illustrates an example of a display device.

Note that the wirings 153(1) to 153(m) may be omitted as illustrated in FIG. 9. Moreover, in the pixels 100(i, 1) to 100(i, n), the gate of the transistor 103 and the gate of the transistor 105 may be connected to the wiring 154(i−1), for example. Such a structure allows the reduction in the number of wirings and the number of driver circuits.

Figure 10:
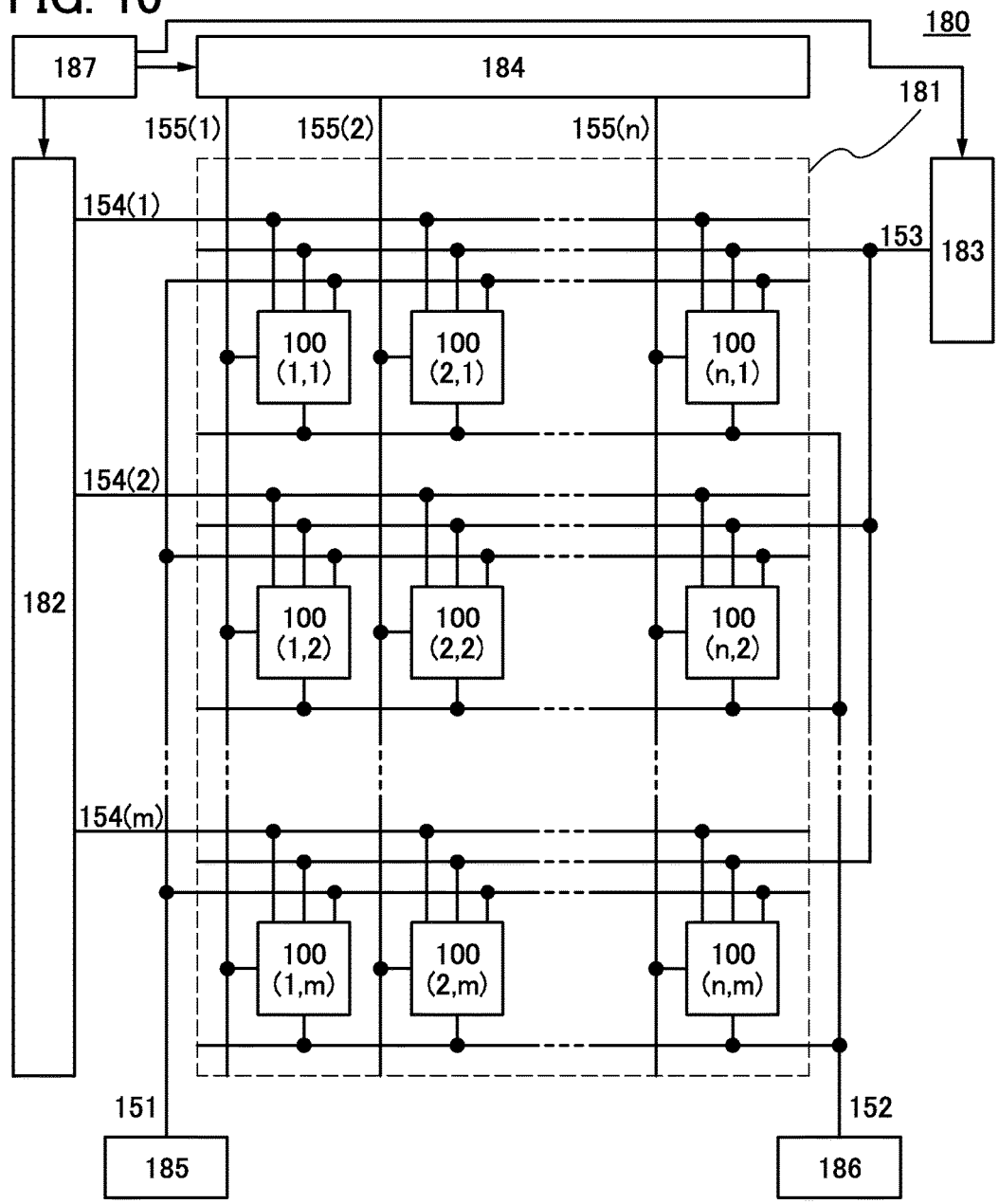
FIG. 10 illustrates an example of a display device.
Figure 11:
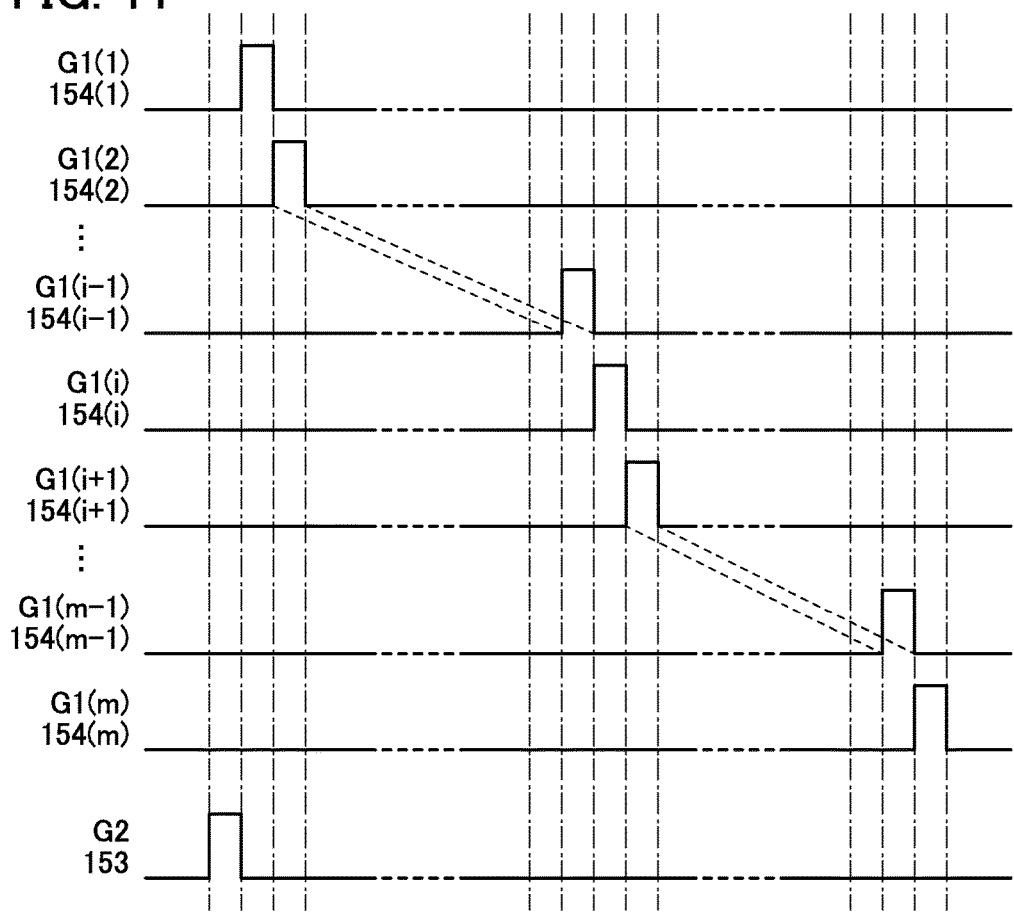
FIG. 11 is a diagram illustrating an example of a display device.

Note that the wirings 153(1) to 153(m) may be one wiring (the wiring 153) as illustrated in FIG. 10. In the display device 180 of FIG. 10, the signal G2 is preferably set high before the signal G1(1) is set high, as shown in FIG. 11. Accordingly, the pixels 100(1, 1) to 100(n, m) perform the operation in the period Ta shown in FIG. 2A or FIG. 2B. Thus, the number of wirings can be reduced and the configuration of the circuit 183 can be simplified.

The pixel of one embodiment of the present invention is not limited to that illustrated in FIG. 1. Modification examples of the pixel 100 illustrated in FIG. 1 will be described below. Note that the description of components that are the same as those in FIG. 1 is omitted.

Figure 12:
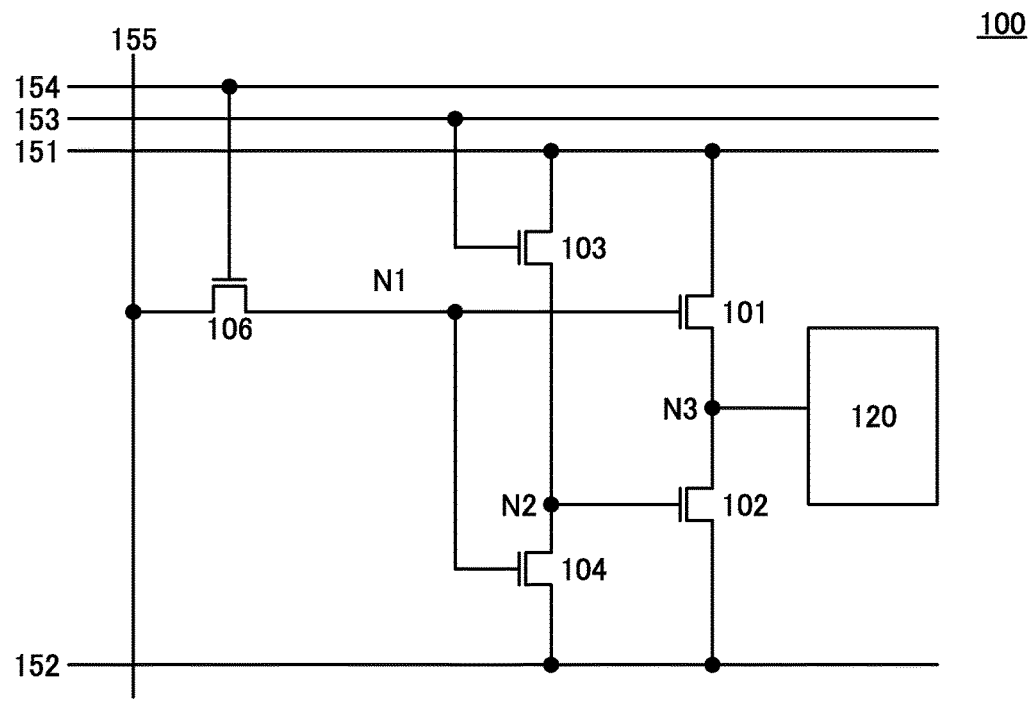
FIG. 12 illustrates an example of a pixel.
Figure 13A:
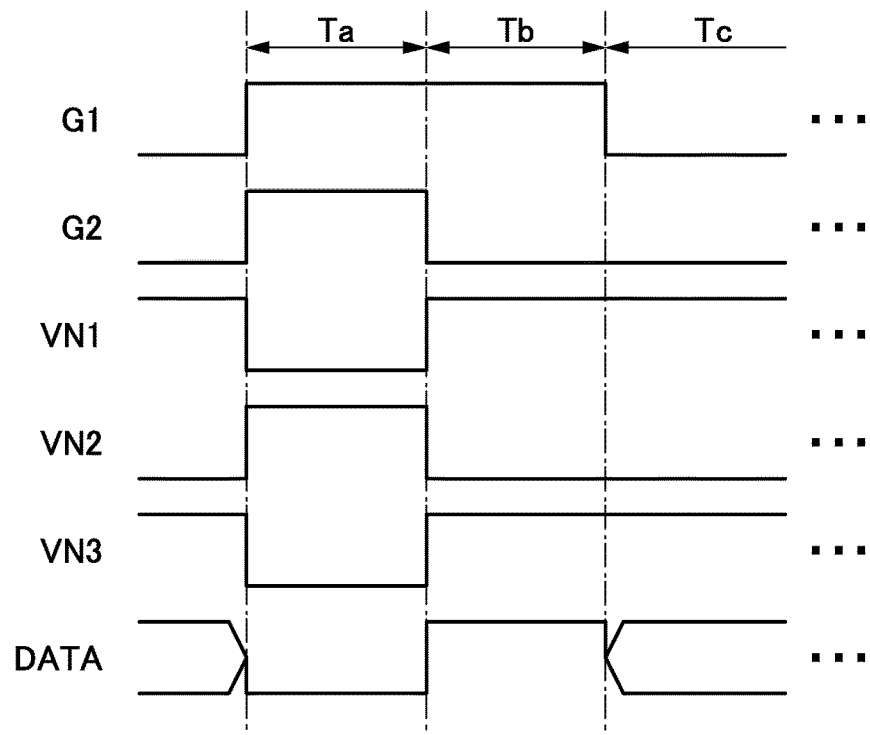
FIGS. 13A and 13B are diagrams each illustrating an example of a pixel.
Figure 13B:
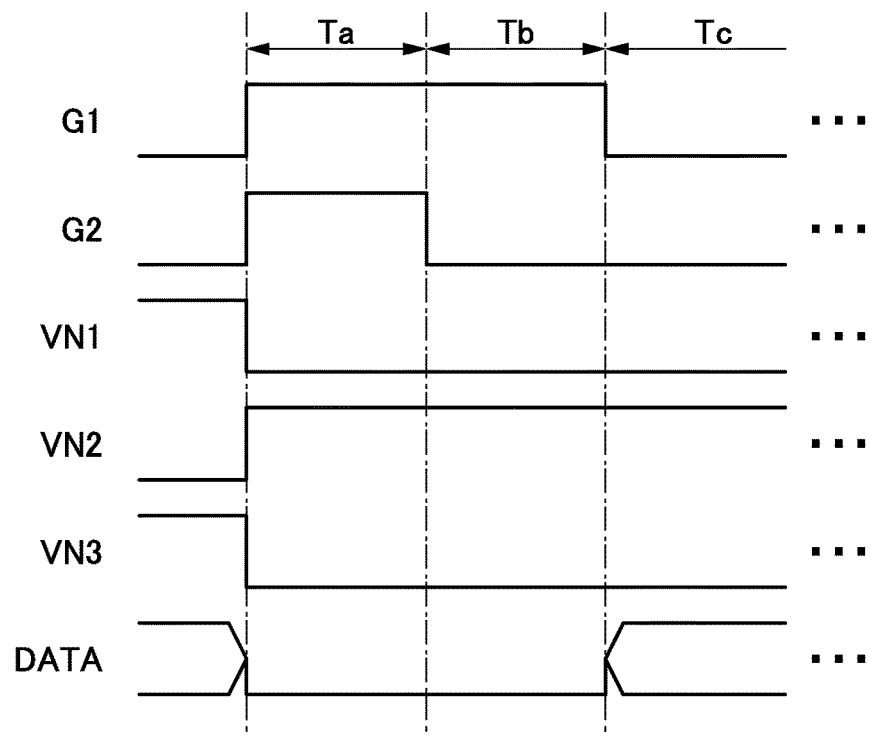

FIG. 12 is different from FIG. 1 in that the transistor 105 is omitted. Timing charts in FIGS. 13A and 13B are preferably used for the pixel 100 illustrated in FIG. 12. FIGS. 13A and 13B are different from FIGS. 2A and 2B in that the signal G1 becomes high and the signal DATA becomes low (or may become the voltage VL) in the period Ta. In the period Ta, the transistor 106 is turned on because the signal G1 becomes high. Moreover, the signal DATA becomes low; thus, the low-level signal DATA is supplied to the node N1 from the wiring 155 through the transistor 106, and the potential VN1 becomes low as a result.

Figure 14A:
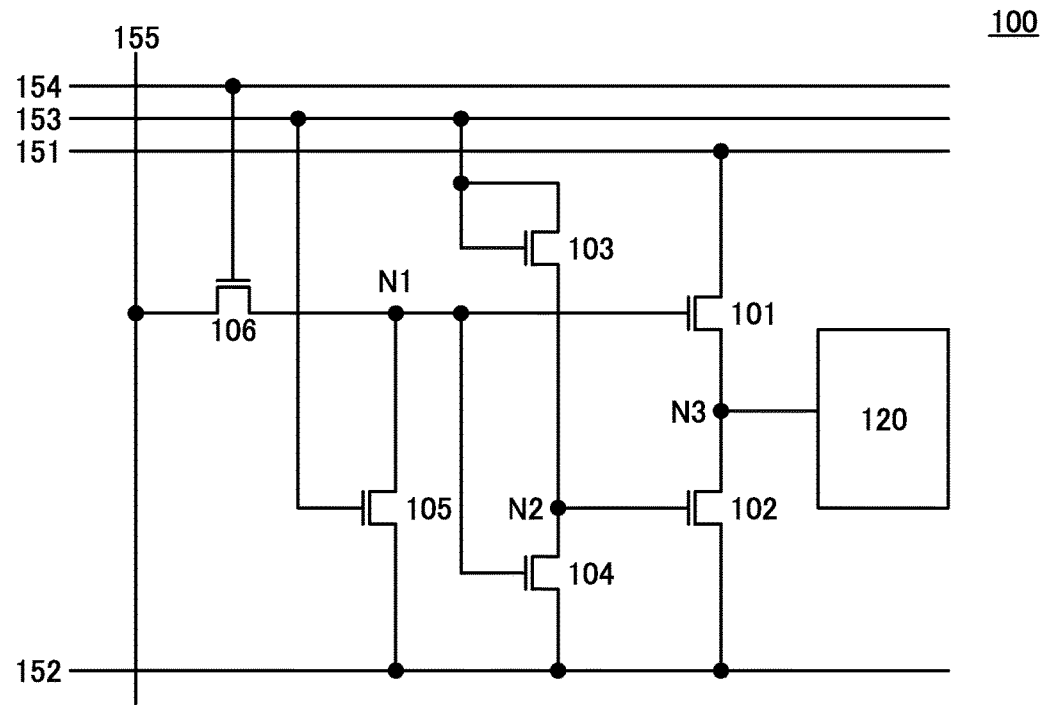
FIGS. 14A and 14B each illustrate an example of a pixel.

FIG. 14A is different from FIG. 1 in that the first terminal of the transistor 103 is connected to the wiring 153. In the pixel 100 of FIG. 14A, the potential levels of the first terminal and the second terminal of the transistor 103 can be opposite to each other, whereby a change in characteristics of the transistor 103 can be suppressed.

Figure 14B:
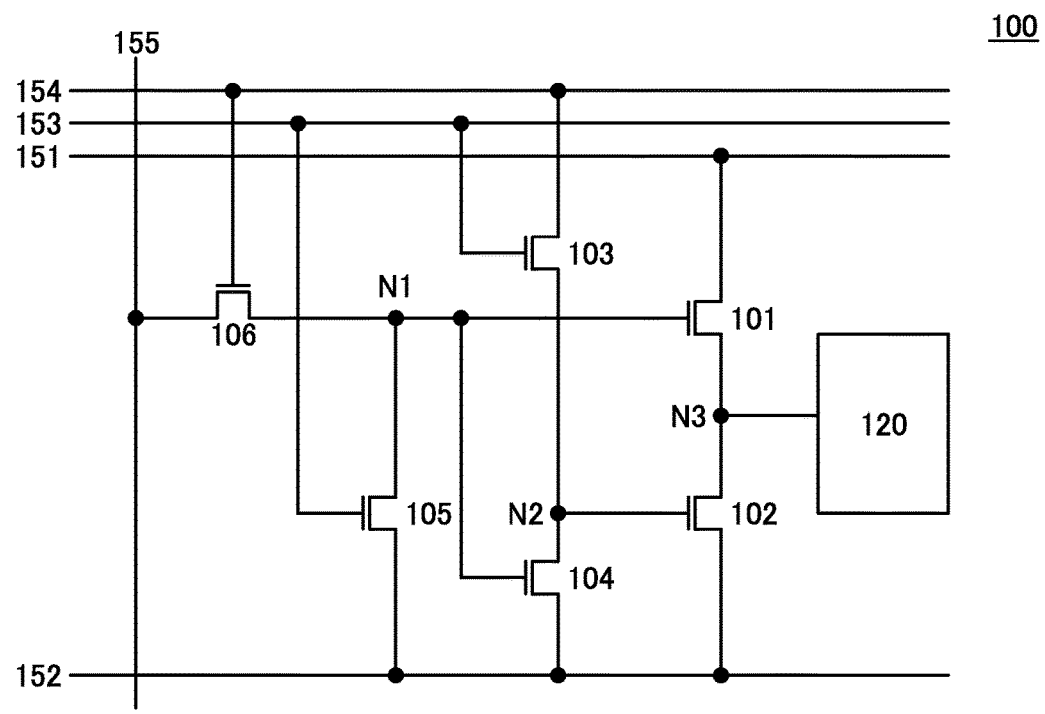

FIG. 14B is different from FIG. 1 in that the first terminal of the transistor 103 is connected to the wiring 154. The timing charts in FIGS. 13A and 13B are preferably used for the pixel 100 illustrated in FIG. 14B. In the pixel 100 of FIG. 14B, the potential levels of the first terminal and the second terminal of the transistor 103 can be opposite to each other, whereby a change in characteristics of the transistor 103 can be suppressed.

Figure 15A:
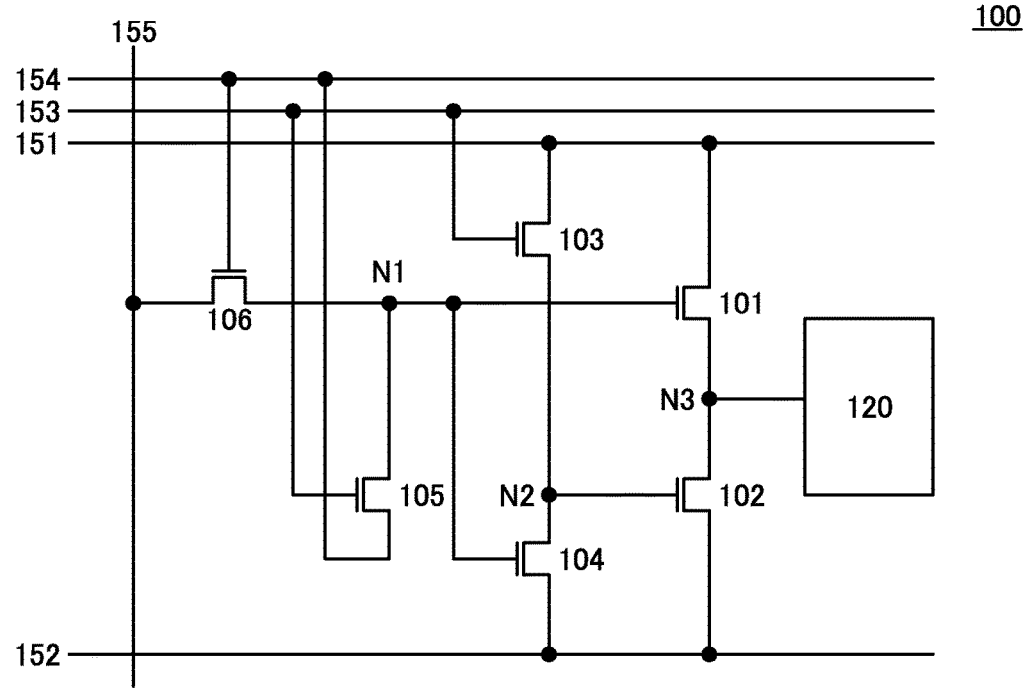
FIGS. 15A and 15B each illustrate an example of a pixel.

FIG. 15A is different from FIG. 1 in that the first terminal of the transistor 105 is connected to the wiring 154. In the pixel 100 of FIG. 15A, the potential levels of the first terminal and the second terminal of the transistor 105 can be opposite to each other, so that a change in characteristics of the transistor 105 can be suppressed.

Figure 15B:
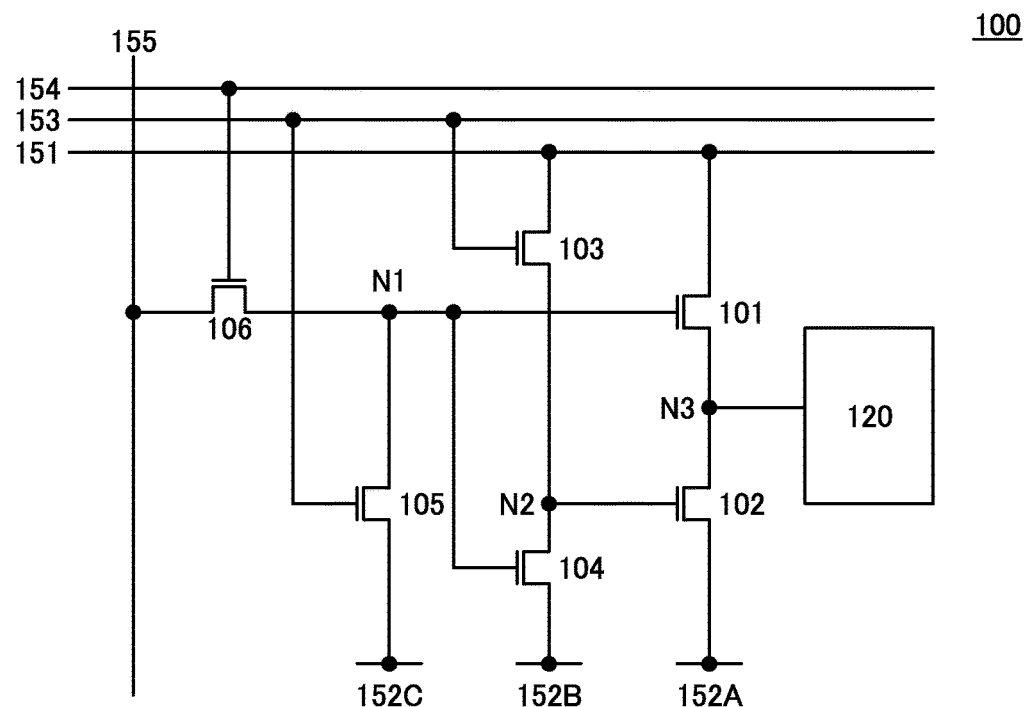

FIG. 15B is different from FIG. 1 in that the wiring 152 is divided into three wirings 152A, 152B, and 152C. The second terminal of the transistor 102 is connected to the wiring 152A. The second terminal of the transistor 104 is connected to the wiring 152B. The second terminal of the transistor 105 is connected to the wiring 152C. To the wirings 152A to 152C, the same voltage (e.g., the voltage VL) may be input, the same signal may be input, different voltages may be input, or different signals may be input. For example, when a voltage to be input to the wiring 152B is set lower than a voltage to be input to the wiring 152A, the gate-source voltage of the transistor 102 can be negative. Thus, the pixel can operate even if the transistor 102 is normally on.

Figure 16A:
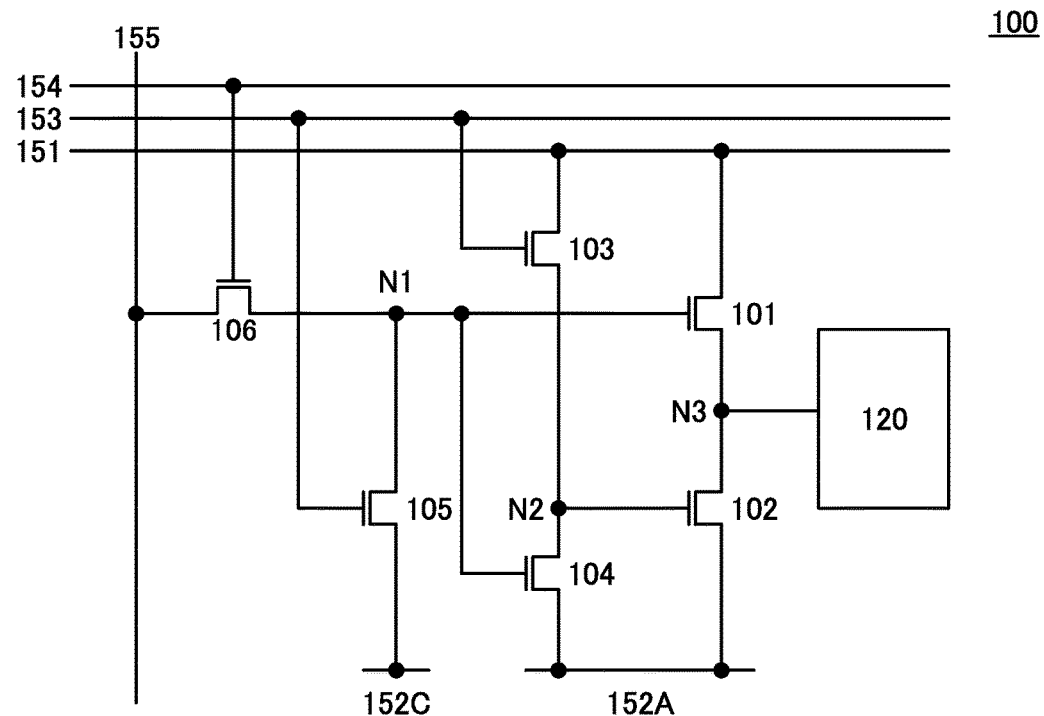
FIGS. 16A and 16B each illustrate an example of a pixel.

Any two of the wirings 152A to 152C may be one wiring. For example, the wiring 152A and the wiring 152B may be one wiring as illustrated in FIG. 16A. Alternatively, the wiring 152A and the wiring 152C or the wiring 152B and the wiring 152C may be one wiring.

Figure 16B:
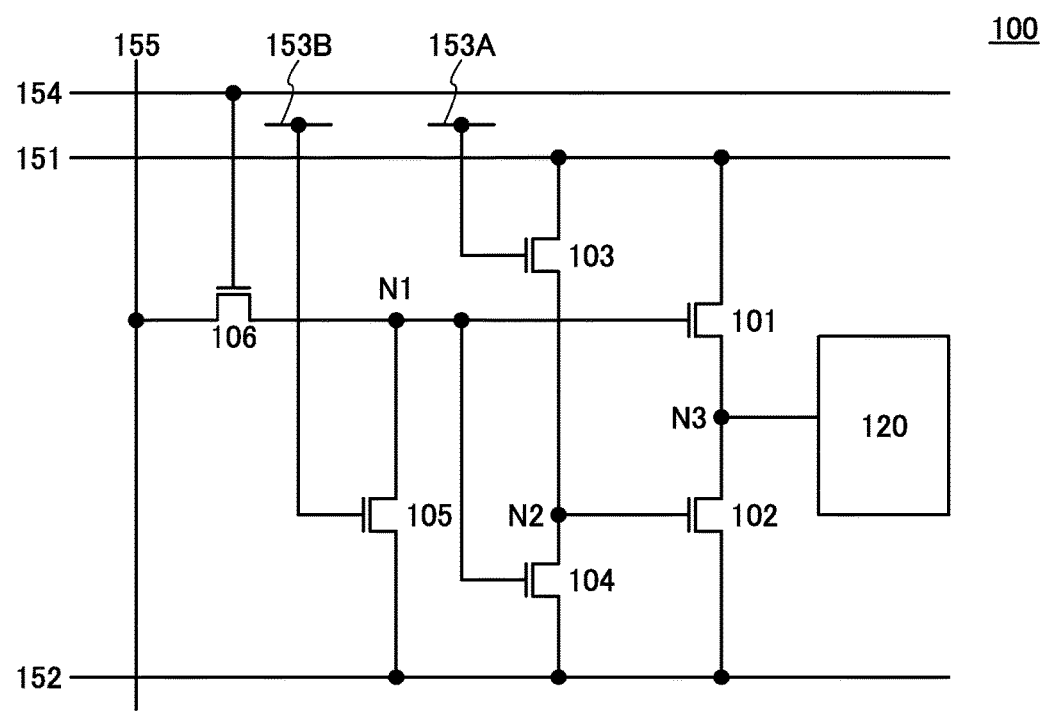

FIG. 16B is different from FIG. 1 in that the wiring 153 is divided into two wirings 153A and 153B. To the wirings 153A and 153B, the same voltage may be input, the same signal (e.g., the signal G2) may be input, different voltages may be input, or different signals may be input.

Figure 17A:
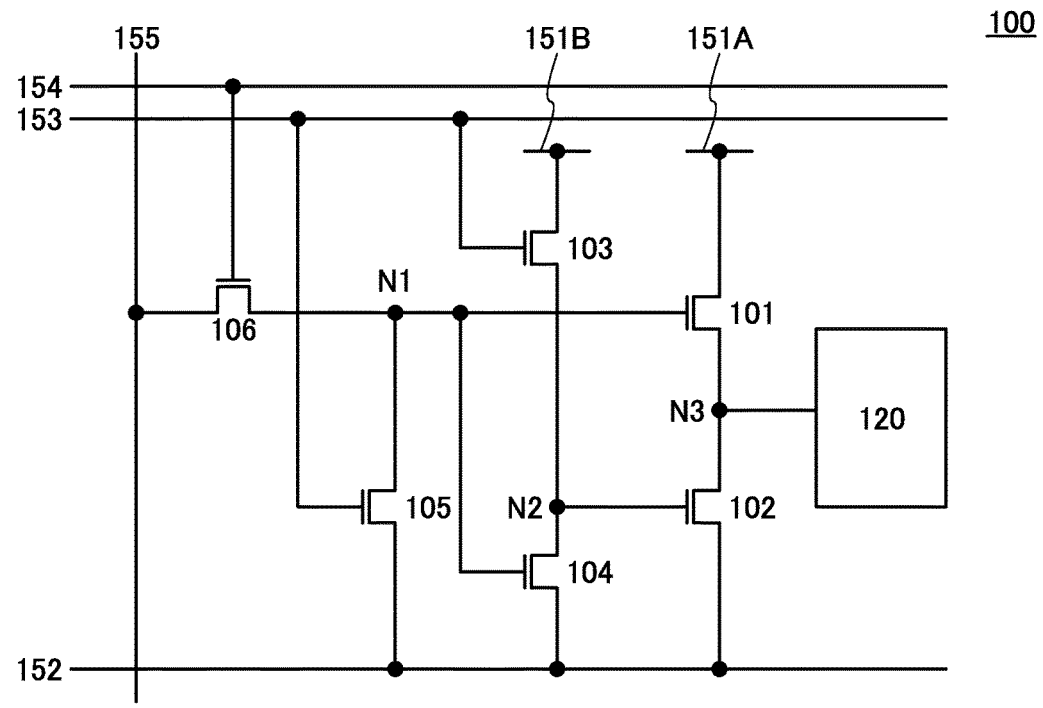
FIGS. 17A and 17B each illustrate an example of a pixel.

FIG. 17A is different from FIG. 1 in that the wiring 151 is divided into two wirings 151A and 151B. To the wirings 151A and 151B, the same voltage (e.g., the voltage VH) may be input, the same signal may be input, different voltages may be input, or different signals may be input.

Figure 17B:
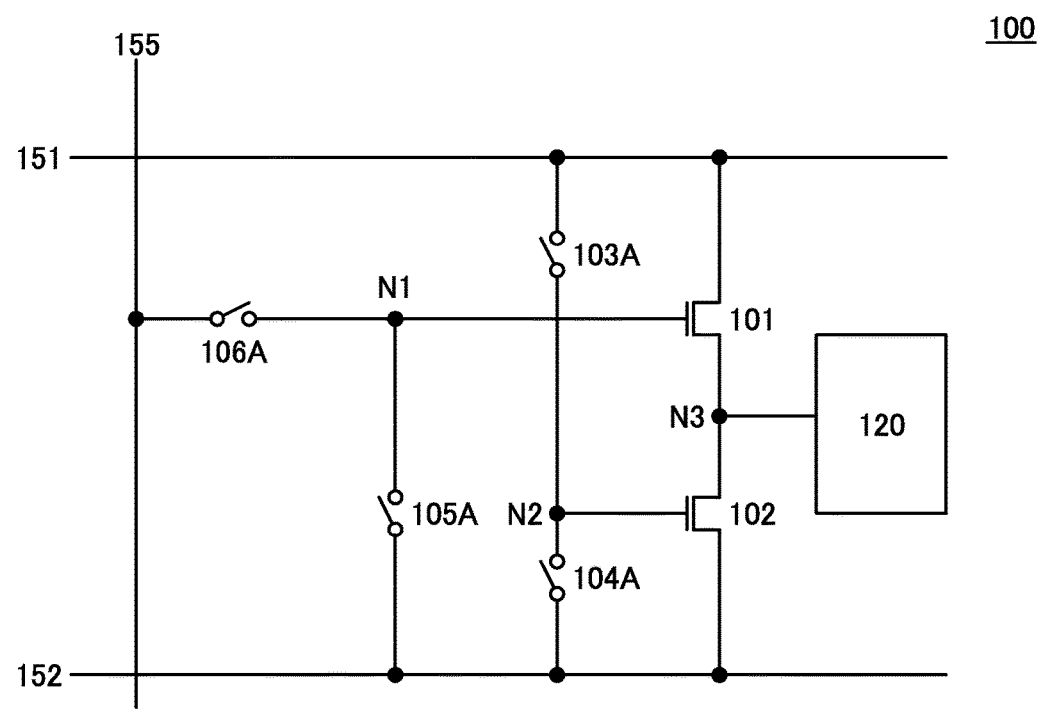

FIG. 17B is different from FIG. 1 in that the transistor 103, the transistor 104, the transistor 105, and the transistor 106 are replaced with a switch 103A, a switch 104A, a switch 105A, and a switch 106A. The switch 103A, the switch 104A, the switch 105A, and the switch 106A correspond to the transistor 103, the transistor 104, the transistor 105, and the transistor 106, respectively, and have functions similar to those of the respective transistors.

Note that any one, two, or three of the transistors 103 to 106 may be replaced with a switch.

Figure 18A:
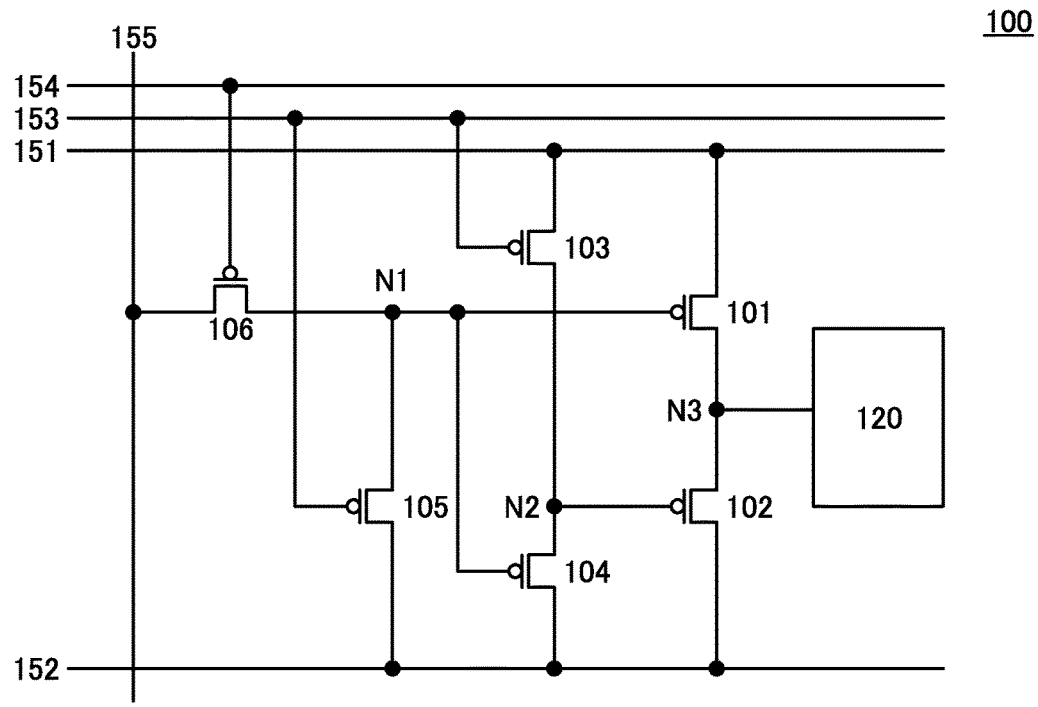
FIGS. 18A and 18B illustrate an example of a pixel.
Figure 18B:
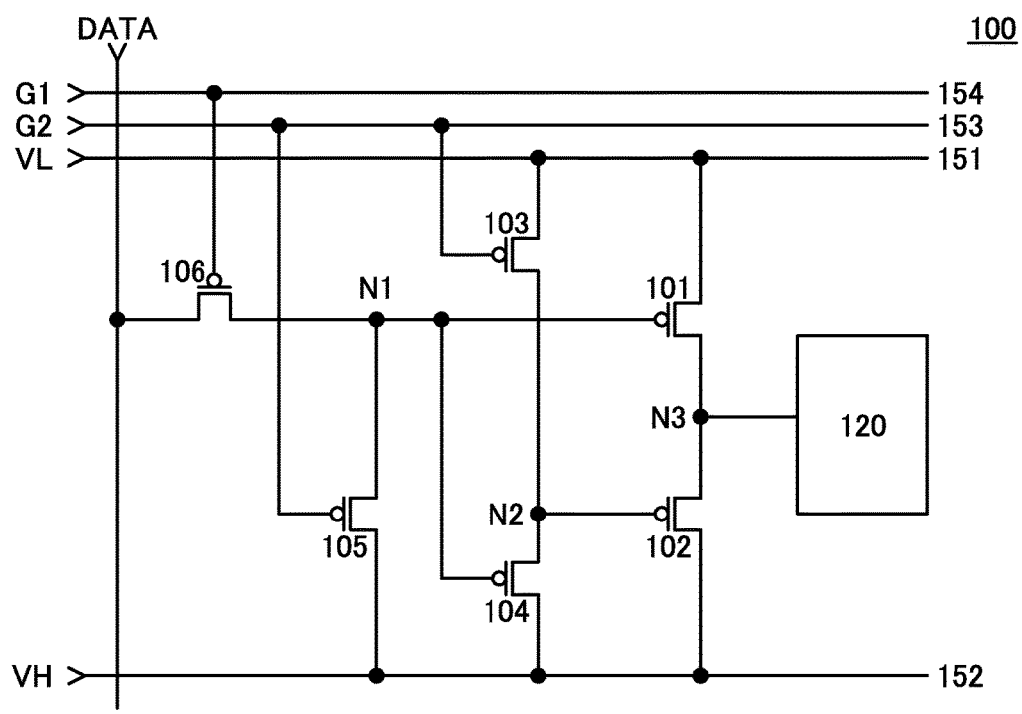
Figure 19A:
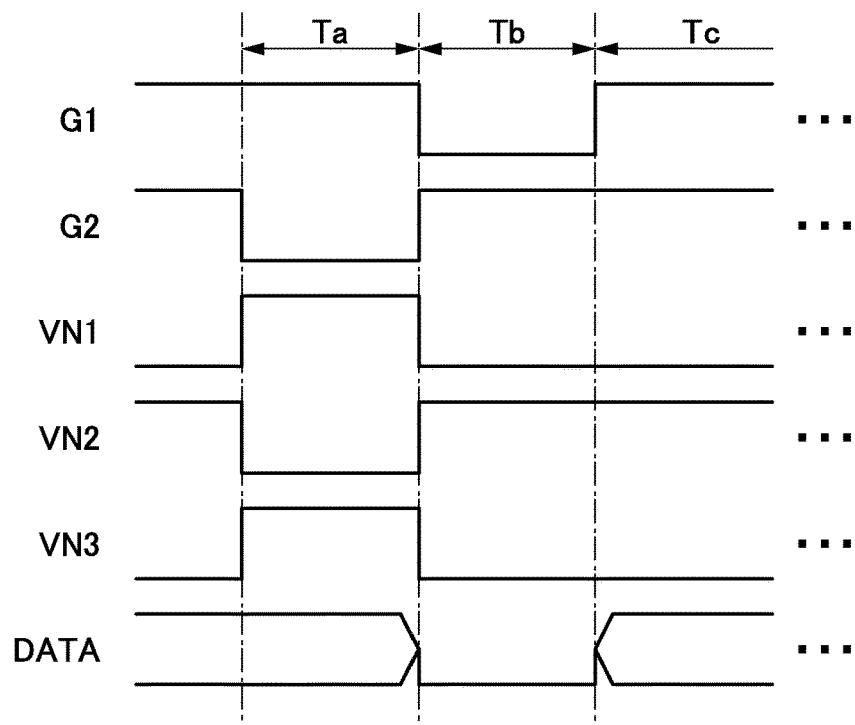
FIGS. 19A and 19B are diagrams each illustrating an example of a pixel.
Figure 19B:
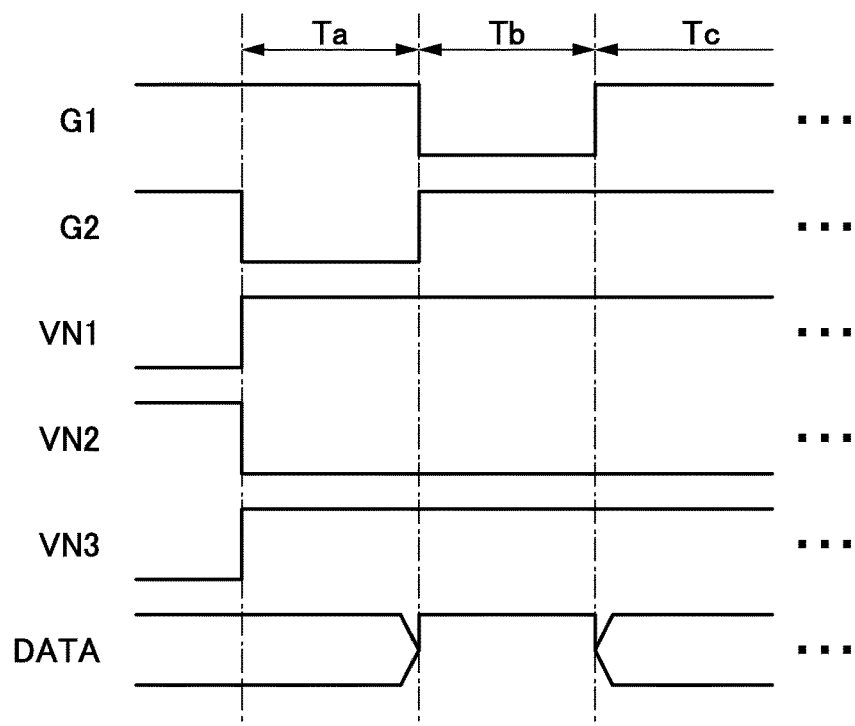

FIG. 18A is different from FIG. 1 in that the transistors 101 to 106 are p-channel transistors. Timing charts in FIGS. 19A and 19B can be used for the pixel 100 illustrated in FIG. 18A. FIGS. 19A and 19B are different from FIGS. 2A and 2B in that the levels of the signals and the potentials are inverted. In the pixel 100 of FIG. 18A, the voltage VL is input to the wiring 151 and the voltage VH is input to the wiring 152 as illustrated in FIG. 18B.

Figure 20A:
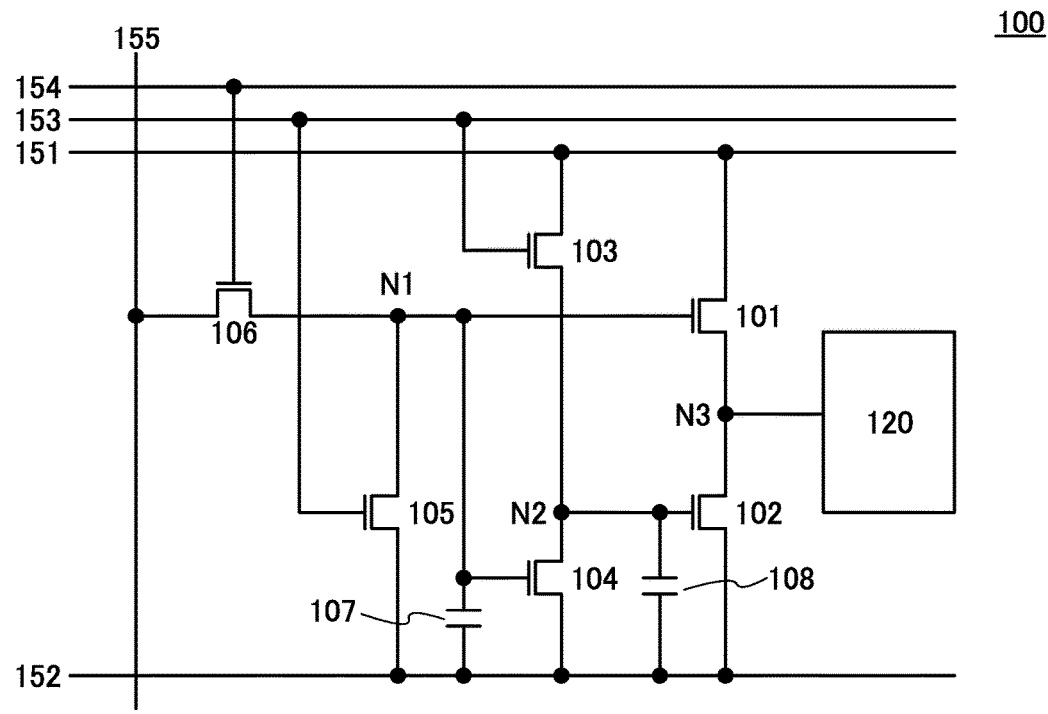
FIGS. 20A and 20B each illustrate an example of a pixel.

FIG. 20A is different from FIG. 1 in that a capacitor 107 and a capacitor 108 are provided. A first terminal and a second terminal of the capacitor 107 are connected to the wiring 152 and the node N1, respectively. A first terminal and a second terminal of the capacitor 108 are connected to the wiring 152 and the node N2, respectively. Thus, a change in potential of the node N1 and the node N2 can be suppressed, leading to fewer malfunctions. Furthermore, the refresh rate can be decreased, and thus power consumption can be reduced.

Note that the first terminal of the capacitor 107 may be connected to the wiring 151 or the node N3. When the first terminal of the capacitor 107 is connected to the node N3, the potential of the potential VN1 can be increased with bootstrap operation. Thus, the gate-source voltage of the transistor 101 can be increased, and the W/L ratio of the transistor 101 can be decreased. In addition, the first terminal of the capacitor 108 may be connected to the wiring 151 or the node N3.

Note that one of the capacitor 107 and the capacitor 108 may be omitted.

Figure 20B:
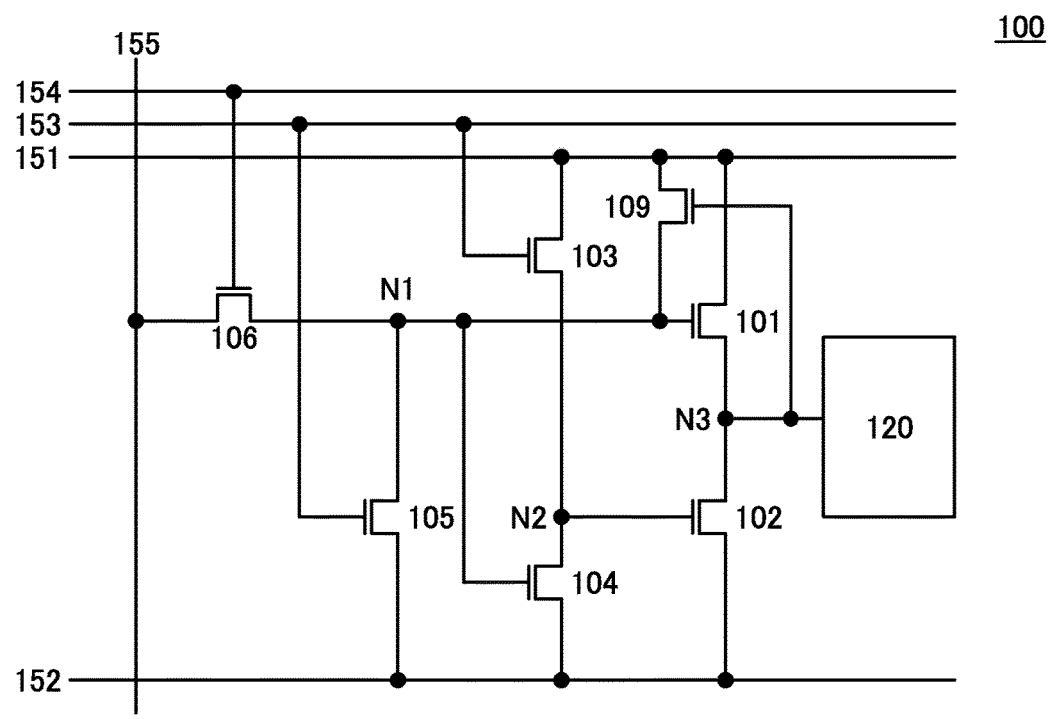

FIG. 20B is different from FIG. 1 in that a transistor 109 is provided. A first terminal, a second terminal, and a gate of the transistor 109 are connected to the wiring 151, the node N1, and the node N3, respectively. In the pixel 100 illustrated in FIG. 20B, in the period Tc, the transistor 109 is turned on when the potential VN3 is high. Accordingly, the voltage VH is supplied to the node N1 from the wiring 151 through the transistor 109, thereby preventing the node N1 from being floating and the potential VN1 from changing.

Note that the transistor 109 preferably has the same polarity as the transistor 101. The transistor 109 may be replaced with a switch having a first terminal connected to the wiring 151 and a second terminal connected to the node N1.

Note that the W/L ratio of the transistor 109 is preferably lower than that of each of the transistors 101 and 102.

Figure 21A:
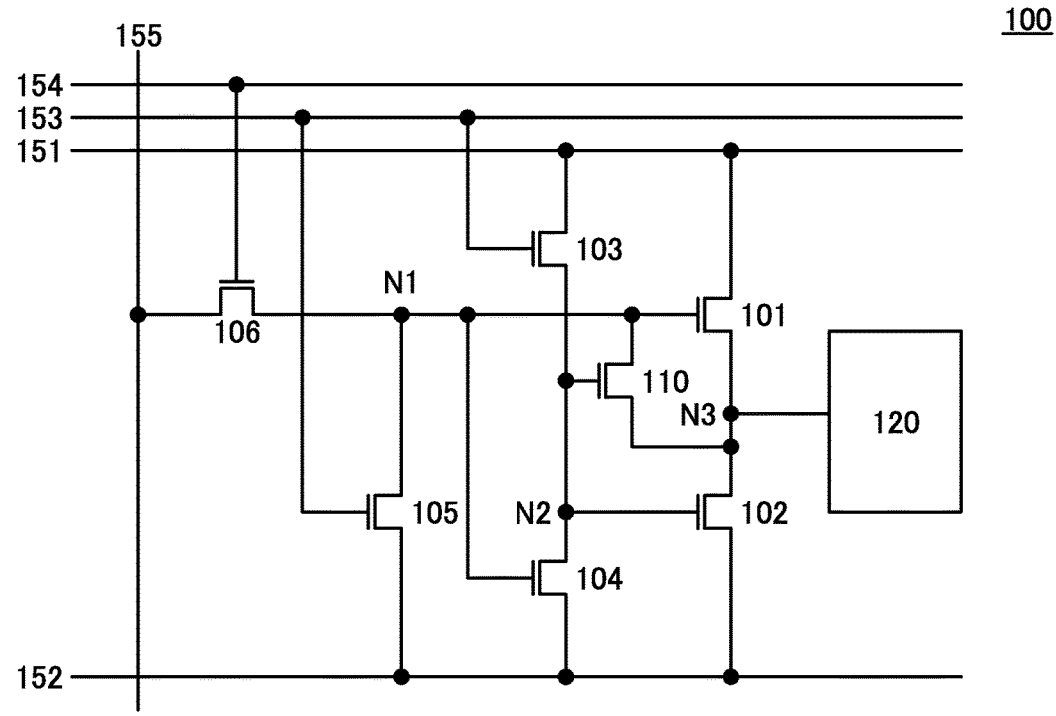
FIGS. 21A and 21B each illustrate an example of a pixel.

FIG. 21A is different from FIG. 1 in that a transistor 110 is provided. A first terminal, a second terminal, and a gate of the transistor 110 are connected to the node N3, the node N1, and the node N2, respectively. In the pixel 100 illustrated in FIG. 21A, in the period Tc, the transistor 110 is turned on when the potential VN2 is high (see FIG. 5B). Accordingly, the voltage VL is supplied to the node N1 from the wiring 152 through the transistor 102 and transistor 110, thereby preventing the node N1 from being floating and the potential VN1 from changing.

Note that the transistor 110 preferably has the same polarity as the transistor 101. The transistor 110 may be replaced with a switch having a first terminal connected to the node N3 and a second terminal connected to the node N1. Moreover, the first terminal of the transistor 110 may be connected to the wiring 152. When the pixel 100 includes the transistor 110, the transistor 105 may be omitted.

Note that the W/L ratio of the transistor 110 is preferably lower than that of each of the transistors 101 and 102.

Figure 21B:
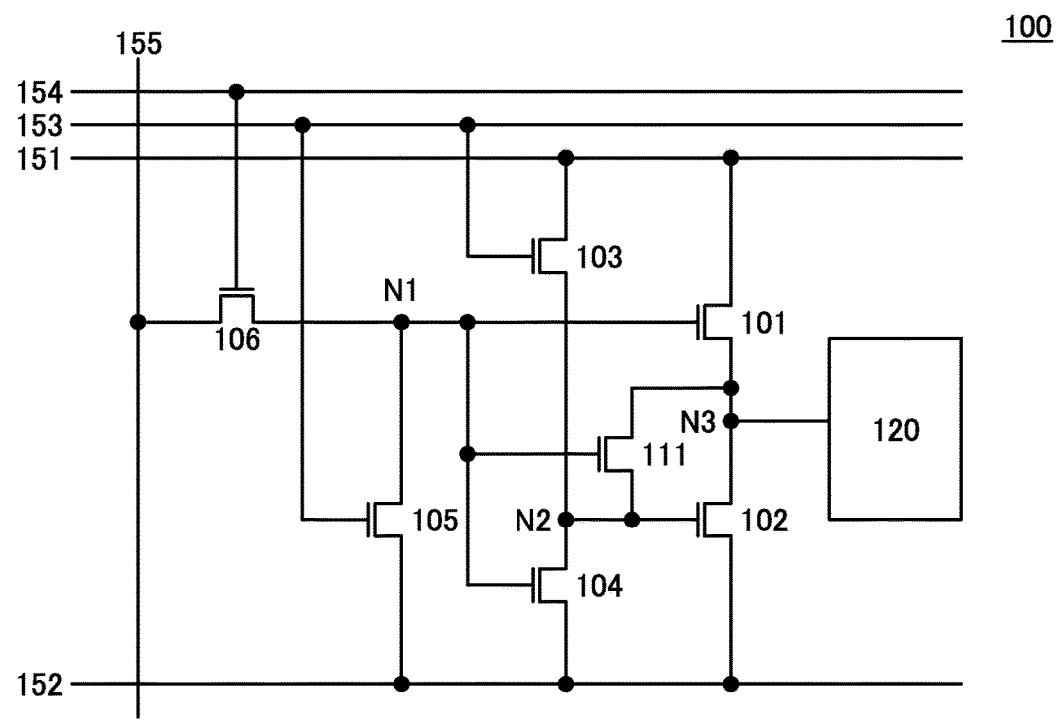

FIG. 21B is different from FIG. 1 in that a transistor 111 is provided. A first terminal, a second terminal, and a gate of the transistor 111 are connected to the node N3, the node N2, and the node N1, respectively. In the pixel 100 illustrated in FIG. 21B, in the period Tc, the transistor 111 is turned on when the potential VN1 is high (see FIG. 5A). Accordingly, the voltage VL is supplied to the node N2 from the wiring 151 through the transistor 101 and the transistor 111, thereby preventing the potential VN2 from changing.

Note that the transistor 111 preferably has the same polarity as the transistor 101. The transistor 111 may be replaced with a switch having a first terminal connected to the node N3 and a second terminal connected to the node N2. When the pixel 100 includes the transistor 111, the transistor 104 may be omitted.

Note that the W/L ratio of the transistor 111 is preferably lower than that of the transistor 101 and the transistor 102.

Figure 22A:
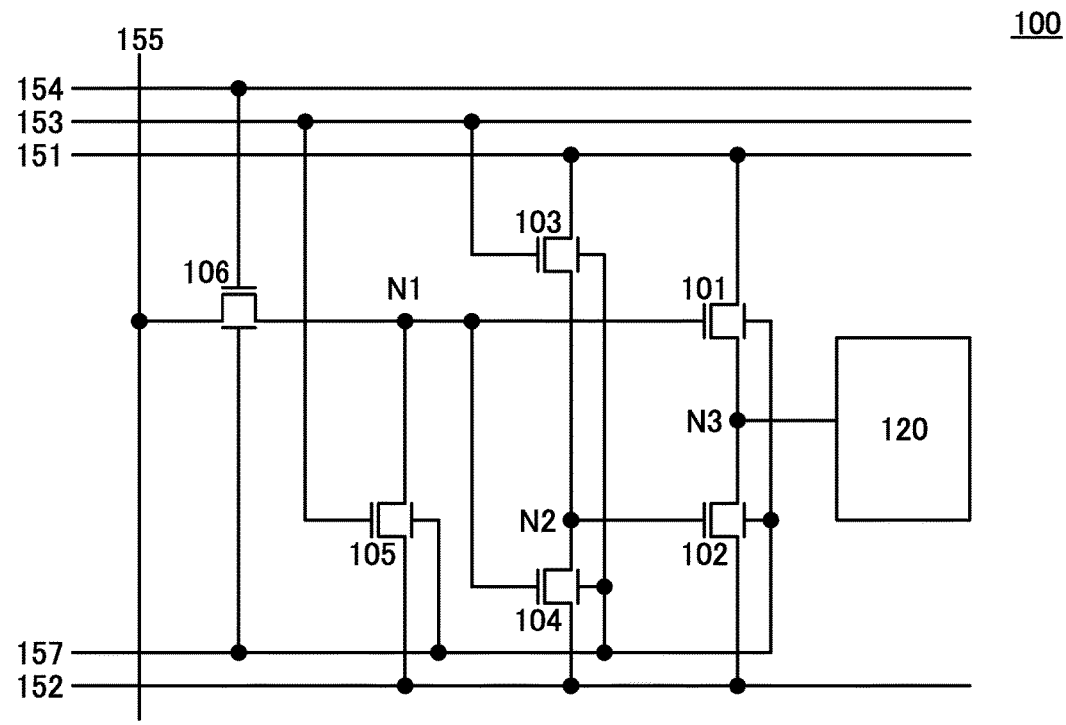
FIGS. 22A and 22B each illustrate an example of a pixel.

FIG. 22A is different from FIG. 1 in that the transistors 101 to 106 each have a backgate (also referred to as second gate). That is, each of the transistors 101 to 106 includes a first gate electrode, a second gate electrode, and a semiconductor layer placed between the first and second gate electrodes. The backgates of the transistors 101 to 106 are connected to a wiring 157. The threshold voltages of the transistors 101 to 106 can be controlled by controlling the potential of the wiring 157. For example, when the potential of the wiring 157 is set lower than the voltage VL, the threshold voltages of the transistors 101 to 106 can be shifted in the negative direction. Thus, the transistors 101 to 106 can be normally-on transistors. Note that any one, two, three, four, or five of the transistors 101 to 106 may have a backgate.

The backgates of the transistors 101 to 106 may be connected to the wiring 152.

Figure 22B:
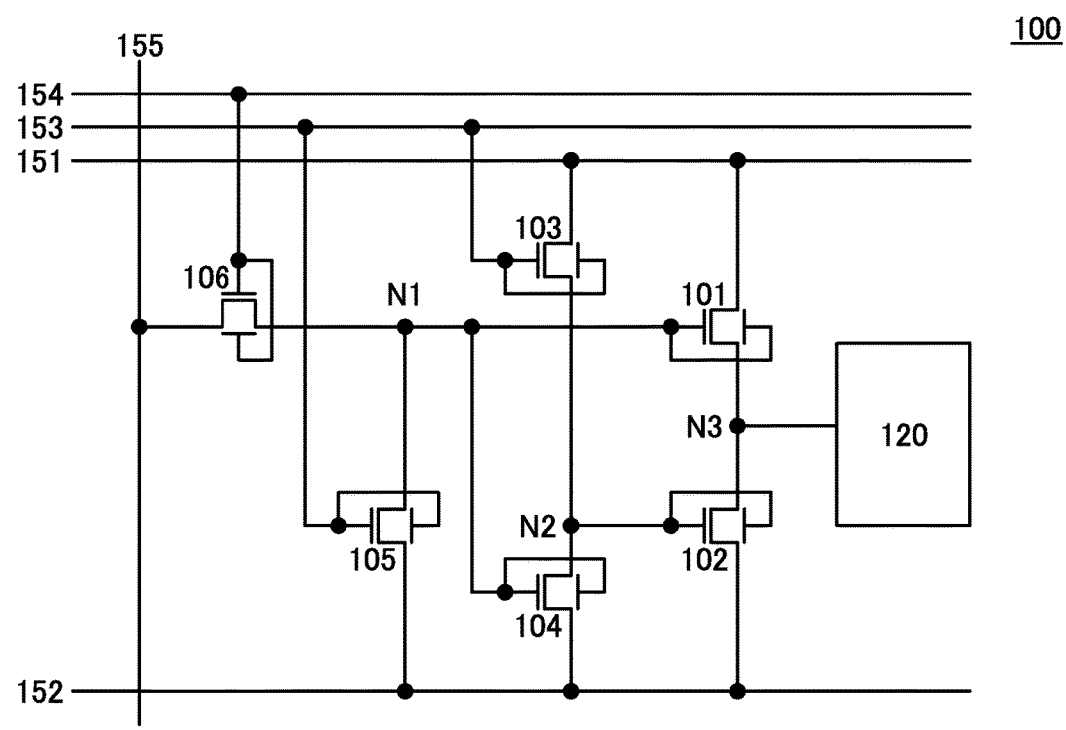

The two gates may be connected to each other in each of the transistors 101 to 106 (see FIG. 22B).

Figure 23A:
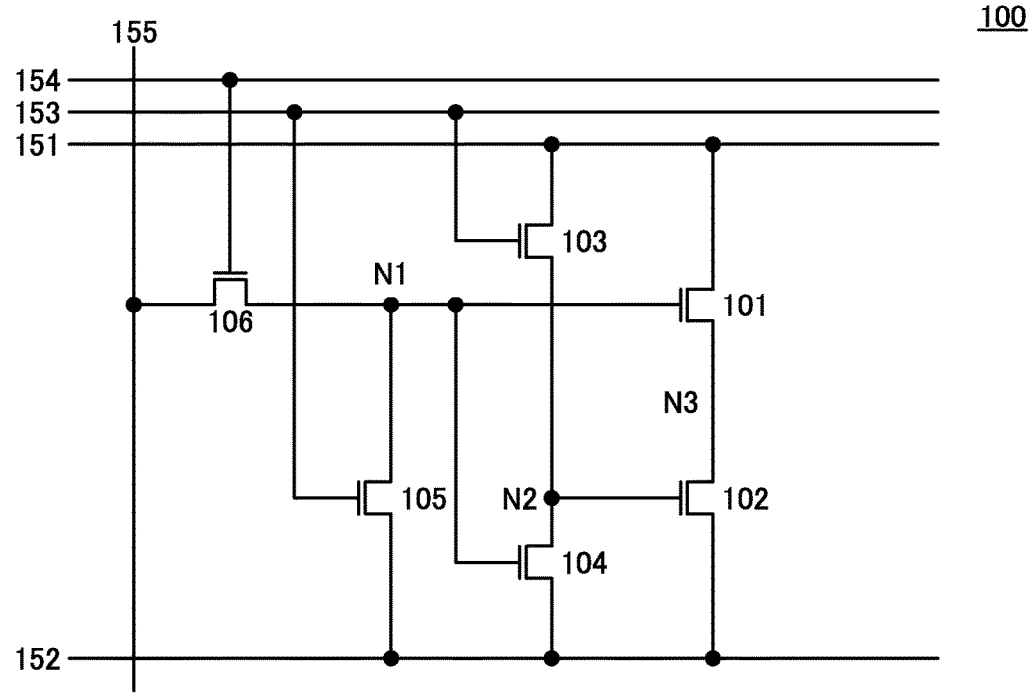
FIGS. 23A and 23B each illustrate an example of a pixel.
Figure 23B:
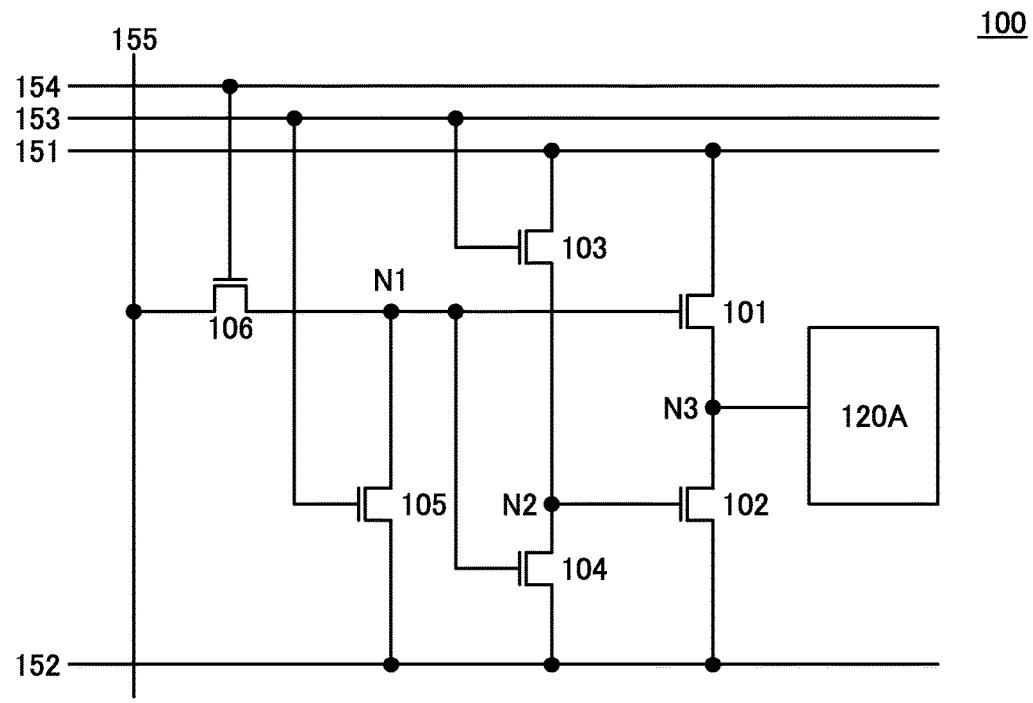

FIG. 23A is different from FIG. 1 in that the display element 120 is not provided. FIG. 23B is different from FIG. 1 in that a load 120A is provided instead of the display element 120. In other words, the pixel 100 can be used for a variety of circuits other than a pixel and various kinds of device such as a semiconductor device.

At least two of the modification examples of the pixel 100 in FIG. 1 can be used in combination.

Figure 24A:
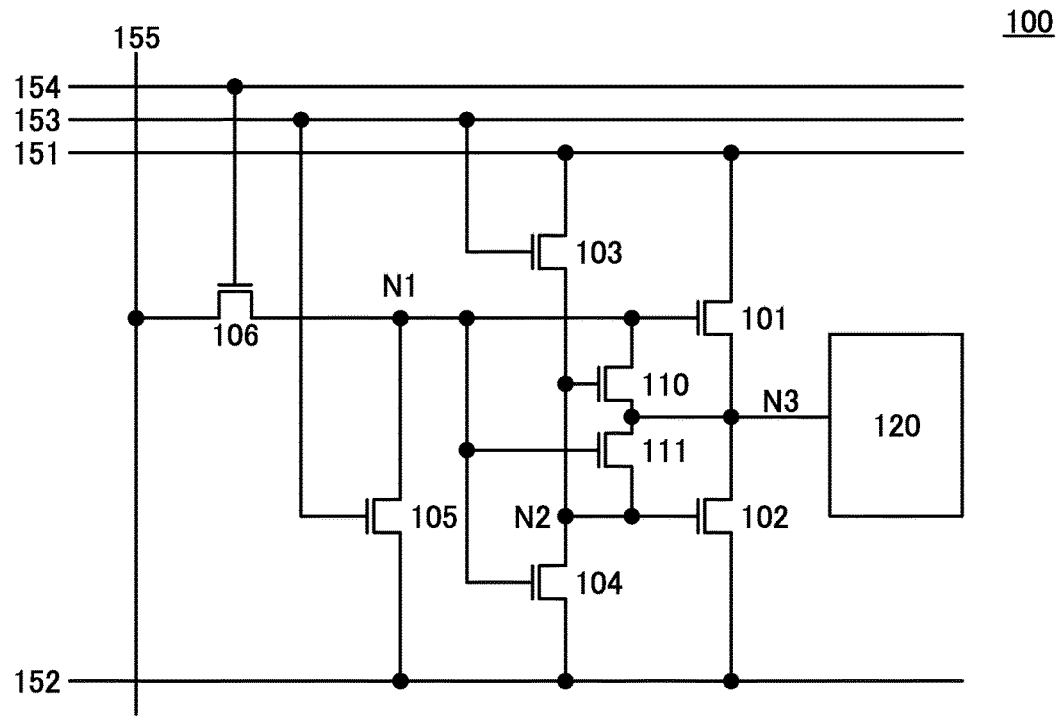
FIGS. 24A and 24B each illustrate an example of a pixel.

FIG. 24A illustrates a configuration in which FIGS. 21A and 21B are combined.

Figure 24B:
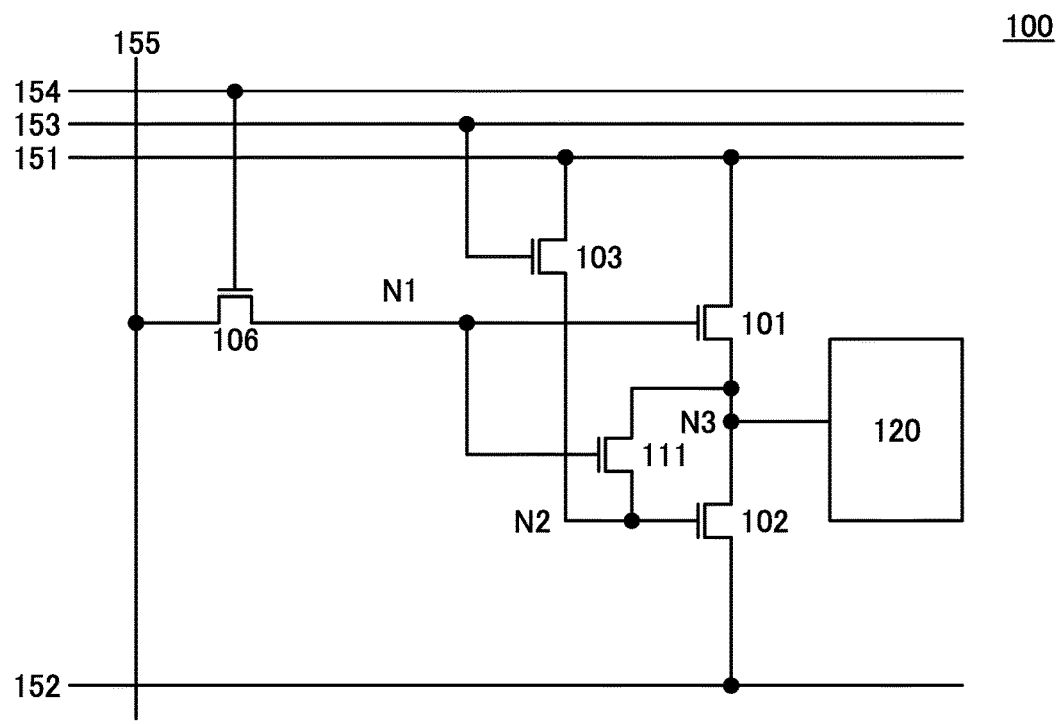

FIG. 24B illustrates a configuration in which FIG. 12 and FIG. 21B are combined and the transistor 104 is omitted.

Figure 25A:
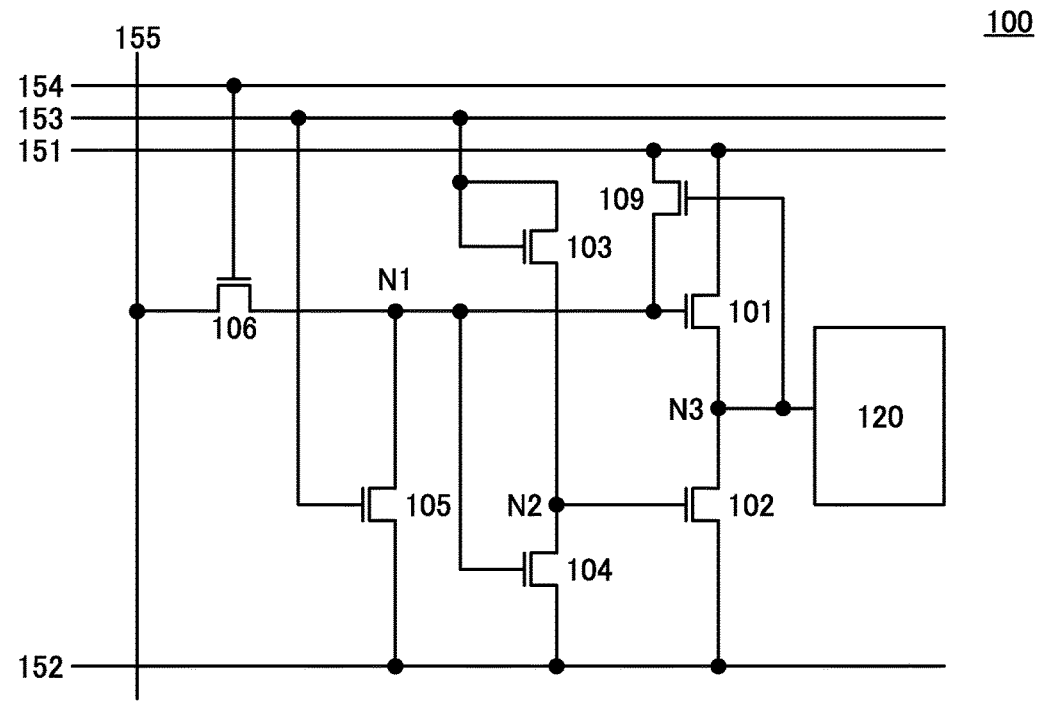
FIGS. 25A and 25B each illustrate an example of a pixel.

FIG. 25A illustrates a configuration in which FIG. 14A and FIG. 20B are combined.

Figure 25B:
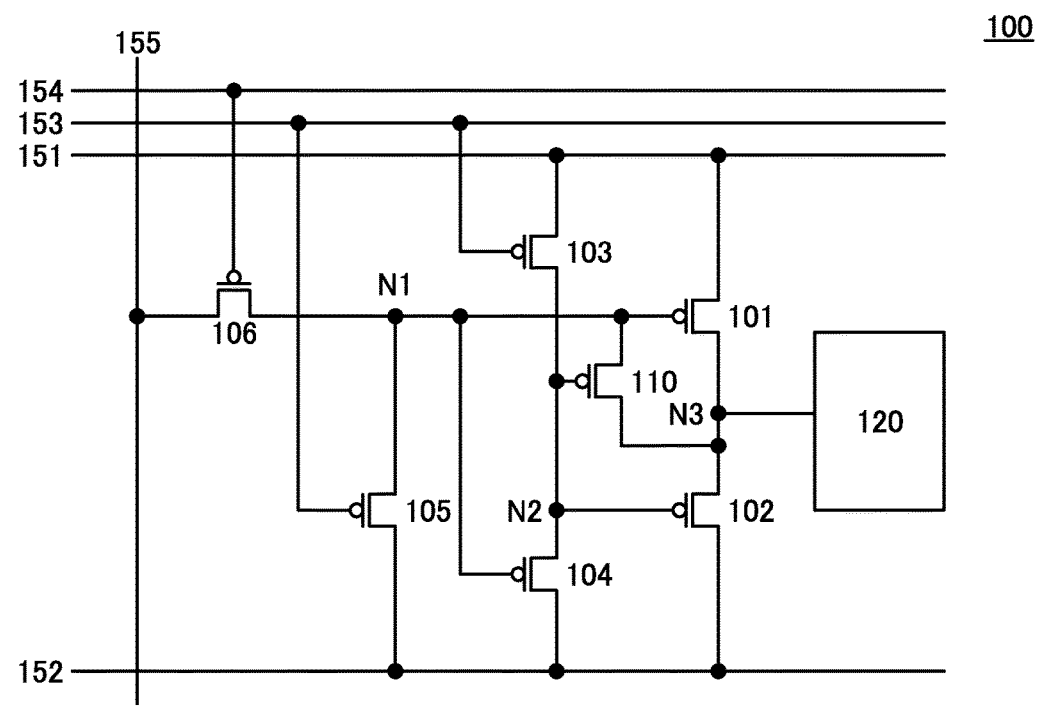

FIG. 25B illustrates a configuration in which FIG. 18A and FIG. 21A are combined.

Figure 26A:
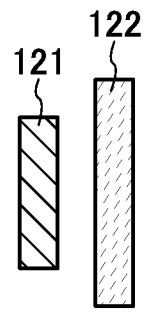
FIGS. 26A to 26C each illustrate an example of a pixel.

FIG. 26A illustrates an example of the display element 120. The display element 120 in FIG. 26A includes a component 121 and a component 122. The component 121 and the component 122 are formed to be movable. Specifically, the component 121 and the component 122 move closer to each other when there is a potential difference between the component 121 and the component 122. Note that the component 121 may be fixed so as not to move.

Figure 26B:
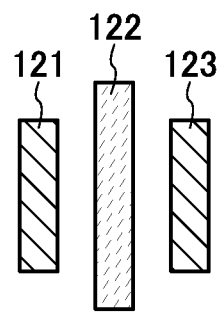

FIG. 26B illustrates another example of the display element 120. The display element 120 in FIG. 26B includes the component 121, the component 122, and a component 123. The components 121 to 123 are formed to be movable. Specifically, the component 121 and the component 122 move closer to each other when there is a potential difference between the component 121 and the component 122. The component 122 and the component 123 move closer to each other when there is a potential difference between the component 122 and the component 123. Note that the component 121 and the component 123 may be fixed so as not to move.

The components 121 to 123 preferably contain at least a conductive material.

The component 121 has a region facing the component 122, and the region preferably has a surface containing an insulating material. The component 122 has a region facing the component 121, and the region preferably has a surface containing an insulating material. Such a structure can prevent electrical continuity between the component 121 and the component 122 when the components 121 and 122 move closer to each other. Similarly, the component 122 has a region facing the component 123, and the region preferably has a surface containing an insulating material. The component 123 has a region facing the component 122, and the region preferably has a surface containing an insulating material. Such a structure can prevent electrical continuity between the component 122 and the component 123 when the components 122 and 123 move closer to each other.

The component 122 preferably has a surface capable of reflecting light. How light is reflected can be changed by moving the component 122; thus, the gray level can be controlled. Examples of the light are light from a light source such as a backlight or a front light and external light.

Figure 26C:
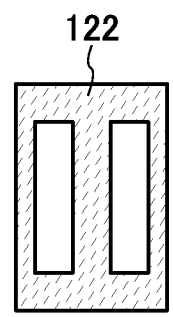

The component 122 preferably has openings as illustrated in FIG. 26C. The amount of light passing through the openings can be changed by moving the component 122; thus, the gray level can be controlled. Examples of the light are light from a light source such as a backlight or a front light and external light.

Figure 27A:
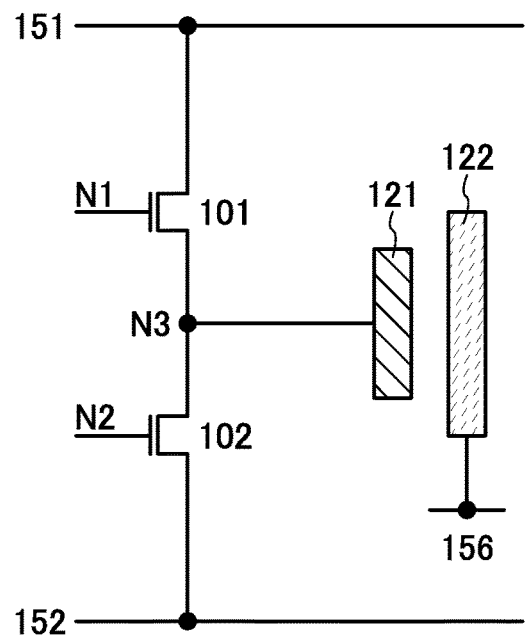
FIGS. 27A and 27B each illustrate an example of a pixel.

FIG. 27A illustrates part of the pixel 100 in which the display element 120 has the structure shown in FIG. 26A. The component 121 is connected to the node N3, and the component 122 is connected to a wiring 156.

A predetermined voltage is input to the wiring 156. That is, the wiring 156 has a function of a power supply line. To the wiring 156, any of the following voltages may be supplied: the voltage VL, the voltage VH, and a voltage different from the voltage VL and the voltage VH. When the voltage VL is supplied to the wiring 156, the wiring 156 and the wiring 152 may be integrated into one wiring; i.e., the component 122 may be connected to the wiring 152. Alternatively, when the voltage VH is supplied to the wiring 156, the wiring 156 and the wiring 151 may be integrated into one wiring; i.e., the component 122 may be connected to the wiring 151.

The component 122 in each of the pixels 100(1, 1) to 100(n, m) is preferably connected to the same wiring.

In the case where the voltage VL is supplied to the wiring 156, when the potential VN3 is high, a potential difference is generated between the component 121 and the component 122, whereby the component 121 and the component 122 move closer to each other. In contrast, when the potential VN3 is low, a potential difference between the component 121 and the component 122 is zero or small, and thus, the component 121 and the component 122 do not get closer together.

Figure 27B:
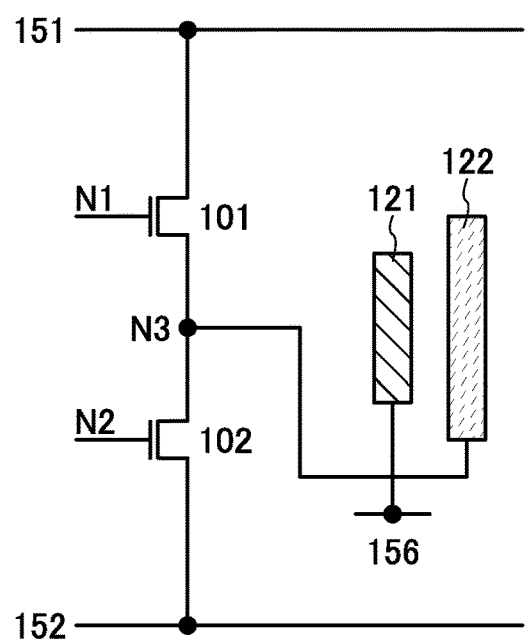

FIG. 27B is different from FIG. 27A in that the component 121 is connected to the wiring 156 and the component 122 is connected to the node N3.

Figure 28A:
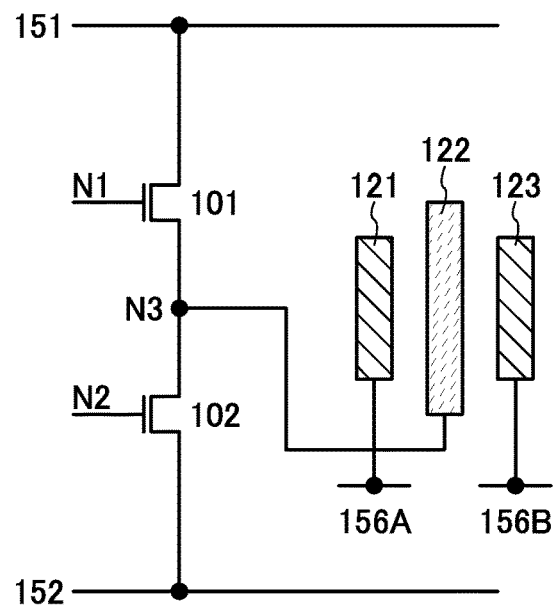
FIGS. 28A and 28B each illustrate an example of a pixel.

FIG. 28A illustrates part of the pixel 100 in which the display element 120 has the structure shown in FIG. 26B. The component 121 is connected to a wiring 156A, the component 122 is connected to the node N3, and the component 123 is connected to a wiring 156B.

A predetermined voltage is input to the wirings 156A and 156B. That is, the wirings 156A and 156B have a function of a power supply line. A voltage input to the wiring 156A is preferably different from a voltage input to the wiring 156B. For example, the voltage VL may be input to the wiring 156A and the voltage VH may be input to the wiring 156B, or the voltage VH may be input to the wiring 156A and the voltage VL may be input to the wiring 156B. When the voltage VL is supplied to the wiring 156A and the voltage VH is input to the wiring 156B, the wiring 156A and the wiring 152 may be integrated into one wiring and the wiring 156B and the wiring 151 may be integrated into one wiring. That is, the component 121 may be connected to the wiring 152 and the component 123 may be connected to the wiring 151. Alternatively, when the voltage VH is supplied to the wiring 156A and the voltage VL is input to the wiring 156B, the wiring 156A and the wiring 151 may be integrated into one wiring and the wiring 156B and the wiring 152 may be integrated into one wiring. That is, the component 121 may be connected to the wiring 151 and the component 123 may be connected to the wiring 152.

It is preferred that in each of the pixels 100(1, 1) to 100(n, m), the component 121 be connected to the same wiring and the component 123 be connected to the same wiring.

In the case where the voltage VL is supplied to the wiring 156A and the voltage VH is input to the wiring 156B, when the potential VN3 is high, a potential difference is generated between the component 121 and the component 122 but not between the component 122 and the component 123. Thus, the component 122 moves toward the component 121. In contrast, when the potential VN3 is low, a potential difference is generated between the component 122 and the component 123 but not between the component 121 and the component 122. Consequently, the component 122 moves toward the component 123.

Figure 28B:
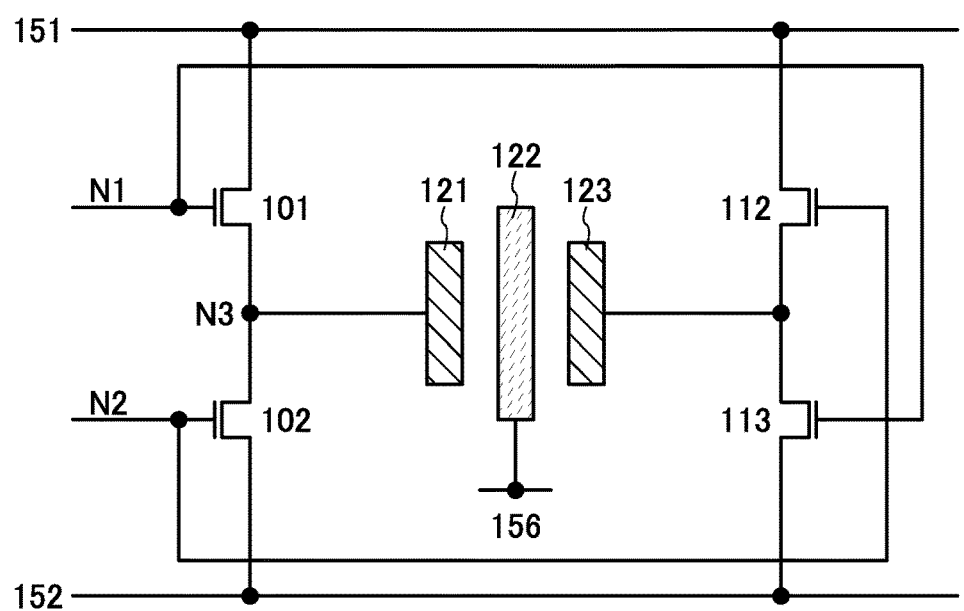

FIG. 28B illustrates part of the pixel 100 in which the display element 120 has the structure shown in FIG. 26B. The component 121 is connected to the node N3, and the component 122 is connected to the wiring 156. A transistor 112 and a transistor 113 are provided in the pixel 100 to control the potential of the component 123. A first terminal, a second terminal, and a gate of the transistor 112 are connected to the wiring 151, the component 123, and the node N2, respectively. A first terminal, a second terminal, and a gate of the transistor 113 are connected to the wiring 152, the component 123, and the node N1, respectively. The transistor 112 and the transistor 113 preferably have the same polarity as the transistor 101.

In the case where the voltage VL is supplied to the wiring 156, when the potential VN1 is high and the potential VN2 is low, the transistor 101 and the transistor 113 are turned on and the transistor 102 and the transistor 112 are turned off. The voltage VH is supplied to the component 121 from the wiring 151 through the transistor 101, and the voltage VL is supplied to the component 123 from the wiring 152 through the transistor 113. Thus, a potential difference is generated between the component 121 and the component 122 but not between the component 122 and the component 123; therefore, the component 122 moves toward the component 121. In contrast, when the potential VN1 is low and the potential VN2 is high, the transistor 101 and the transistor 113 are turned off and the transistor 102 and the transistor 112 are turned on.

The voltage VL is supplied to the component 121 from the wiring 152 through the transistor 102, and the voltage VH is supplied to the component 123 from the wiring 151 through the transistor 112. Thus, a potential difference is generated between the component 122 and the component 123 but not between the component 121 and the component 122, so that the component 122 moves toward the component 123.

This embodiment can be combined with any other embodiment as appropriate. Note that a content (or part thereof) described in one embodiment may be applied to, combined with, or replaced with a different content (or part thereof) described in the embodiment and/or a content (or part thereof) described in one or more different embodiments. Note that in each embodiment, a content described in the embodiment is a content described with reference to a variety of diagrams or a content described with text in this specification. In addition, by combining a diagram (or part thereof) described in one embodiment with another part of the diagram, a different diagram (or part thereof) described in the embodiment, and/or a diagram (or part thereof) described in another embodiment or other embodiments, much more diagrams can be created. The same can be applied to any other embodiment.

Embodiment 2

In this embodiment, the structure of the pixel described in Embodiment 1 will be explained.

Figure 29:
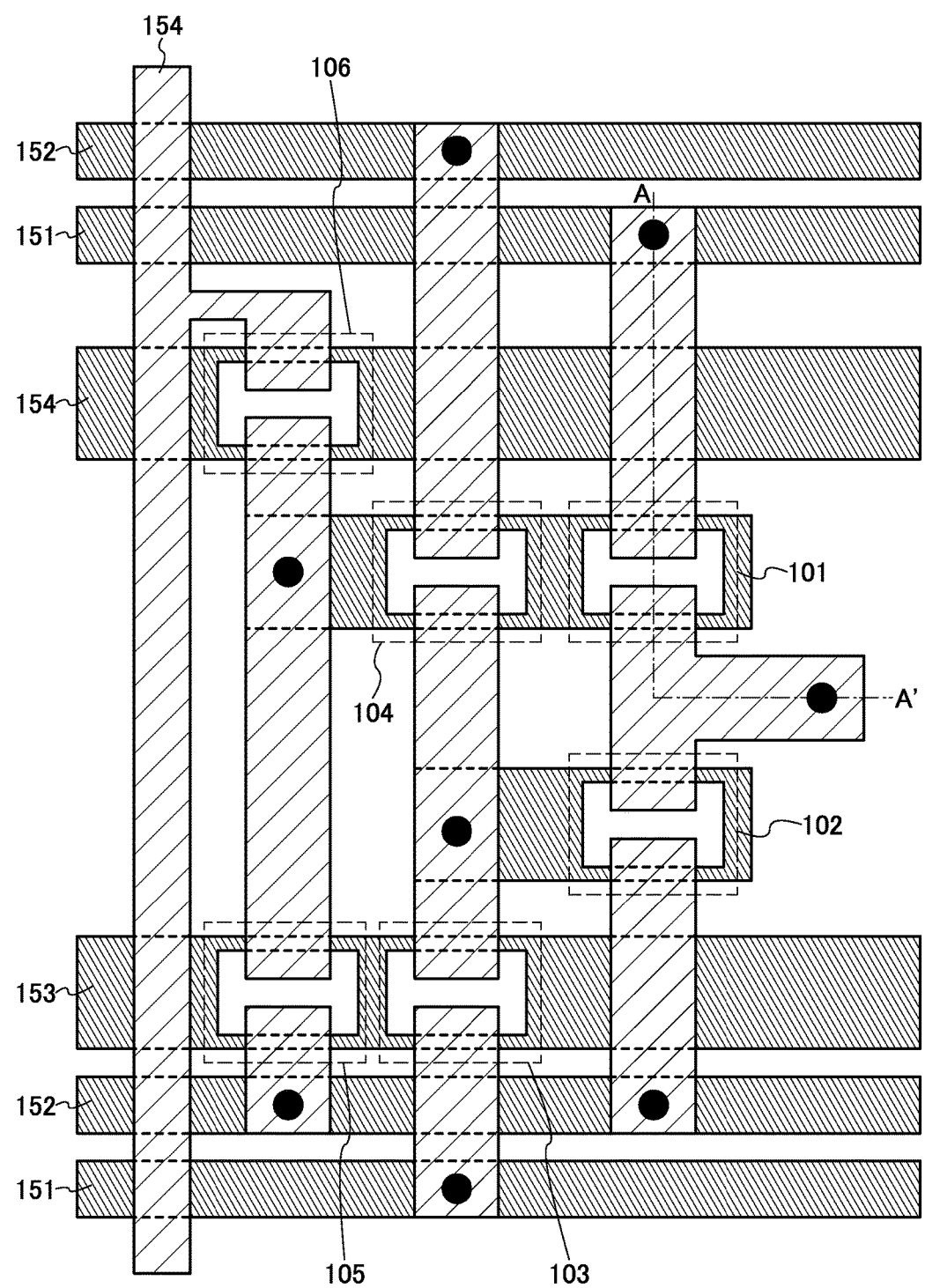
FIG. 29 illustrates an example of a pixel.
Figure 30:
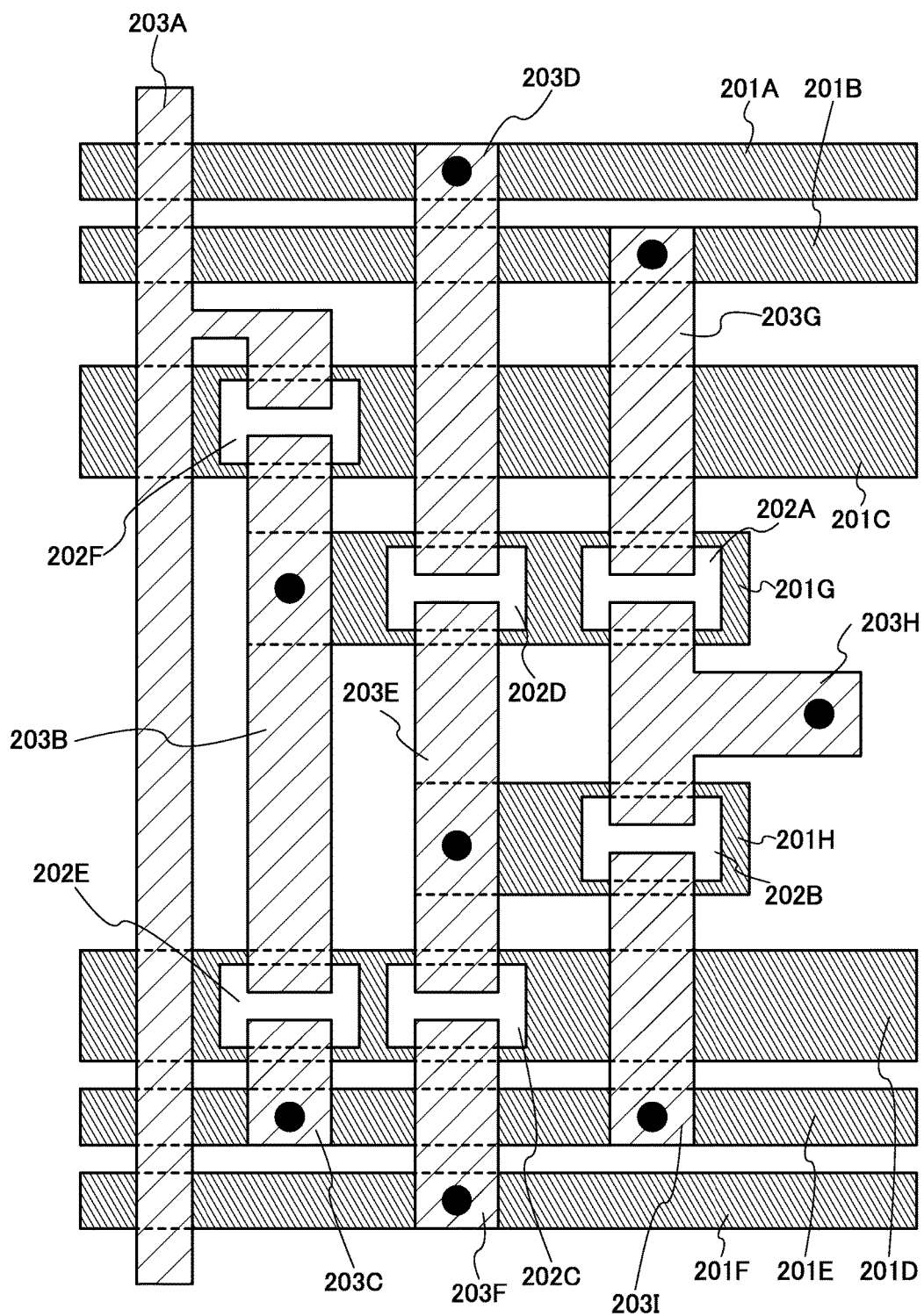
FIG. 30 illustrates an example of a pixel.
Figure 31:
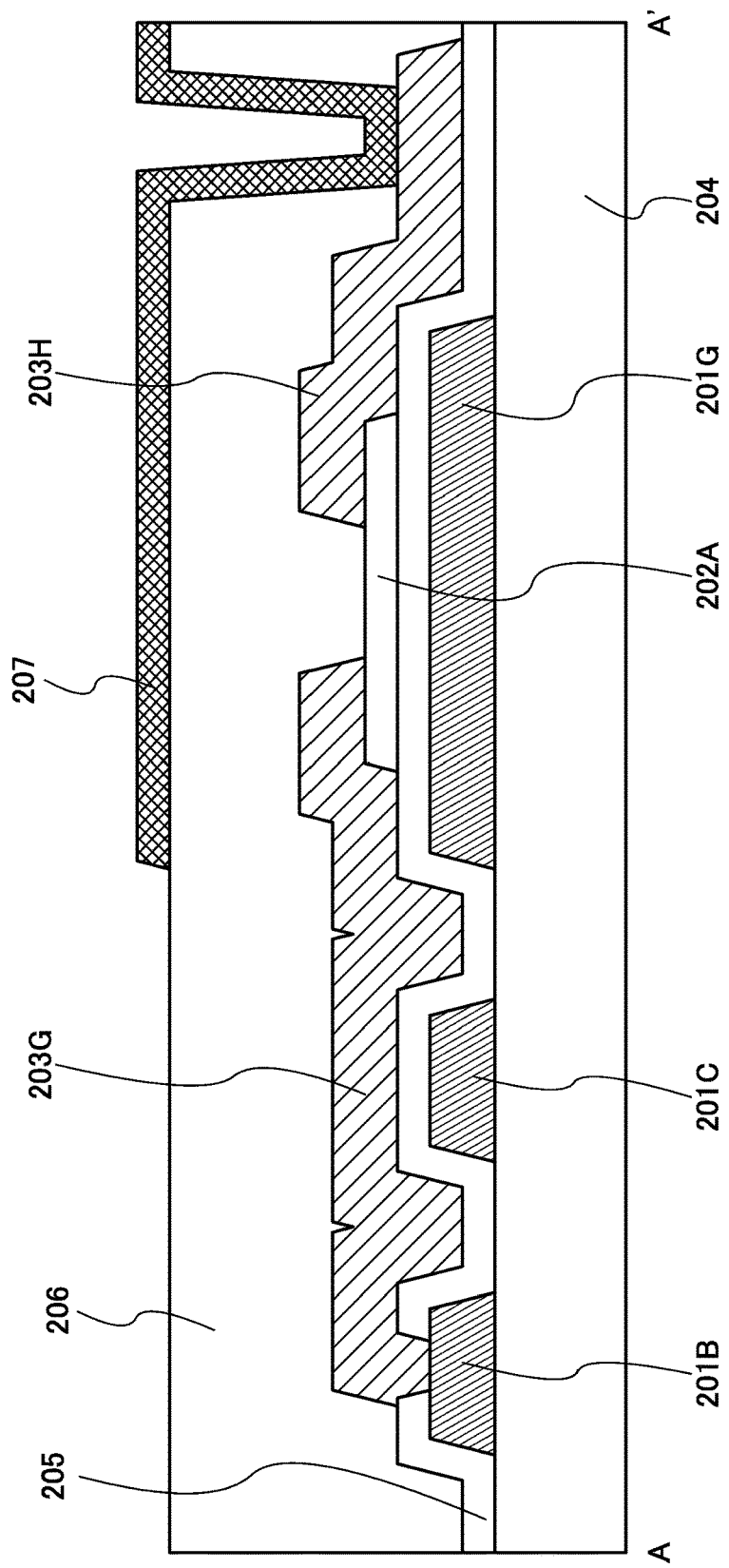
FIG. 31 illustrates an example of a pixel.

FIG. 29 and FIG. 30 are top views of the pixel 100 illustrated in FIG. 1. FIG. 31 shows a cross section along the line A-A' in FIG. 29.

Conductive layers 201A to 201H contain the same material. Alternatively, the conductive layers 201A to 201H are formed through a step of processing one conductive layer. The conductive layers 201A to 201H are formed as different islands. The conductive layer 201A has a region functioning as the wiring 152. The conductive layer 201B has a region functioning as the wiring 151. The conductive layer 201C has a region functioning as the wiring 154 and a region functioning as the gate electrode of the transistor 106. The conductive layer 201D has a region functioning as the wiring 153, a region functioning as the gate electrode of the transistor 103, and a region functioning as the gate electrode of the transistor 105. The conductive layer 201E has a region functioning as the wiring 152. The conductive layer 201F has a region functioning as the wiring 151. The conductive layer 201G has a region functioning as the gate electrode of the transistor 101 and a region functioning as the gate electrode of the transistor 104. The conductive layer 201H has a region functioning as the gate electrode of the transistor 102.

Note that the conductive layer 201A and the conductive layer 201E may be formed as one island. The conductive layer 201B and the conductive layer 201F may be formed as one island.

Semiconductor layers 202A to 202F contain the same material. Alternatively, the semiconductor layers 202A to 202F are formed through a step of processing one semiconductor layer. The semiconductor layers 202A to 202F are formed as different islands. The semiconductor layer 202A has a channel formation region of the transistor 101. The semiconductor layer 202B has a channel formation region of the transistor 102. The semiconductor layer 202C has a channel formation region of the transistor 103. The semiconductor layer 202D has a channel formation region of the transistor 104. The semiconductor layer 202E has a channel formation region of the transistor 105. The semiconductor layer 202F has a channel formation region of the transistor 106.

Conductive layers 203A to 203I contain the same material. Alternatively, the conductive layers 203A to 203I are formed through a step of processing one conductive layer. The conductive layers 203A to 203I are formed as different islands. The conductive layer 203A has a region functioning as the wiring 154 and a region functioning as one of the source electrode and the drain electrode of the transistor 106. The conductive layer 203B has a region functioning as the other of the source electrode and the drain electrode of the transistor 106 and a region functioning as one of the source electrode and the drain electrode of the transistor 105. The conductive layer 203C has a region functioning as the other of the source electrode and the drain electrode of the transistor 105. The conductive layer 203D has a region functioning as one of the source electrode and the drain electrode of the transistor 104. The conductive layer 203E has a region functioning as one of the source electrode and the drain electrode of the transistor 103 and a region functioning as the other of the source electrode and the drain electrode of the transistor 104. The conductive layer 203F has a region functioning as the other of the source electrode and the drain electrode of the transistor 103. The conductive layer 203G has a region functioning as one of the source electrode and the drain electrode of the transistor 101. The conductive layer 203H has a region functioning as the other of the source electrode and the drain electrode of the transistor 101 and a region functioning as one of the source electrode and the drain electrode of the transistor 102. The conductive layer 203I has a region functioning as the other of the source electrode and the drain electrode of the transistor 102.

The conductive layer 203A is connected to the semiconductor layer 202F. The conductive layer 203B is connected to the semiconductor layer 202E, the semiconductor layer 202F, and the conductive layer 201G. The conductive layer 203C is connected to the semiconductor layer 202E and the conductive layer 201E. The conductive layer 203D is connected to the semiconductor layer 202D and the conductive layer 201A. The conductive layer 203E is connected to the semiconductor layer 202D, the semiconductor layer 202C, and the conductive layer 201H. The conductive layer 203F is connected to the semiconductor layer 202C and the conductive layer 201F. The conductive layer 203G is connected to the semiconductor layer 202A and the conductive layer 201B. The conductive layer 203H is connected to the semiconductor layer 202A and the semiconductor layer 202B. The conductive layer 203I is connected to the semiconductor layer 202B and the conductive layer 201E.

The conductive layers 203A to 203I are in contact with the top surfaces of the semiconductor layers 202A to 202F; alternatively, the conductive layers 203A to 203I may be in contact with the bottom surfaces of the semiconductor layers 202A to 202F.

Note that the conductive layer 203C, the conductive layer 203D, and the conductive layer 203I may be formed as one island. Alternatively, the conductive layer 203C and the conductive layer 203D may be formed as one island. Alternatively, the conductive layer 203C and the conductive layer 203I may be formed as one island. Alternatively, the conductive layer 203D and the conductive layer 203I may be formed as one island.

Note that the conductive layer 203F and the conductive layer 203G may be formed as one island.

An insulating layer 205 has a region functioning as a gate insulating film of the transistor 101, a region functioning as a gate insulating film of the transistor 102, a region functioning as a gate insulating film of the transistor 103, a region functioning as a gate insulating film of the transistor 104, a region functioning as a gate insulating film of the transistor 105, and a region functioning as a gate insulating film of the transistor 106.

The insulating layer 205 is formed above the conductive layers 201A to 201H, and the semiconductor layers 202A to 202F are formed above the insulating layer 205. Alternatively, the insulating layer 205 may be formed above the semiconductor layers 202A to 202F, and the conductive layers 201A to 201H may be formed above the insulating layer 205. That is, the insulating layer 205 is acceptable as long as it has a region sandwiched between the conductive layer 201G and the semiconductor layer 202A, a region sandwiched between the conductive layer 201H and the semiconductor layer 202B, a region sandwiched between the conductive layer 201D and the semiconductor layer 202C, a region sandwiched between the conductive layer 201G and the semiconductor layer 202D, a region sandwiched between the conductive layer 201C and the semiconductor layer 202E, and a region sandwiched between the conductive layer 201D and the semiconductor layer 202F.

A portion denoted by a black circle is an opening provided in the insulating layer 205. The conductive layers 201A to 201H and the conductive layers 203A to 203I are connected to each other as appropriate through the openings.

An insulating layer 206 is provided above the transistors 101 to 106.

A conductive layer 207 has a region functioning as a wiring that connects the conductive layer 203H to the display element 120 (the component 121, the component 122, or the component 123). Alternatively, the conductive layer 207 is part of the display element 120 (the component 121, the component 122, or the component 123).

The conductive layers 201A to 201H can be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these elements; or the like.

The conductive layers 201A to 201H may have a single-layer structure or a stacked-layer structure of two or more layers. For example, it is possible to employ a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, or a three-layer structure in which a titanium film, an aluminum film, and a titanium film are stacked in this order. Alternatively, an alloy film or a nitride film that contains aluminum and one or more elements selected from titanium, tantalum, tungsten, molybdenum, chromium, neodymium, and scandium may be used.

The conductive layers 201A to 201H can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

A Cu—X alloy film (X is Mn, Ni, Cr, Fe, Co, Mo, Ta, or Ti) may be used for the conductive layers 201A to 201H. The use of a Cu—X alloy film results in lower fabrication costs because the film can be processed by wet etching.

For the semiconductor layers 202A to 202F, a single crystal semiconductor or a non-single-crystal semiconductor can be used. Examples of a non-single-crystal semiconductor include non-single-crystal silicon and non-single-crystal germanium. Examples of non-single-crystal silicon include amorphous silicon, microcrystalline silicon, and polycrystalline silicon. Examples of non-single-crystal germanium include amorphous germanium, microcrystalline germanium, and polycrystalline germanium.

An oxide semiconductor film is preferably used as the semiconductor layers 202A to 202F. For the oxide semiconductor film, In—M oxide (M is Ti, Ga, Sn, Y, Zr, La, Ce, Nd, or Hf) or In—M—Zn oxide can be used. It is particularly preferable to use In—M—Zn oxide for the oxide semiconductor film. When the oxide semiconductor film is an In—M—Zn oxide film, it is preferred that the atomic ratio of the metal elements of a sputtering target used for forming the In-M-Zn oxide film satisfy In M and Zn M. As the atomic ratio of the metal elements of such a sputtering target, In:M:Zn=1:1:1, In:M:Zn=1:1:1.2, In:M:Zn=2:1:3, In:M:Zn=3:1:2, and In:M:Zn=4:2:4.1 are preferable. When the oxide semiconductor film is an In—M—Zn oxide film, a target including polycrystalline In—M—Zn oxide is preferably used as a sputtering target. With the use of the target including polycrystalline In—M—Zn oxide, an oxide semiconductor film having crystallinity can be easily formed.

Note that the atomic ratio of metal elements in the oxide semiconductor film may vary from the atomic ratio of those in the above sputtering target, within a range of ±40% as an error. For example, when a sputtering target with an atomic ratio of In:Ga:Zn=4:2:4.1 is used, the atomic ratio of In to Ga and Zn in the oxide semiconductor film may be 4:2:3 or in the vicinity of 4:2:3.

The energy gap of the oxide semiconductor film is 2 eV or more, preferably 2.5 eV or more, further preferably 3 eV or more. The off-state current of a transistor can be reduced by using an oxide semiconductor having a wide energy gap.

The thickness of the oxide semiconductor film ranges from 3 nm to 200 nm, preferably from 3 nm to 100 nm, further preferably from 3 nm to 50 nm.

An oxide semiconductor film with low carrier density is used as the oxide semiconductor film. For example, the carrier density of the oxide semiconductor film is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$. The carrier density of the oxide semiconductor film may be preferably greater than or equal to $1\times10^{5}/cm^3$, further preferably greater than or equal to $1\times10^{7}/cm^3$.

Note that without limitation to the compositions and materials described above, a material with an appropriate composition can be used depending on required semiconductor characteristics and electrical characteristics (e.g., field-effect mobility and threshold voltage) of a transistor. To obtain the required semiconductor characteristics of the transistor, it is preferred that the carrier density, the impurity concentration, the defect density, the atomic ratio of a metal element to oxygen, the interatomic distance, the density, and the like of the oxide semiconductor film be set to appropriate values.

The oxide semiconductor film is preferably an oxide semiconductor film where the impurity concentration is low and the density of defect states is low, in which case the transistors can have quite excellent electrical characteristics. Here, the state in which the impurity concentration is low and the density of defect states is low (the number of oxygen vacancies is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, a highly purified intrinsic or substantially highly purified intrinsic oxide semiconductor film exhibits an extremely low off-state current. The off-state current of an element having a channel width of $1\times10^6$ μm and a channel length of 10 μm can be less than or equal to the measurement limit of a semiconductor parameter analyzer, i.e., less than or equal to $1\times10^{-13}$ A at a voltage between a source electrode and a drain electrode (drain voltage) of 1 V to 10 V.

Accordingly, the transistor in which the channel region is formed in the highly purified intrinsic or substantially highly purified intrinsic oxide semiconductor film can have a small variation in electrical characteristics and high reliability. Charge trapped by the trap states in the oxide semiconductor film takes a long time to be released and may behave like fixed charge. Thus, a transistor whose channel region is formed in an oxide semiconductor film having a high density of trap states has unstable electrical characteristics in some cases. Examples of impurities are hydrogen, nitrogen, alkali metal, and alkaline earth metal.

Hydrogen contained in the oxide semiconductor film reacts with oxygen bonded to a metal atom to form water, and also causes oxygen vacancies in a lattice from which oxygen is released (or a portion from which oxygen is released). Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor film that contains hydrogen is likely to be normally on. Accordingly, it is preferred that hydrogen be reduced as much as possible in the oxide semiconductor film. Specifically, in the oxide semiconductor film, the hydrogen concentration measured by secondary mass spectrometry (SIMS) may be $2\times10^{20}$ atoms/cm$^3$ or lower, preferably $5\times10^{19}$ atoms/cm$^3$ or lower, further preferably $1\times10^{19}$ atoms/cm$^3$ or lower, further preferably $5\times10^{18}$ atoms/cm$^3$ or lower, still further preferably $1\times10^{18}$ atoms/cm$^3$ or lower, yet still further preferably $5\times10^{17}$ atoms/cm$^3$ or lower. Furthermore, in the oxide semiconductor film, the hydrogen concentration measured by SIMS may be $1\times10^{16}$ atoms/cm$^3$ or higher, preferably $1\times10^{17}$ atoms/cm$^3$ or higher.

If silicon or carbon, which is an element belonging to Group 14, is contained in the oxide semiconductor film, oxygen vacancies are increased in the oxide semiconductor film, and the oxide semiconductor film becomes an n-type film. Thus, the concentration of silicon or carbon in the oxide semiconductor film and the concentration of silicon or carbon at or near an interface with the oxide semiconductor film (concentration measured by SIMS) is set lower than or equal to $2\times10^{18}$ atoms/cm$^3$. The concentration of silicon or carbon in the oxide semiconductor film or the concentration of silicon or carbon at or near an interface with the oxide semiconductor film (concentration measured by SIMS) may be preferably set higher than or equal to $1\times10^{17}$ atoms/cm$^3$, further preferably higher than or equal to $3\times10^{17}$ atoms/cm$^3$, still further preferably higher than or equal to $1\times10^{18}$ atoms/cm$^3$.

The concentration of alkali metal or alkaline earth metal of the oxide semiconductor film, which is measured by SIMS, is set lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Thus, it is preferable to reduce the concentration of alkali metal or alkaline earth metal of the oxide semiconductor film. In addition, the concentration of alkali metal or alkaline earth metal of the oxide semiconductor film, which is measured by SIMS, may be higher than or equal to $5\times10^{15}$ atoms/cm$^3$, preferably higher than or equal to $1\times10^{16}$ atoms/cm$^3$.

If nitrogen is contained in the oxide semiconductor film, electrons serving as carriers are generated and the carrier density increases, so that the oxide semiconductor film easily becomes an n-type film. Thus, a transistor including an oxide semiconductor film that contains nitrogen is likely to have normally-on characteristics. For this reason, nitrogen in the oxide semiconductor film is preferably reduced as much as possible; the nitrogen concentration measured by SIMS is preferably set, for example, lower than or equal to $5\times10^{18}$ atoms/cm$^3$. Furthermore, the nitrogen concentration measured by SIMS may be higher than or equal to $1\times10^{16}$ atoms/cm$^3$, preferably higher than or equal to $5\times10^{16}$ atoms/ cm$^3$, further preferably higher than or equal to $1\times10^{17}$ atoms/cm$^3$, still further preferably higher than or equal to $5\times10^{17}$ atoms/cm$^3$.

The oxide semiconductor film may have a non-single-crystal structure. Examples of the non-single-crystal structure include a c-axis-aligned crystalline oxide semiconductor (CAAC-OS) which is described later, a polycrystalline structure, a microcrystalline structure, and an amorphous structure. Among the non-single-crystal structures, the amorphous structure has the highest density of defect levels, whereas CAAC-OS has the lowest density of defect levels.

A structure of the oxide semiconductor film is described below.

An oxide semiconductor film is classified into a non-single-crystal oxide semiconductor film and a single crystal oxide semiconductor film. Furthermore, an oxide semiconductor is classified into, for example, a crystalline oxide semiconductor and an amorphous oxide semiconductor.

Examples of a non-single-crystal oxide semiconductor include CAAC-OS, a polycrystalline oxide semiconductor, a microcrystalline oxide semiconductor, and an amorphous oxide semiconductor. Examples of a crystalline oxide semiconductor include a single crystal oxide semiconductor, CAAC-OS, a polycrystalline oxide semiconductor, and a microcrystalline oxide semiconductor.

First, a CAAC-OS film is described.

A CAAC-OS film is an oxide semiconductor film having a plurality of c-axis-aligned crystal parts.

With a transmission electron microscope (TEM), a plurality of crystal parts in a CAAC-OS film are observed in a combined analysis image (also referred to as a high-resolution TEM image) of a bright-field image and a diffraction pattern of the CAAC-OS film. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer reflects unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

According to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

When a CAAC-OS film, e.g., a CAAC-OS film including an InGaZnO$_4$ crystal, is subjected to structural analysis by an out-of-plane method with an X-ray diffraction (XRD) apparatus, a peak appears frequently at a diffraction angle (2θ) of around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

When the CAAC-OS film with an InGaZnO$_4$ crystal is analyzed by an out-of-plane method, a peak may also be observed at 2θ of around 36° as well as at 2θ of around 31°. The peak at 2θ of around 36° indicates that a crystal having no c-axis alignment is included in the CAAC-OS film. It is preferred that in the CAAC-OS film, a peak appear at 2θ of around 31° and a peak not appear at 2θ of around 36°.

The CAAC-OS film is an oxide semiconductor film having low impurity concentration. The impurity is an element other than the main components of the oxide semiconductor film, such as hydrogen, carbon, silicon, or a transition metal element. An element that has higher bonding strength to oxygen than a metal element included in the oxide semiconductor film, such as silicon, disturbs the atomic arrangement of the oxide semiconductor film by abstracting oxygen from the oxide semiconductor film and causes a decrease in crystallinity. A heavy metal such as iron or nickel, argon, carbon dioxide, or the like has a large atomic radius (or molecular radius), and thus disturbs the atomic arrangement of the oxide semiconductor film and causes a decrease in crystallinity when it is contained in the oxide semiconductor film. The impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

With the use of the CAAC-OS film in a transistor, variation in the electrical characteristics of the transistor due to irradiation with visible light or ultraviolet light is small.

Next, a microcrystalline oxide semiconductor film is described.

In a high-resolution TEM image of a microcrystalline oxide semiconductor film, there are a region where a crystal part is observed and a region where a crystal part is not clearly observed. In most cases, a crystal part in the microcrystalline oxide semiconductor film ranges from 1 nm to 100 nm or from 1 nm to 10 nm. A microcrystal with a size in the range of 1 nm to 10 nm or of 1 nm to 3 nm is specifically referred to as nanocrystal (nc). An oxide semiconductor film including nanocrystal is referred to as a nanocrystalline oxide semiconductor (nc-OS) film. For example, in a high-resolution TEM image of the nc-OS film, a grain boundary is not clearly observed in some cases.

In the nc-OS film, a microscopic region (e.g., a region with a size ranging from 1 nm to 10 nm, in particular, from 1 nm to 3 nm) has a periodic atomic order. There is no regularity of crystal orientation between different crystal parts in the nc-OS film; thus, the orientation of the whole film is not observed. Consequently, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak showing a crystal plane does not appear. A diffraction pattern like a halo pattern appears in a selected-area electron diffraction pattern of the nc-OS film obtained by using an electron beam having a probe diameter larger than the diameter of a crystal part (e.g., having a probe diameter of 50 nm or larger). Meanwhile, in a nanobeam electron diffraction pattern of the nc-OS film obtained by using an electron beam having a probe diameter close to or smaller than the diameter of a crystal part, spots are observed. Moreover, in a nanobeam electron diffraction pattern of the nc-OS film, regions with high luminance in a circular (ring) pattern are shown or a plurality of spots are shown in a ring-like region in some cases.

The nc-OS film is an oxide semiconductor film that has higher regularity than an amorphous oxide semiconductor film, and therefore has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

An amorphous oxide semiconductor film has disordered atomic arrangement and no crystal part. An example of the amorphous oxide semiconductor film is an oxide semiconductor film with a non-crystalline state like quartz glass.

In a high-resolution TEM image of the amorphous oxide semiconductor film, crystal parts cannot be found.

When the amorphous oxide semiconductor film is subjected to structural analysis by an out-of-plane method with an XRD apparatus, a peak showing a crystal plane does not appear. A halo pattern is shown in an electron diffraction pattern of the amorphous oxide semiconductor film. Furthermore, a halo pattern is shown but any spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void is sometimes observed. Furthermore, in the high-resolution TEM image, there are a region where a crystal part is clearly observed and a region where a crystal part is not observed. In the a-like OS film, crystallization is induced by a weak electron beam used for TEM observation and the growth of the crystal part is found in some cases. In contrast, crystallization is scarcely observed in the nc-OS film having good quality when the electron-beam irradiation is carried out at a low intensity as in the TEM observation.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to be 0.29 nm from crystal structure analysis. Thus, when focusing on the lattice fringes in the high-resolution TEM image, each of the lattice fringes in which the spacing therebetween is from 0.28 nm to 0.30 nm corresponds to the a-b plane of the $InGaZnO_4$ crystal.

The density of an oxide semiconductor film might vary depending on its structure. For example, when the composition of an oxide semiconductor film becomes clear, the structure of the oxide semiconductor film can be estimated from a comparison between the density of the oxide semiconductor film and the density of a single crystal oxide semiconductor film having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film whose density is lower than 78% of the density of the single crystal oxide semiconductor film.

Specific examples of the above description are given. For example, in an oxide semiconductor film with an atomic ratio of In:Ga:Zn=1:1:1, the density of single crystal $InGaZnO_4$ with a rhombohedral crystal structure is 6.357 $g/cm^3$. Thus, for example, the density of an a-like OS film with an atomic ratio of In:Ga:Zn=1:1:1 is higher than or equal to 5.0 $g/cm^3$ and lower than 5.9 $g/cm^3$. Moreover, for example, the density of an nc-OS film or a CAAC-OS film with an atomic ratio of In:Ga:Zn=1:1:1 is higher than or equal to 5.9 $g/cm^3$ and lower than 6.3 $g/cm^3$.

Note that single crystals with the same composition do not exist in some cases. In such a case, by combining single crystals with different compositions at a given proportion, it is possible to calculate a density that corresponds to the density of a single crystal with a desired composition. The density of the single crystal with a desired composition can be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

In this specification, the term "parallel" indicates that the angle formed between two straight lines ranges from −10° to 10°, and accordingly also includes the case where the angle ranges from −5° to 5°. The term "substantially parallel" indicates that the angle formed between two straight lines ranges from −30° to 30°. The term "perpendicular" indicates that the angle formed between two straight lines ranges from 80° to 100°, and accordingly also includes the case where the angle ranges from 85° to 95°. The term "substantially perpendicular" indicates that the angle formed between two straight lines ranges from 60° to 120°.

In this specification, trigonal and rhombohedral crystal systems are included in a hexagonal crystal system.

The conductive layers 203A to 203I can appropriately employ any of materials or structures that can be used for the conductive layers 201A to 201H.

A substrate 204 preferably has heat resistance high enough to withstand at least heat treatment performed later. For example, a glass substrate, a ceramic substrate, a quartz substrate, or a sapphire substrate may be used as the substrate 204. A single crystal semiconductor substrate or a polycrystalline semiconductor substrate made of silicon, silicon carbide, or the like, a compound semiconductor substrate made of silicon germanium or the like, an SOI substrate, or the like may be used as the substrate 204.

Furthermore, any of these substrates provided with a semiconductor element may be used as the substrate 204. In the case where a glass substrate is used as the substrate 204, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

A flexible substrate may be used as the substrate 204, and the transistor may be provided directly on the flexible substrate. Alternatively, a separation layer may be provided between a substrate and the transistor. The separation layer over which part or the whole of a semiconductor device is formed can be used to separate the semiconductor device from the substrate and transfer the semiconductor device to another substrate. In this case, the transistor can be transferred to a substrate having low heat resistance or a flexible substrate as well.

In this specification and the like, a transistor can be formed using a variety of substrates, for example. There is no particular limitation on the type of substrate. Examples of the substrate include a semiconductor substrate (e.g., a single crystal substrate and a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base film. Examples of a glass substrate include a barium borosilicate glass substrate, an aluminoborosilicate glass substrate, and a soda lime glass substrate. Examples of materials of a flexible substrate, an attachment film, a base film, and the like include plastic typified by polyethylene terephthalate (PET), polyethylene naphthalate (PEN), polyether sulfone (PES), and polytetrafluoroethylene (PTFE); a synthetic resin such as acrylic, polypropylene, polyester, polyvinyl fluoride, polyvinyl chloride, polyamide, polyimide, aramid, and epoxy; an inorganic vapor deposition film; and paper. Specifically, the use of a semiconductor substrate, a single crystal substrate, an SOI substrate, or the like enables the manufacture of small-sized transistors with a small variation in characteristics, size, shape, or the like and with high current capability. A circuit using such transistors achieves lower power consumption of the circuit or higher integration of the circuit.

The separation layer can be a stack including inorganic films (e.g., a tungsten film and a silicon oxide film) or an organic resin film of polyimide or the like formed over a substrate, for example.

In other words, a transistor may be formed using one substrate and then transferred to another substrate. Examples of a substrate to which a transistor is transferred include, in addition to the above substrates over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. The use of such a substrate enables formation of a transistor with excellent characteristics, a transistor with low power consumption, or a device with high durability, high heat resistance, or reduced weight or thickness.

The insulating layer 205 can be an insulating layer including at least one of the following films formed by a plasma enhanced chemical vapor deposition (PECVD) method, a sputtering method, or the like: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

The insulating layer 206 can appropriately employ any of materials or structures that can be used for the insulating layer 205.

The conductive layer 207 can appropriately employ any of materials or structures that can be used for the conductive layers 201A to 201H.

Note that the transistor described in Embodiment 1 can have the structure described above. The transistor described in Embodiment 1 is preferably a transistor in which a channel formation region is included in an oxide semiconductor layer. Since the transistor in which a channel formation region is included in an oxide semiconductor layer exhibits a low off-state current, leakage of charge from the node N1 or the node N2 can be decreased; thus, a change in potential of the node N1 or the node N2 can be decreased.

This embodiment can be combined with any other embodiment as appropriate. Note that a content (or part thereof) described in one embodiment may be applied to, combined with, or replaced with a different content (or part thereof) described in the embodiment and/or a content (or part thereof) described in one or more different embodiments. Note that in each embodiment, a content described in the embodiment is a content described with reference to a variety of diagrams or a content described with text in this specification. In addition, by combining a diagram (or part thereof) described in one embodiment with another part of the diagram, a different diagram (or part thereof) described in the embodiment, and/or a diagram (or part thereof) described in another embodiment or other embodiments, much more diagrams can be created. The same can be applied to any other embodiment.

Embodiment 3

In this embodiment, a display module and electronic devices that include the semiconductor device or the display device of one embodiment of the present invention will be described with reference to FIG. 32 and FIGS. 33A to 33G.

Figure 32:
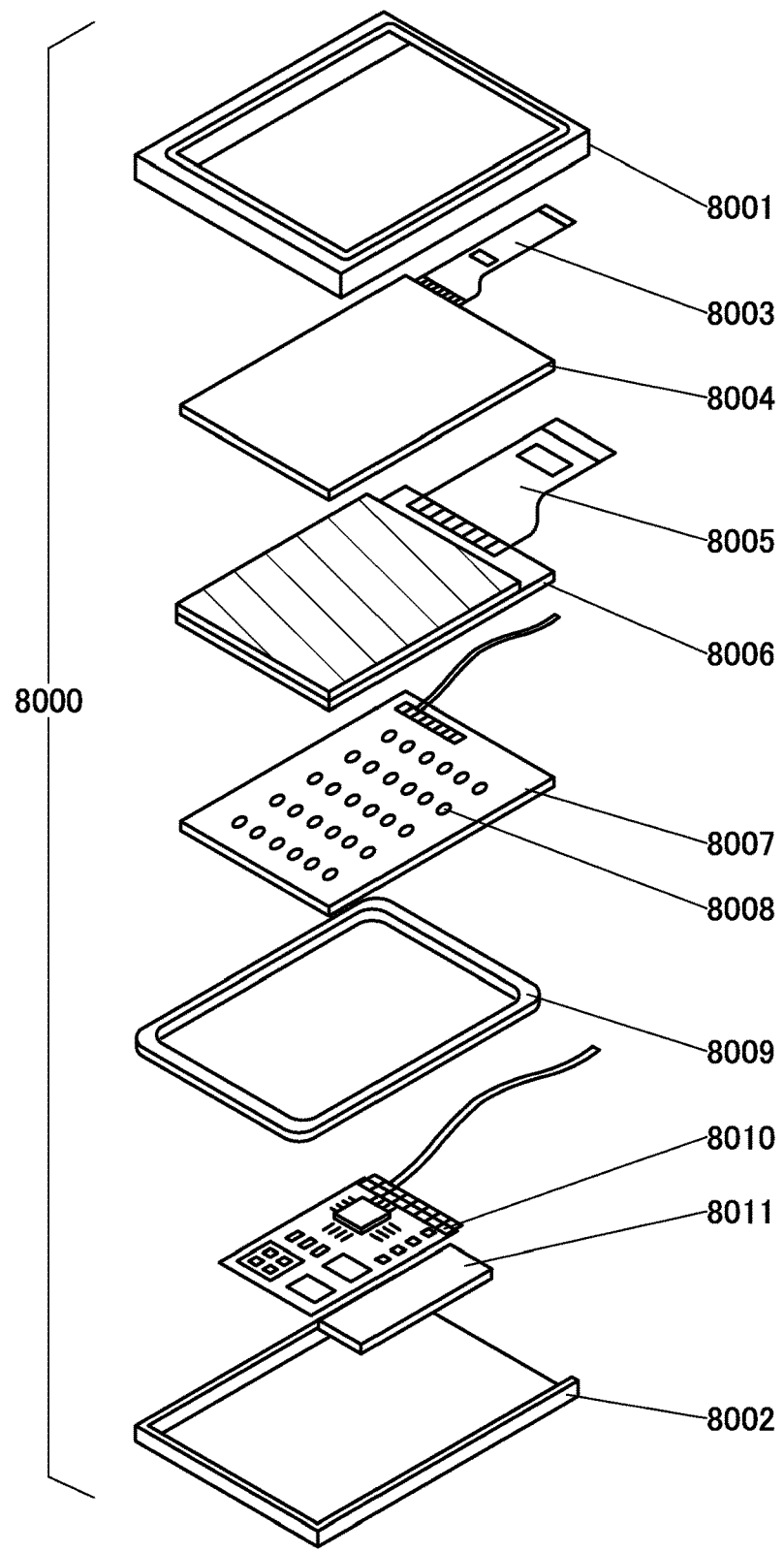
FIG. 32 illustrates an example of a display module.

In a display module 8000 illustrated in FIG. 32, a touch panel 8004 connected to an FPC 8003, a display panel 8006 connected to an FPC 8005, a backlight 8007, a frame 8009, a printed circuit board 8010, and a battery 8011 are provided between an upper cover 8001 and a lower cover 8002.

The semiconductor device or the display device of one embodiment of the present invention can be used for, for example, the display panel 8006.

The shape and size of the upper cover 8001 and the lower cover 8002 can be changed as appropriate in accordance with the size of the touch panel 8004 and the display panel 8006.

The touch panel 8004 can be a resistive touch panel or a capacitive touch panel and can overlap the display panel 8006. It is also possible to provide a touch panel function for a counter substrate (sealing substrate) of the display panel 8006. A photosensor may be provided in each pixel of the display panel 8006 so that an optical touch panel is obtained.

The backlight 8007 includes a light source 8008. Although the light sources 8008 are provided over the backlight 8007 in FIG. 32, one embodiment of the present invention is not limited to this structure. For example, it is possible to employ a structure in which the light source 8008 is provided at an end portion of the backlight 8007 and a light diffusion plate is provided. Note that the backlight 8007 need not be provided in a reflective panel or the like or in the case of using a self-luminous light-emitting element such as an organic EL element.

The frame 8009 protects the display panel 8006 and functions as an electromagnetic shield for blocking electromagnetic waves generated by the operation of the printed circuit board 8010. The frame 8009 may also have a function of a radiator plate.

The printed circuit board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a polarizing plate, a retardation plate, a prism sheet, or the like.

FIGS. 33A to 33G illustrate electronic devices. These electronic devices can include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIGS. 33A to 33G can have a variety of functions, for example, a function of displaying a variety of data (e.g., a still image, a moving image, and a text image) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, and a function of reading a program or data stored in a memory medium and displaying the program or data on the display portion. Note that functions that can be provided for the electronic devices shown in FIGS. 33A to 33G are not limited to the above, and the electronic devices can have a variety of functions. Although not illustrated in FIGS. 33A to 33G, the electronic device may include a plurality of display portions. Furthermore, the electronic device may be provided with a camera and the like and have a function of shooting a still image, a function of shooting a moving image, a function of storing a shot image in a memory medium (an external memory medium or a memory medium incorporated in the camera), a function of displaying a shot image on the display portion, and the like.

The electronic devices illustrated in FIGS. 33A to 33G will be described in detail.

Figure 33A:
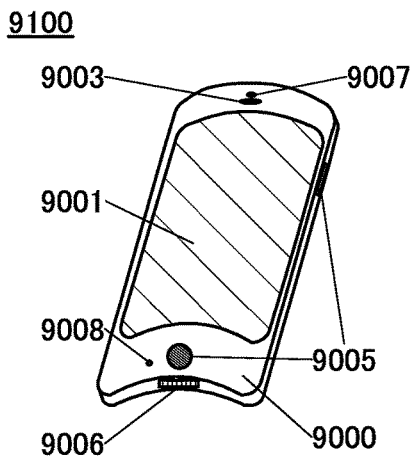
FIGS. 33A to 33G illustrate examples of electronic devices.

FIG. 33A is a perspective view illustrating a portable information appliance 9100. A display portion 9001 of the portable information appliance 9100 is flexible; therefore, the display portion 9001 can be incorporated along a bent surface of a bent housing 9000. The display portion 9001 includes a touch sensor, and operation can be performed by touching the screen with a finger, a stylus, or the like. For example, an application can be started by touching an icon displayed on the display portion 9001.

Figure 33B:
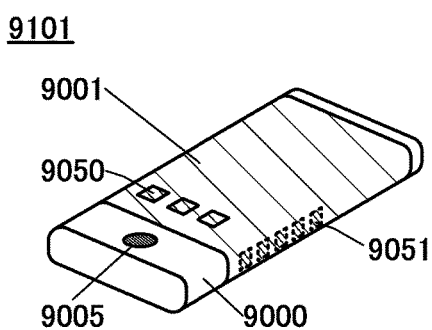

FIG. 33B is a perspective view of a portable information appliance 9101. The portable information appliance 9101 has a function of at least one of a telephone set, a notebook, and an information browsing system, for example. Specifically, the portable information appliance 9101 can be used as a smartphone. Note that the speaker 9003, the connection terminal 9006, the sensor 9007, and the like of the portable information appliance 9101, which are not illustrated in FIG. 33B, can be provided as in the portable information appliance 9100 of FIG. 33A. The portable information appliance 9101 can display letters and image data on its plurality of surfaces. For example, three operation buttons 9050 (also referred to as operation icons or simply icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, and call; the title and sender of an email and an SNS massage; the date; the time; remaining battery; and the reception strength of an antenna. Alternatively, the operation buttons 9050 or the like may be displayed in place of the information 9051.

Figure 33C:
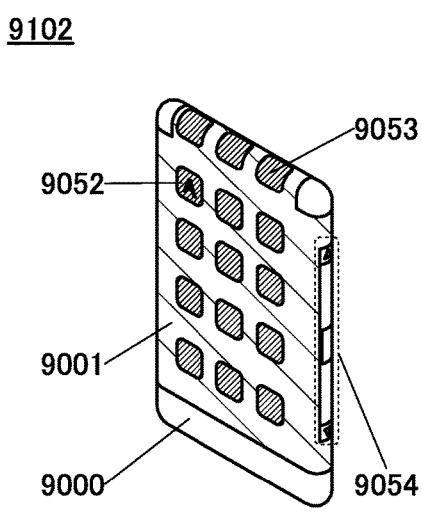

FIG. 33C is a perspective view illustrating a portable information appliance 9102. The portable information appliance 9102 has a function of displaying information on three or more surfaces of the display portion 9001. Here, information 9052, information 9053, and information 9054 are displayed on different surfaces. For example, a user of the portable information appliance 9102 can see the display (here, the information 9053) with the portable information appliance 9102 put in a breast pocket. Specifically, a caller's phone number, name, or the like of an incoming call is displayed in a position that can be seen from above the portable information appliance 9102. Thus, the user can see the display without taking out the portable information appliance 9102 from the pocket and decide whether to answer the call.

Figure 33D:
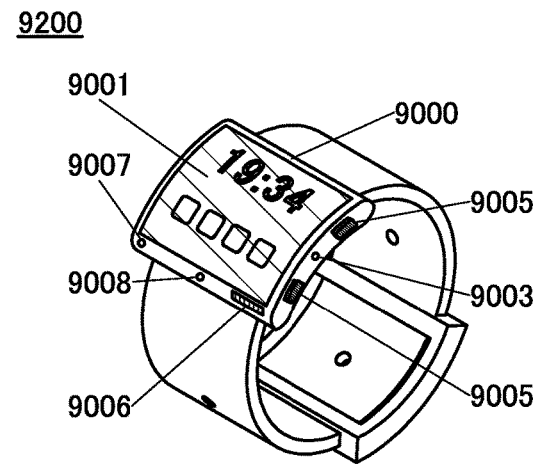

FIG. 33D is a perspective view illustrating a wrist-watch-type portable information appliance 9200. The portable information appliance 9200 is capable of executing a variety of applications such as mobile phone calls, e-mailing, reading and editing texts, music reproduction, Internet communication, and a computer game. The display surface of the display portion 9001 is bent, and images can be displayed on the bent display surface. The portable information appliance 9200 can employ near field communication based on a communication standard. For example, hands-free calling is possible with mutual communication between the portable information appliance 9200 and a headset capable of wireless communication. Moreover, the portable information appliance 9200 includes the connection terminal 9006, and data can be directly transmitted to and received from another information appliance via a connector. The portable information appliance 9200 can be charged through the connection terminal 9006. Note that the charging operation may be performed by wireless power feeding without using the connection terminal 9006.

Figure 33E:
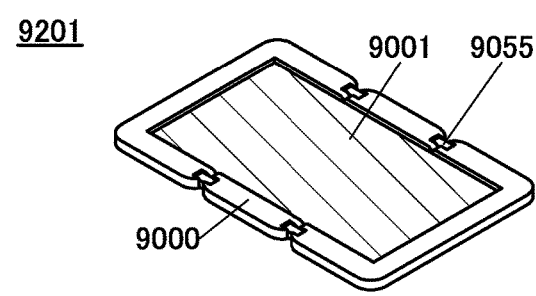
Figure 33F:
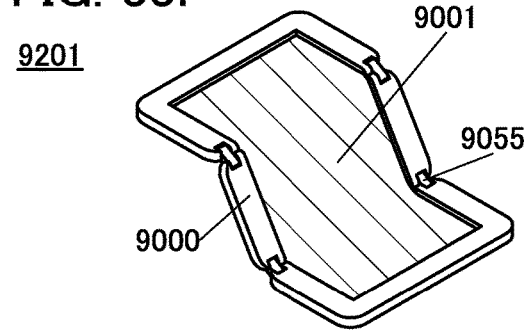
Figure 33G:
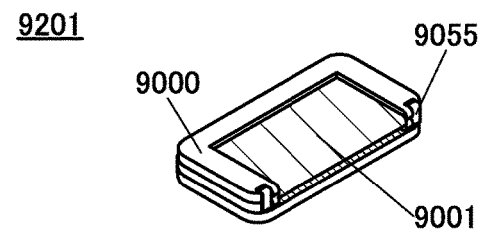

FIGS. 33E, 33F, and 33G are perspective views illustrating a foldable portable information appliance 9201 that is opened, that is being opened or being folded, and that is folded. The portable information appliance 9201 is highly portable when folded. When the portable information appliance 9201 is opened, a seamless large display region is highly browsable. The display portion 9001 of the portable information appliance 9201 is supported by three housings 9000 joined by hinges 9055. By folding the portable information appliance 9201 at a connection portion between two housings 9000 with the hinges 9055, the portable information appliance 9201 can be reversibly changed in shape from an opened state to a folded state. For example, the portable information appliance 9201 can be bent with a radius of curvature of 1 mm to 150 mm.

The semiconductor device or the display device of one embodiment of the present invention can be used for the display portion 9001.

The electronic device described in this embodiment includes a display portion for displaying some sort of information. Note that the semiconductor device of one embodiment of the present invention can also be used for an electronic device that does not have a display portion. In addition, this embodiment shows the example where the display portion of the electronic device is flexible and can display images on the bent display surface, and the example where the display portion is foldable. However, one embodiment of the present invention is not limited to these examples, and it is possible to employ a structure where the display portion is not flexible and images are displayed on a flat surface.

This embodiment can be combined with any other embodiment as appropriate. Note that a content (or part thereof) described in one embodiment may be applied to, combined with, or replaced with a different content (or part thereof) described in the embodiment and/or a content (or part thereof) described in one or more different embodiments. Note that in each embodiment, a content described in the embodiment is a content described with reference to a variety of diagrams or a content described with text in this specification. In addition, by combining a diagram (or part thereof) described in one embodiment with another part of the diagram, a different diagram (or part thereof) described in the embodiment, and/or a diagram (or part thereof) described in another embodiment or other embodiments, much more diagrams can be created. The same can be applied to any other embodiment.

This application is based on Japanese Patent Application serial No. 2014-194575 filed with Japan Patent Office on Sep. 25, 2014, the entire contents of which are hereby incorporated by reference.

What is claimed is:

1. A semiconductor device comprising:
    first to sixth transistors and a MEMS device,
    wherein:
    one of a source and a drain of the first transistor is electrically connected to one of a source and a drain of the second transistor,
    one of a source and a drain of the third transistor is electrically connected to one of a source and a drain of the fourth transistor,
    one of a source and a drain of the fifth transistor is electrically connected to one of a source and a drain of the sixth transistor,
    a gate of the first transistor is electrically connected to the one of the source and the drain of the fifth transistor,
    a gate of the second transistor is electrically connected to the one of the source and the drain of the third transistor,
    a gate of the fourth transistor is electrically connected to the gate of the first transistor,
    the other of the source and the drain of the third transistor is electrically connected to a first wiring,
    a gate of the third transistor is electrically connected to a second wiring,
    a gate of the sixth transistor is electrically connected to a third wiring,
    the other of the source and the drain of the second transistor is electrically connected to a fourth wiring,
    the other of the source and the drain of the fourth transistor is electrically connected to the fourth wiring,
    the other of the source and the drain of the fifth transistor is electrically connected to the fourth wiring, and
    the MEMS device is electrically connected to the one of the source and the drain of the first transistor.

2. The semiconductor device according to claim 1, wherein a W/L ratio of the first transistor is higher than that of the second transistor.

3. The semiconductor device according to claim 1, wherein a W/L ratio of the fourth transistor is higher than that of the third transistor.

4. A display module comprising:
    a display panel comprising the semiconductor device according to claim 1; and
    an FPC.

5. An electronic device comprising:
    the display module according to claim 4; and
    at least one of an antenna, an operation button, and a speaker.

6. A semiconductor device comprising:
    first to fifth transistors and a MEMS device,
    wherein:
    one of a source and a drain of the first transistor is electrically directly connected to one of a source and a drain of the second transistor,
    one of a source and a drain of the third transistor is electrically directly connected to one of a source and a drain of the fourth transistor,
    a gate of the first transistor is electrically directly connected to one of a source and a drain of the fifth transistor,
    a gate of the second transistor is electrically directly connected to the one of the source and the drain of the third transistor,
    a gate of the fourth transistor is electrically directly connected to the gate of the first transistor,
    the other of the source and the drain of the third transistor is electrically directly connected to a first wiring,
    the other of the source and the drain of the first transistor is electrically connected to the first wiring,
    a gate of the third transistor is electrically connected to a second wiring,
    a gate of the fifth transistor is electrically connected to the second wiring, and
    the MEMS device is electrically directly connected to the one of the source and the drain of the first transistor.

7. The semiconductor device according to claim 6, wherein a W/L ratio of the first transistor is higher than that of the second transistor.

8. The semiconductor device according to claim 6, wherein a W/L ratio of the fourth transistor is higher than that of the third transistor.

9. A display module comprising:
    a display panel comprising the semiconductor device according to claim 6; and
    an FPC.

10. An electronic device comprising:
    the display module according to claim 9; and
    at least one of an antenna, an operation button, and a speaker.

11. A semiconductor device comprising:
    first to sixth transistors and a MEMS device,
    wherein:
    the first to sixth transistors each comprise a semiconductor layer including a channel formation region,
    one of a source and a drain of the first transistor is electrically directly connected to one of a source and a drain of the second transistor,
    one of a source and a drain of the third transistor is electrically directly connected to one of a source and a drain of the fourth transistor, one of a source and a drain of the fifth transistor is electrically directly connected to one of a source and a drain of the sixth transistor, a gate of the first transistor is electrically directly connected to the one of the source and the drain of the fifth transistor, a gate of the second transistor is electrically directly connected to the one of the source and the drain of the third transistor, a gate of the fourth transistor is electrically directly connected to the gate of the first transistor, the other of the source and the drain of the second transistor is electrically directly connected to a wiring, the other of the source and the drain of the fourth transistor is electrically directly connected to the wiring, the other of the source and the drain of the fifth transistor is electrically directly connected to the wiring, the MEMS device is electrically directly connected to the one of the source and the drain of the first transistor and a W/L ratio of the first transistor is higher than that of the second transistor.

12. The semiconductor device according to claim 11, wherein a W/L ratio of the fourth transistor is higher than that of the third transistor.

13. A display module comprising:
a display panel comprising the semiconductor device according to claim 11; and
an FPC.

14. An electronic device comprising:
the display module according to claim 13; and
at least one of an antenna, an operation button, and a speaker.

15. A semiconductor device comprising:
first to fifth transistors and a MEMS device,
wherein:
the first to fifth transistors each comprise a semiconductor layer including a channel formation region, one of a source and a drain of the first transistor is electrically directly connected to one of a source and a drain of the second transistor, one of a source and a drain of the third transistor is electrically directly connected to one of a source and a drain of the fourth transistor, a gate of the first transistor is electrically directly connected to one of a source and a drain of the fifth transistor, a gate of the second transistor is electrically directly connected to the one of the source and the drain of the third transistor, a gate of the fourth transistor is electrically directly connected to the gate of the first transistor, one of the source and the drain of the second transistor is electrically directly connected to a wiring, the other of the source and the drain of the fourth transistor is electrically directly connected to the wiring, the MEMS device is electrically directly connected to the one of the source and the drain of the first transistor, and a W/L ratio of the first transistor is higher than that of the second transistor.

16. The semiconductor device according to claim 15, wherein a W/L ratio of the fourth transistor is higher than that of the third transistor.

17. A display module comprising:
a display panel comprising the semiconductor device according to claim 15; and
an FPC.

18. An electronic device comprising:
the display module according to claim 17; and
at least one of an antenna, an operation button, and a speaker.

19. The semiconductor device according to claim 11, wherein the semiconductor is oxide semiconductor.

20. The semiconductor device according to claim 15, wherein the semiconductor is oxide semiconductor.

* * * * *